US006654595B1

(12) United States Patent
Dexter

(10) Patent No.: US 6,654,595 B1
(45) Date of Patent: Nov. 25, 2003

(54) RADIO SYSTEM INCLUDING MIXER DEVICE AND SWITCHING CIRCUIT AND METHOD HAVING SWITCHING SIGNAL FEEDBACK CONTROL FOR ENHANCED DYNAMIC RANGE AND PERFORMANCE

(75) Inventor: Charles E. Dexter, Highland, MD (US)

(73) Assignee: Signia-IDT, Inc.

( * ) Notice: Subject to any disclaimer, the term of this patent is extended or adjusted under 35 U.S.C. 154(b) by 537 days.

(21) Appl. No.: 09/644,181

(22) Filed: Aug. 22, 2000

Related U.S. Application Data

(63) Continuation-in-part of application No. 09/016,629, filed on Feb. 1, 1998, now Pat. No. 6,108,529.

(51) Int. Cl.[7] .................................................. H04B 1/26
(52) U.S. Cl. ........................ 455/323; 455/324; 455/326; 455/338; 327/113; 327/116; 327/119
(58) Field of Search ................................. 455/323, 324, 455/326, 338, 319, 333, 313, 330; 327/113, 116, 119, 114, 120

(56) References Cited

U.S. PATENT DOCUMENTS

| 3,577,206 | A | 5/1971 | Ferrell |
| 3,626,076 | A | 12/1971 | Uchiyama |
| 3,700,928 | A | 10/1972 | Milberger et al. |
| 3,700,929 | A | 10/1972 | Milberger et al. |
| 4,352,210 | A | 9/1982 | Puckette |
| 4,500,847 | A | 2/1985 | Hallford |

(List continued on next page.)

FOREIGN PATENT DOCUMENTS

| EP | 0549296 | 6/1993 |
| EP | 0789449 | 8/1997 |
| WO | 97/23035 | 6/1997 |

OTHER PUBLICATIONS

LaFerrara, H., et al. ("GaAs MMIC Passive Mixers for Wireless Applications", *M/A–COM, IC Business Unit, Lowell, Massachusetts*. 4 pp., undated.

(List continued on next page.)

*Primary Examiner*—Pablo N Tran
(74) *Attorney, Agent, or Firm*—R. Michael Ananian; Dorsey & Whitney LLP

(57) ABSTRACT

Radio system including mixer device and switching circuit and method having switching signal feedback control for enhanced dynamic range and performance. Radio apparatus including: local oscillator input port for receiving periodic sinusoidal local oscillator signal; drive circuit for generating a substantially square-wave two-voltage level switching signal including: phase splitter circuit, voltage potential isolation circuit, and square wave signal generation circuit; FET mixing device; input/output signal separation circuit; analog-to-digital converter; and feedback control circuit. Radio tuner apparatus including low-band signal processing circuit; high-band signal processing circuit including first mixer circuit operating as an up-frequency converter, amplifier circuit, second mixer circuit operating as a down-frequency converter, and feedback control circuit for adjusting a duty cycle of a mixer switching device; signal combining circuit and output processing circuit. Method for operating radio system, apparatus, and tuner. Method of operating switching circuit.

18 Claims, 43 Drawing Sheets

SUPER-MIXER CIRCUIT (EXEMPLARY)

U.S. PATENT DOCUMENTS

| | | | |
|---|---|---|---|
| 4,502,028 A | | 2/1985 | Leake |
| 4,590,616 A | | 5/1986 | van Glabbeek |
| 4,675,911 A | | 6/1987 | Sokolov et al. |
| 4,979,233 A | | 12/1990 | Kawahata |
| 5,027,163 A | | 6/1991 | Dobrovolny |
| 5,060,298 A | | 10/1991 | Waugh et al. |
| 5,130,768 A | | 7/1992 | Wu et al. |
| 5,140,705 A | | 8/1992 | Kosuga |
| 5,153,469 A | | 10/1992 | Petted et al. |
| 5,280,648 A | | 1/1994 | Dobrovolny |
| 5,303,417 A | | 4/1994 | Laws |
| 5,361,409 A | | 11/1994 | Vice |
| 5,438,693 A | | 8/1995 | Cox |
| 5,481,227 A | * | 1/1996 | Komori et al. ................. 331/2 |
| 5,493,720 A | | 2/1996 | Peterson |
| 5,513,390 A | | 4/1996 | Vice |
| 5,551,074 A | | 8/1996 | Vice |
| 5,602,501 A | | 2/1997 | Shiga |
| 5,678,226 A | * | 10/1997 | Li et al. ...................... 455/333 |
| 5,697,092 A | * | 12/1997 | Mourant et al. ............ 455/323 |
| 5,697,095 A | * | 12/1997 | Matsuura .................... 455/338 |
| 5,799,248 A | | 8/1998 | Vice |
| 5,926,750 A | | 7/1999 | Ishii |
| 6,263,199 B1 | * | 7/2001 | Wortel et al. ................ 455/333 |
| 6,351,632 B1 | * | 2/2002 | Yan et al. .................... 455/333 |
| 6,356,736 B2 | * | 3/2002 | Tomasz et al. ............. 455/3.02 |

OTHER PUBLICATIONS

Oxner, "High Dynamic Range Ming with Si8901", Electronic Engineering (May 1986), vol. 58, No. 713, pp. 53–56.

Weiner et al., "2 to 8 GHZ Double Balanced Mesfet Mixer with +30 DBM Input 3RD Order Intercept", IEEE MTT International Microwave Symposium Digest, New York (May 1988), vol. 2, No. 1988, pp. 1097–1100.

Tokumitsu et al., "Divider and Combiner Line–United FET's as Basic Circuit Function Modules–Part II", IEEE Transactions on Microwave Theory and Techniques (Sep. 1990), vol. 38, No. 9, pp. 1218–1226.

Neuf et al., "Double Balanced, Coplanaer, Image Rejection Mixer Uses Molonithic Mesfet Quad", MTT–S International Microwave Symposium Digest, Boston (Jun. 1991), vol. 2, No. 1991, pp. 843–846.

* cited by examiner

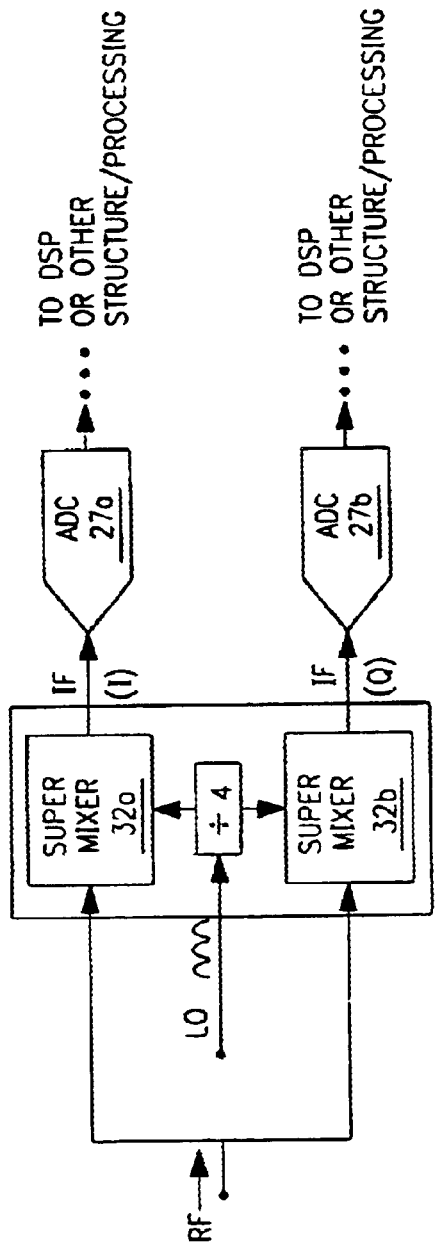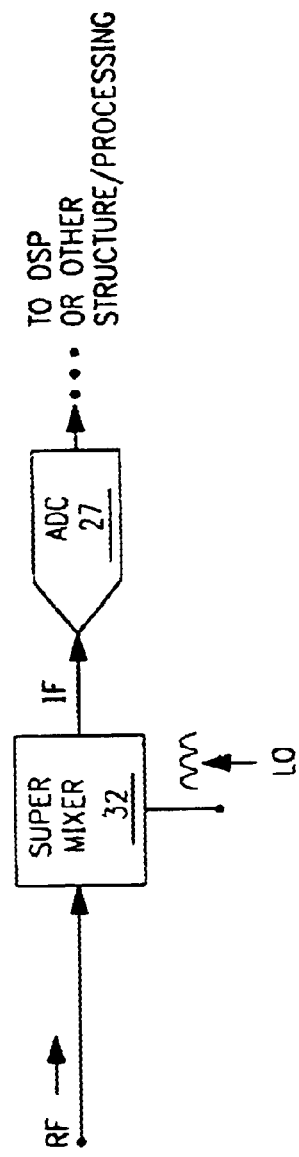

FIG. 4B

EFFECT OF RESOLUTION BANDWIDTH ON DYNAMIC RANGE

EFFECT OF RESOLUTION BANDWIDTH ON DYNAMIC RANGE

Tuner/ADC Noise Figure Calculation
NOISE FLOOR (-DBM) = 6.02N + 10 LOG Fs/2
FOR 14 BIT ADC AND Fs/2 OF 30 MHz;
NOISE FLOOR = - 159 DBM
NOISE FIGURE (DB)= -174-SIG FULL SCALE - NOISE FLOOR
ADC NOISE FIGURE = 25 DB
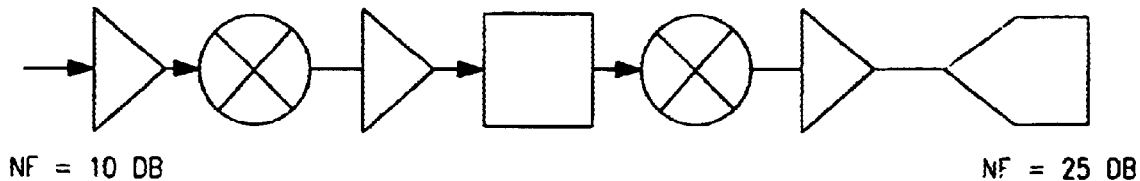
NF = 10 DB            NF = 25 DB
APPROXIMATE EQUIVELENT CIRCUIT
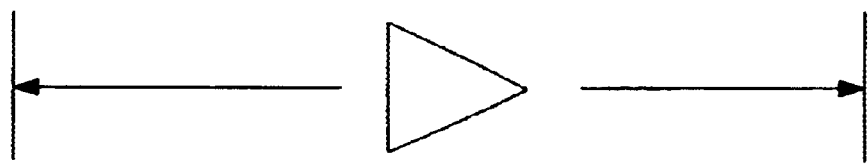
NF = 2.5 DB, GAIN = 16 DB, OIP3 = + 50 DBM, IIP3 = (50 - 16) = 34 DBM
FIG. 16

Exemplary Embodiment Supermixer Component Specifications

| | IIP3 | IIP2 | GAIN | NF | RF | IF | LO |
|---|---|---|---|---|---|---|---|
| DOWN CONVERTER | 50 DBM | 100 DBM | -6 DB | 8 DB | 70 +/- 2MHZ | 0.1 TO 4MHZ | 68MHZ |
| UP CONVERTER | 45 DBM | 85 DBM | -6.5 DB | 8.5 DB | 2 TO 30MHZ | 70 +/- 2MHZ | 72 TO 102 MHZ |
| POST AMPLIFIER | 43 DBM | N/A | 6 DB | 1.6 DB | N/A | 70 +/- 2MHZ | N/A |

FIG. 20

EMBODIMENT OF HF COLLECTION IN ONE BAND WITH TWO TUNERS

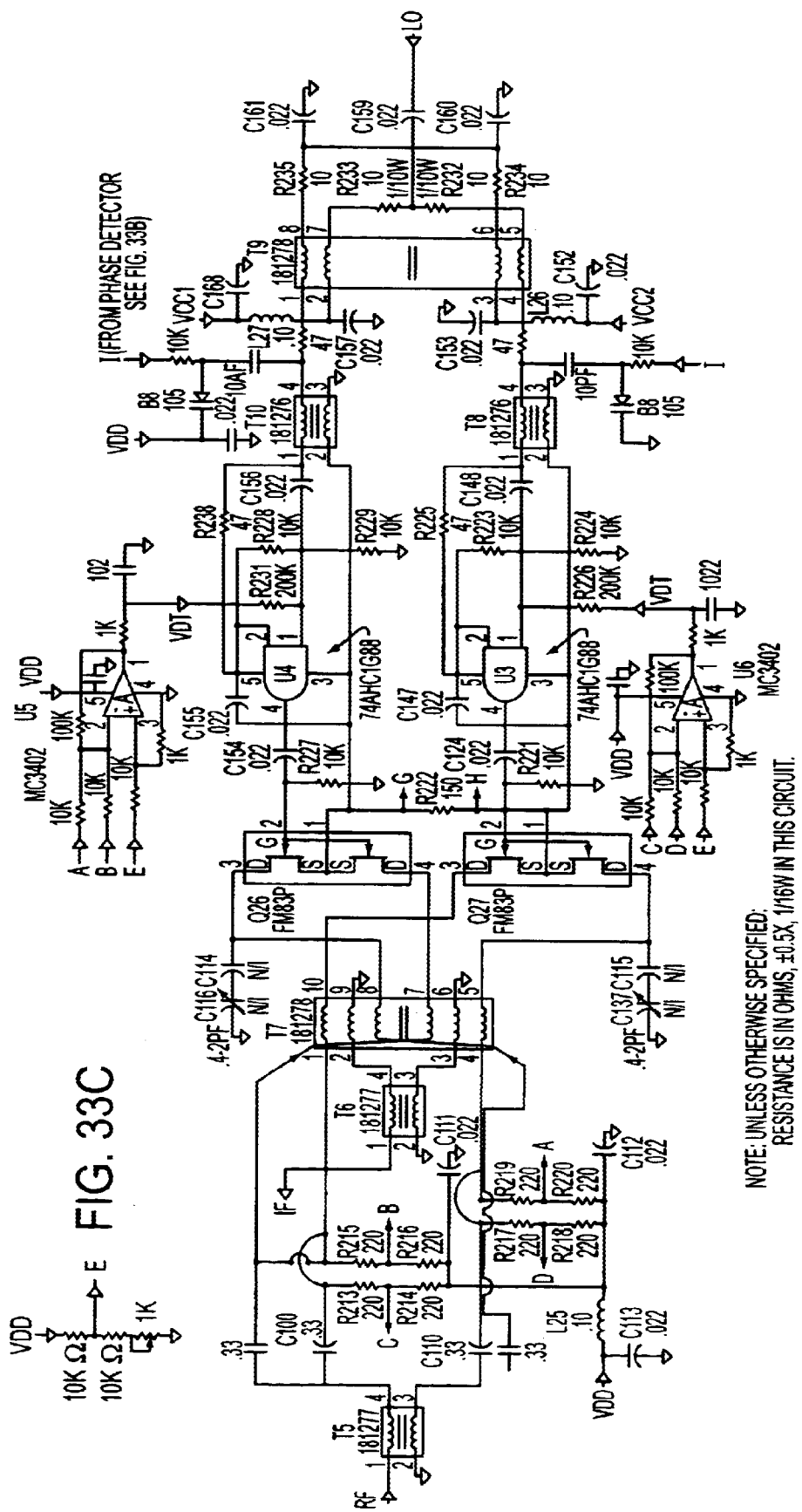

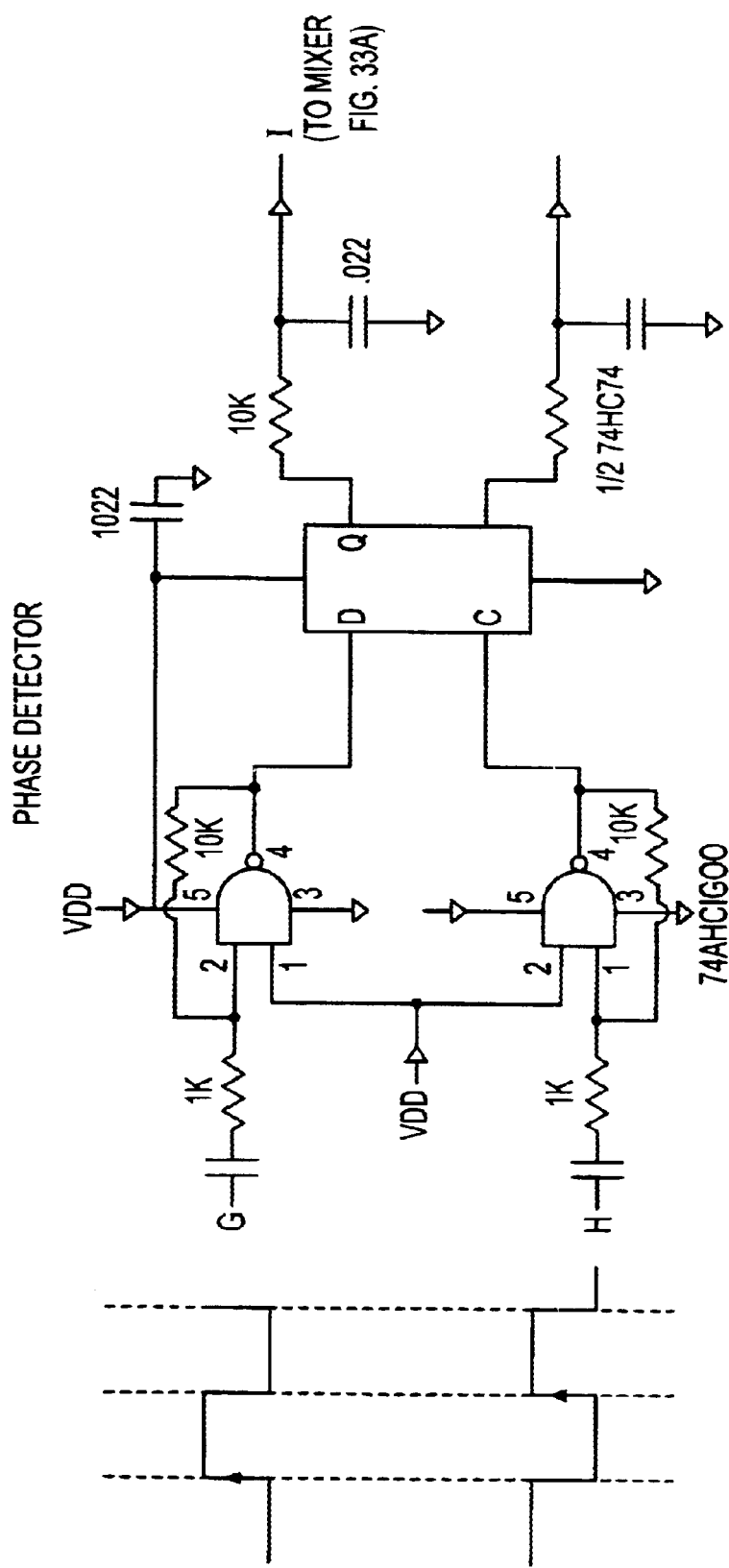

RADIO SYSTEM INCLUDING MIXER DEVICE AND SWITCHING CIRCUIT AND METHOD HAVING SWITCHING SIGNAL FEEDBACK CONTROL FOR ENHANCED DYNAMIC RANGE AND PERFORMANCE

CROSS REFERENCES TO RELATED APPLICATIONS

This Application is a Continuation-In-Part of U.S. patent application Ser. No. 09/016,629, filed Feb. 1, 1998 now U.S. Pat. No. 6,108,529 entitled Radio System Including FET Mixer Device and Square-Wave Drive Switching Circuit and Method Therefore. The subject invention is useful in connection with the mixer described in U.S. patent application, Ser. No. 09/017,455 filed Feb. 1, 1998 entitled Structure and Method for Super FET Mixer Having Logic-Gate Generated FET Square-Wave Switching Signal by C. Dexter and M. Vice, assigned to the assignee of the present application and incorporated herein by reference. Of course, the invention and the concepts underlying the invention are also useful in many other mixer, radio, tuner, and electronic device designs, and this invention is not to be limited to use with the specific mixer design shown in the incorporated application or the drawings to be described below.

INTRODUCTION

1. Field of the Invention

The invention relates generally to frequency conversion systems, devices, and methods, and more specifically to radio frequency communication devices and systems including, mixers, radio tuners, transmitter, and receivers incorporating FET mixer type frequency conversion devices for up- and down-frequency conversion.

2. Background of the Invention

Conventional heterodyne receivers down convert a radio-frequency (RF) signal to a baseband signal using one or more intermediate stages in which the RF signal is converted to one or more intermediate-frequency signals, lower than the RF signal, until the base-band frequency is reached. A heterodyne transmitter generates a higher frequency RF signal from a baseband signal using one or more intermediate stages to up-convert the frequency. A transmitter provides both transmit and receive components and function.

In simplified terms, a homodyne receiver directly down-converts radio-frequency (RF) signals to baseband frequency without intermediate stages. Analogously a homodyne transmitter up-converts from base-band to RF without intermediate stages. A radio system (frequency conversion stage, tuner, receiver, transmitter, or transceiver) may include homodyne and heterodyne components. In this disclosure the term system may be used when referring to any or a combination of such stage, tuner, receiver, transmitter, or transceiver, so as to simplify the description.

Conventional homodyne systems may typically have a poor dynamic range, unacceptably high distortions for some applications, and other undesirable characteristics as compared to non-homodyne systems. The poor dynamic range is typically the result of at least two significant factors. First, distortions, including input second order intercept point (IP2), input third order intercept point (IP3), and so-called "NxN" distortions, cause unwanted spurious responses to fall within the frequency band of interest. Second, amplitude and/or phase imbalances contributed by an imperfect quadrature local oscillator, may cause errors in the in-phase channel (I) or quadrature-phase channel (Q) signals before they are digitized by the analog-to-digital converter (ADC) in the digitizer, resulting in non-linearities in the conversion process. (These quadrature or I/Q channels are sometime referred to as sine and cosine channels or signals as a result of the out-of-phase relationship between the channels and the manner in which they are conventionally generated.) These non-linearities directly or indirectly result in distortion and loss of useful dynamic range.

These conventional homodyne systems may beneficially employ software algorithms, residing in the Digital Signal Processing (DSP) section of the tuner, transmitter and/or receiver down the signal path from the homodyne frequency conversion stage, to compensate for some of the distortions, errors, and other anomalies in the such conventional homodyne systems (especially receivers) with minimal success, but this additional DSP task undesirably requires a higher clock rate than would otherwise be required for a given bandwidth. Wider signal bandwidth may typically need a processor clock rate that is from about 10 times to about 20 times or more the clock rate required without compensation, in order to compensate phase and amplitude errors over the entire receiver bandwidth of interest. The higher clock rate presents additional problems in itself. Digital compensation after digitization reduce the wanted spectrum bandwidth. Without compensation, homodyne receivers or direct conversion receivers employing mixers are limited to around 40 dB of dynamic range and bandwidth in the audio frequency range.

The trend in new radio systems technology receiver/tuner development is predicted to concentrate on moving the RF spectrum down to baseband frequencies where it will be digitized and processed under software control. This will impose even more stringent demands for dynamic range, increased sensitivity, and lower distortion. Reducing size, weight, and power consumption to provide longer operating times under battery power, are also concerns for commercial and non-commercial applications. A key system performance challenge involves keeping the spectrum dynamic range (sensitivity vs. distortion) as high as possible before digitization in the ADC while maintaining high sensitivity and controlling distortion.

An additional problem with conventional wireless (radio) communication systems pertains to frequent requirements for skilled radio operators to initiate and maintain contact between multiple radio stations or transceivers. This problem is particularly acute because of the need to monitor or provide surveillance over a large HF/VHF/UHF frequency spectrum. Both commercial and non-commercial communicators have been working to achieve automatic, reliable and robust communications using the HF/VHF/UHF spectrum, particularly the HF spectrum. One goal of this work has been an attempt to eliminate or reduce the need for highly skilled radio operators while simultaneously increasing the reliability of the HF spectrum as a communication medium.

Automatic Link Establishment (ALE), also known as Adaptive HF, is an integral part of this effort. ALE is defined as the capability of an HF radio station to make contact between itself and another station or stations under automatic processor control. ALE techniques include automatic signaling, selective calling, and automatic handshaking at different bands in the HF spectrum. Monitoring and following all these activities requires a near simultaneous full band HF receiver. Digitizing the entire HF frequency band, and handling ALE protocol with Digital Signal Processing (DSP) presents many challenges. For example, if the monitoring sites are not ideal in location, dynamic range, resulting from near by transmitters masking far away ALE signals, presents a problem. It has been estimated that an adaptive HF monitoring solution requires full simultaneous HF coverage with 100 dB of Spur Free Dynamic Range (SFDR). The cost for implementing and deploying such ALE systems also remains problematic.

This and other performance challenges have been addressed in part by the development of analog-to-digital converters (ADCs) which have increased resolution (sensitivity), increased Spur Free Dynamic Range (SFDR), and greater baseband spectral bandwidth. ADCs having 14-bit resolution and 30 MHz baseband bandwidth, and which can be clocked out at 65 mega samples per second (MSPS), with a projected SFDR of 85–90 dB or more are available and narrower bandwidth ADCs (for example, bandwidths less than about 10 Mhz) and providing 16-bit resolution at an even greater 95–100 dB SFDR are under development. These devices provide the needed ADC performance improvement over earlier 12-bit ADCs. Even though higher-performance ADCs have been developed, other problems remain.

Frequency conversion or mixer stages in conventional RF systems have heretofore been unable to attain the approximately 85–100 dB Spur-Free Dynamic Range required in certain tuner/receiver systems, particularly where the output of that mixer stage was intended as the input to high performance Analog-to-Digital Converters (ADCs) where the 100 dB SPRD, is required at the input. In fact such systems have been limited to substantially lower performance. The last or final mixer stage just prior to output to the ADC (baseband frequency converter stage) typically has the highest signal amplitude level in the tuner. A state-of-the-art ADC requires about a 2 volt peak-to-peak signal for full ADC conversion scale, and should have all spurious signal products down by about 100 dB in order to utilize the capabilities of the ADC without introducing other undesirable artifacts. These ADC performance specifications correspond to a baseband spectrum mixer stage coupled to the ADC input terminals having an input third order intercept point (IP3) of about +50 dBm and an input second order intercept point (IP2) of about +100 dBm.

Another problem in conventional tuners is that they typically perform the final stage mixing to baseband at a low Intermediate Frequency (IF) signal amplitude level, and then boost the amplitude of the final stage mixer output with a separate power amplifier to achieve the desired ADC signal level (typically in the range of from about 1 Volt to about 4 Volts peak-to-peak). This baseband conversion approach only achieves approximately +43 dBm IP3 and +82 dBm IP2 into the ADC, may have unacceptable levels of distortion, and typically may not provide performance levels that keep with evolving state-of-the-art ADC dynamic range capability, or that meet the needs the end user.

In addition to the above described final mixer stage problems in conventional tuners, the first conversion stage of a tuner also significantly affects overall dynamic range, in fact so much so that degradation in the first stage may make it impossible to meet overall system performance requirements. For example, if the first mixing operation is too lossy, there may be an added requirement for a preamplifier gain stage in the signal path to boost the signal amplitude in an attempt to achieve the required sensitivity. However, such a preamplifier gain stage in the signal path upstream from the mixer circuit undesirably increases the required IP3 and IP2 of the mixer by an amount equal to the added preamplifier gain. Therefore, any system requirement for a preamplifier gain stage to increase sensitivity imposes even more severe constraints on other radio system components. Desirably, a mixer would have very low conversion loss in the first stage to avoid the need for any preamplification, and also have a high or large dynamic range.

One mixer known to the inventors is marketed by Steinbrecher under the name "PARAMIXER" and is purported in advertising materials to provide a mixer having an input third order intercept point (IP3) on the order of about +50 dBm and an input second order intercept point (IP2) on the order of about +100 dBm, but the inventors have not verified or confirmed such performance claims. In spite of its purported IP3 and IP2 performance figures, even this Paramixer has disadvantages. For example, such conventional mixers are relatively large (on the order of about 100 cubic inches), power inefficient (about 8 watts input power is needed to process 100 milliwatts—an efficiency of only about two percent (2%)), and expensive (for example, costing up to several hundred dollars per mixer).

Therefore, although some progress has been made in improving mixer performance to achieve high quality radio systems, such developments have not solved the need for compact, small form factor, light weight devices, having lower power consumption, long battery life in battery powered devices, at moderate to low cost.

Therefore, there remains a need for high-performance radio systems including tuner, receiver, and/or transmitter components that are low-cost, compact, and energy conservative, particularly for mobile or hand-held applications. There also remains a need for mixing devices for frequency conversion generally, and more particularly for use in these high-performance radio systems, surveillance systems, and instrumentation systems.

SUMMARY OF THE INVENTION

In one aspect, the invention includes a wireless communication structure, device, and system and method for operating the same, a mixing structure for use with the wireless communication device or for use otherwise and a method of mixing signals, as well as an inventive differential square wave mixer switching circuit and method for controlling the mixer device which may be used with the inventive mixing device and wireless communication device.

The inventive mixer structure and method (also referred to as a "super-mixer" because of its superior (e.g. super) properties as compared to conventional mixers) include an overall mixer architecture topology and several embodiments of the mixer structure which present variations particularly suitable for use in a radio receivers, transmitters, tuners, as well as instrumentation systems, and other systems and devices performing frequency conversion. The inventive mixer is applicable to homodyne and heterodyne receiver/transmitter/tuner implementations, instrumentation and telemetry systems. The invention also provides structural and methodological components of the mixer including a precise mixer device within its LO phase splitter, and differential square wave gate drive. Wireless communication devices includes radios, cellular telephones, and telemetry systems whether land, sea, airborne, or space based, and whether fixed or mobile.

The inventive mixer device is advantageously a GaAs FET mixer where the FETs are implemented on a common substrate. The inventive mixer has superior intermodulation and harmonic distortion suppression and features excellent conversion loss, noise figure, port match, and port isolation as a result of its topology. The mixer device circuit combines the advantages of series mixing FETs, a triple balanced design using a balanced passive reflection transformer, a very precise LO phase splitter, and square wave gate drive to achieve its high levels of performance. It is power conservative and offers the advantage of long battery life in portable devices such as portable radios and cellular telephones as it requires only a modest amount of DC and LO drive power, and is useful for operation over at least a multi-decade bandwidth.

Therefore, one object of the invention is to provide a high-performance mixing device that achieves a high IP2 and IP3.

Another object of the invention is to provide a mixer device which is energy conservative, power efficient, and which therefore provides size, weight, and operational life for mobile and/or portable hand-held implementations.

A further object of the invention is to provide a mixer having a large dynamic range and very low distortion.

Another object of the invention is to provide a differential square wave drive circuit for use with a mixer.

Yet another object of the invention is to provide a mixer generating, at most, very low spurious signal withing the frequency band of interest.

Still another object of the invention is to provide a mixer generating an analog output signal that does not exceed the input specifications for 14-bit and higher bit analog-to-digital converters.

Another object of the invention is to provide a mixer that minimizes amplitude and phase imbalances, such as imbalances contributed by an imperfect quadrature modulator local oscillator frequency signal.

Still another object of the invention is to provide a mixer that meets or exceeds the input requirements of high-bit (e.g. 12-bit, 14-bit, 16-bit) analog-to-digital converters (ADCs) so as to provide a radio in which the mixer is employed where the RF spectrum may be moved down to baseband frequencies, while maintaining high sensitivity and low distortion, where the spectrum may be digitized by the ADCs and processed under software control.

An additional object of the invention is to provide a high-performance direct conversion system.

Another object of the invention is to provide a radio, tuner, receiver, and/or transmitter, or components thereof in which about 100 dB or greater of Spur Free Dynamic Range is provided over a sufficiently large spectral bandwidth meeting the needs of an Automatic Link Establishment (ALE) or adaptive HF, VHF, and/or UHF system.

A final object of the invention is to provide a method for mixing signals to provide a high performance mixer achieving high SPDR, large bandwidth, low distortion, and low power consumption in a wireless communication system.

Additional objects and features of the invention will be more readily apparent from the following detailed description and appended claims when taken in conjunction with the drawings.

BRIEF DESCRIPTION OF THE DRAWINGS

For a better understanding of the nature and objects of the invention, reference should be made to the following detailed description taken in conjunction with the accompanying drawings, in which:

FIG. 16 is an illustration showing ADC noise figure calculation, gain, and IP2 and IP3 of a tuner.

FIG. 20 is an illustration showing exemplary super mixer performance.

FIG. 33 is an illustration showing an embodiment of a particular embodiment of the inventive super mixer incorporating the duty-cycle and symmetry feedback control circuits including particular details of an embodiment of phase control and phase detector circuits as well as detail of the duty-cycle control circuits.

DESCRIPTION OF SPECIFIC EMBODIMENTS

Figure 1C:
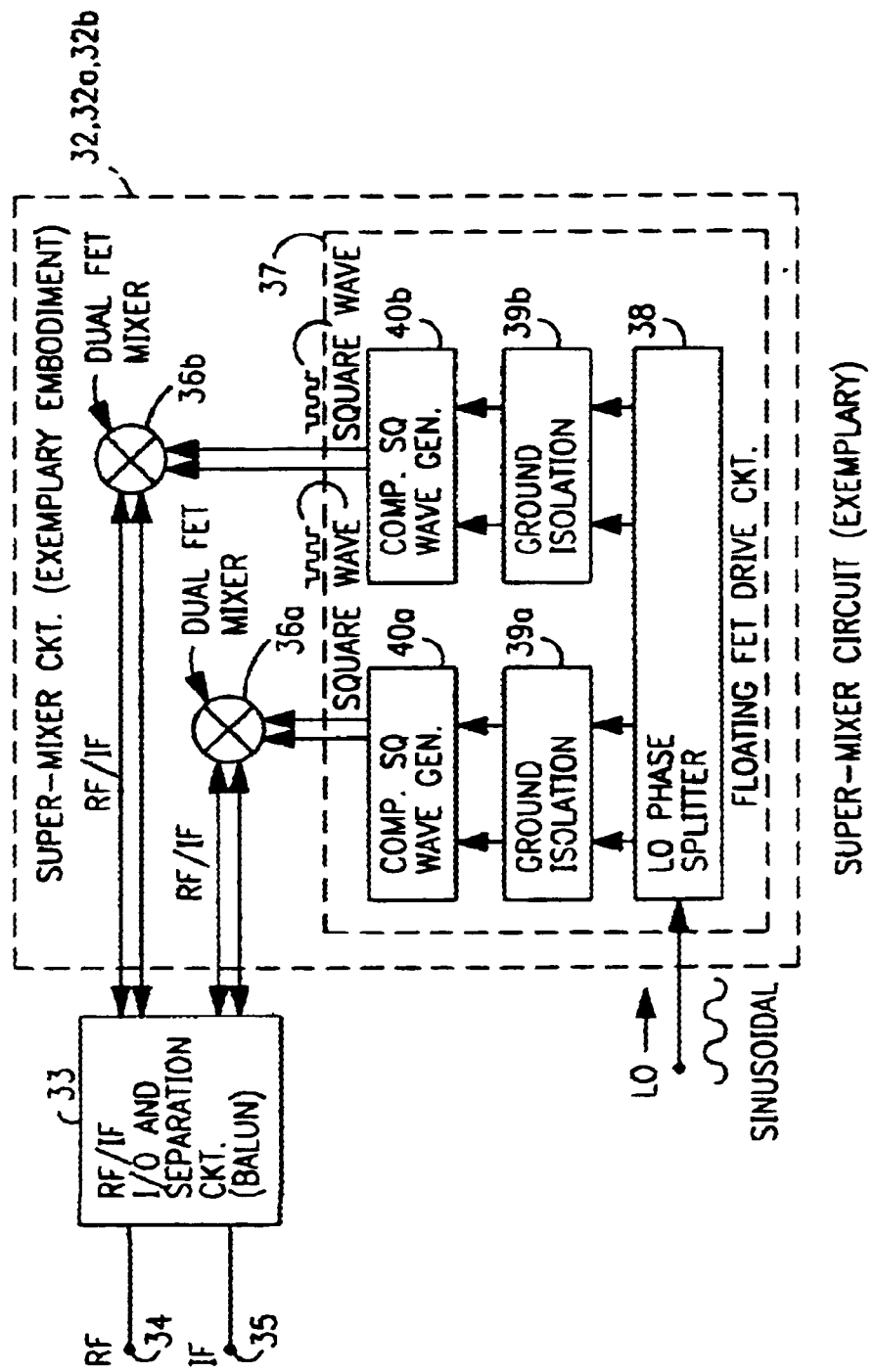
FIG. 1 is and illustration showing simplified embodiments of the invention including an inventive homodyne topology (FIG. 1a), an inventive heterodyne topology (FIG. 1b) and an inventive mixer device topology (FIG. 1c) that is used in the homodyne and heterodyne topologies.

Reference will now be made in detail to the present embodiments of the invention, which are illustrated in the accompanying figures. We now turn to the drawings, wherein like components are designated by like reference numbers throughout the various figures.

With reference to FIG. 1 there is shown an overview of several aspects and embodiments of the inventive structure and corresponding inventive method. With specific reference to FIG. 1a, an exemplary down-frequency conversion embodiment of a homodyne structure, such as may be used in a radio system is shown in which each of two of the inventive mixer devices 32a, 32b (also referred to as "super-mixer" devices) receive an RF signal, and super-mixer control (switching) signals at a control (switching) port, which control signals are derived from a conventional externally applied sinusoidal LO signal but which have special properties described in greater detail hereinafter. The in-phase (I) channel and quadrature-phase (Q) channel signals output by each super-mixer 32a, 32b are coupled directly to separate ADC 27a, 27b, without the need for any intervening amplifier. The ADCs (advantageously having at least 14-bit resolution) digitize each of the I and Q channels so that subsequent conventional down stream processing may be accomplished. Structure and operation of the optional Digital Signal Processor (DSP) and/or other structures or processing procedures are known in the art and not described further here.

With specific reference to FIG. 1b, an exemplary down-frequency conversion embodiment of a heterodyne structure, such as also may be used in a radio system is shown in which one of the inventive mixer devices 32 ("super-mixer" device 32) receives an RF signal, and a super-mixer control (switching) signal at a control (switching) port, which control signal is derived from a conventional externally applied sinusoidal LO signal but which has special properties as alluded to relative to FIG. 1a. The IF output signal from the super-mixer 32 is coupled directly to an ADC 27, without the need for any intervening post-mixing device amplifier. The ADC digitizes the IF output signal so that subsequent conventional down stream processing may be accomplished as described herein before. As may readily be appreciated, the circuit topologies shown and described relative to FIG. 1a and FIG. 1b, are different, yet each includes at least one of the inventive super-mixers among the elements.

A simplified diagrammatic functional block diagram of an embodiment of a super-mixer 32 is now described relative to FIG. 1c which shows some of the significant features of the inventive super-mixer 32, 32a, 32b. In the embodiment shown, the super-mixer 32 is configured with and coupled to an RF/IF separation/filter circuit 33 (such as a balun) to operate as a passive reflection FET mixer wherein (when operating as a down-converter) RF energy is input to the RF/IF separation circuit at an RF port 34, and the IF output signal generated at the dual FET mixing devices 36a, 36b in a manner described hereinafter, is separated from the RF signal by the separation circuit at IF port 35. For an up-converter the roles of the RF and IF are reversed. However, the invention is not limited to passive reflection configurations.

Many different circuit topologies are known in the art for inputting a first signal at a first frequency into a generic mixing device, performing the physical mixing operation, and extracting the up- or -down converted signal a second frequency from the mixing device at an output port, so that the invention is not to be construed as being limited to the particular exemplary mixer circuit or operation environment described here. By way or example, but not limitation, the use of a transmission line transformer in a mixer has been described in U.S. Pat. No. 5,361,409 titled FET Mixer Having Transmission Line Transformer; the use of a balanced reflection transformer in a mixer has been described in U.S. Pat. No. 5,551,074 titled Balanced Reflection Transformer; the use of a dc-biased reflection transformer for a mixer and a dc-biased FET mixer have been described in U.S. Pat. No. 5,513,390 titled Biased FET Mixer. Structures for an unbalanced FET mixer have been described in U.S. Pat. No. 5,678,226 titled Unbalanced FET Mixer. Structures for a Totem Pole Mixer Having Grounded Serially Connected Stacked FET Pair have been described in U.S. patent application Ser. No. 08/926,175 filed Sep. 9, 1997. Each of these patents and patent applications are herein incorporated by reference in their entirety.

Continuing the description of the inventive super-mixer 32 in FIG. 1c, there is also included a FET drive circuit 37 which is advantageously implemented as a "floating" or differential drive circuit. An externally generated (nominally) sinusoidal LO signal is input to a phase splitter circuit 38, which generates a phase complementary (180 degree phase difference) between two sets of differential nominally sinusoidal signals at the LO frequency. We describe the LO signal as nominally sinusoidal, because some variation from true sinusoid may be tolerated as the sinusoid is used to generate or regenerate a very high slew rate signal such as a square wave or substantially square wave which actually controls the FET gates to cause the desired FET switching. Therefore, any input signal to the complementary square wave generation circuits 40a, 40b that provides a suitable high slew rate signal to the mixing devices 36a, 36b may be used as the LO input.

The sinusoidal LO signal is split into two complementary phases and then coupled to ground isolation circuits 39a, 39b associated with each of the complementary signals paths. These ground isolated or floating phase complementary signal pairs are then coupled to a pair of square wave generation circuits 40a, 40b, the outputs of which are signals having high slew-rate leading and trailing edges, such as square waves. In one embodiment the square wave generation circuits comprise digital logic gates, such as "AND" gates, which provide a nearly perfect square wave output with two levels, very high slew-rate leading and trailing edges, and extremely low cost per device.

In one aspect, the inventive receiver incorporates a mixer device advantageously implemented triple-balanced passive reflection FET mixing devices as in GaAs on a single monolithic substrate, and a FET switch drive circuit (LO drive circuit) that provides near ideal switching. An embodiment of the overall homodyne receiver described first, followed by descriptions of embodiments of component structure and method including descriptions of particular FET mixing devices and drive circuits.

Exemplary Mixer Device Circuit Characteristics

We now describe the structure and method of an exemplary triple-balanced passive reflection FET mixer that may be used with the inventive homodyne receiver system 31. The triple-balanced passive reflection FET mixer 32 has a square wave (or near square wave) switching waveform derived or regenerated from a sinusoidal local oscillator waveform, and operates in the LO/RF/IF frequency range of from about 1 Mhz to about 200 Mhz with reduced levels of nonlinearity and intermodulation distortion compared to conventional mixers as the result of the topological structure, the application of a DC bias to the FET channels, and other factors. Other embodiments of the mixer are described which extend the range of operation from 200 Mhz to tens of Ghz. The mixer 32 is useful for both up- and down-frequency conversion of RF and IF signal frequencies, through characterization as RF and IF for the primary radio receiver application are arbitrary, and various alternative embodiments have features that are advantageously implemented to optimize up-frequency conversion and down-frequency conversion respectively.

More specifically, when operating as an up frequency converter, the LO drive signal is operable within the range of from about 1 Mhz to about 200 Mhz; the RF signal is operable within the range of from about 1 Mhz to about 200 Mhz; and the IF signal is similarly operable within the range of from about 1 Mhz to about 200 Mhz. The RF, IF, and LO signal frequencies may therefore overlap so that there is no frequency exclusion.

It is therefore a feature of the present invention to produce a radio frequency mixer that has a wide dynamic range of operation and low overall signal distortion including low intermodulation distortion and partial cancellation of non-linearity distortion imposed on the radio frequency signal.

The inventive mixer 32 structure and method addresses this need for an ultra high dynamic range mixer by providing superior second and third order intercept point and compression point performance without the degradation of other mixer performance parameters, such as the conversion loss, noise figure, port isolation, and power consumption. Furthermore, the conventional need for relatively high Local Oscillator (LO) drive levels, that is LO drive levels above about one (1) Watt at the external LO input, when specifying input third order intercept points (IIP3) in the +45 dBm range, is eliminated by the LO waveform regeneration circuit of the inventive mixer. In the inventive mixer 32 LO drive, measured at the external LO input port, the inventive structure needs only about 100 milliwatts for comparable or even superior performance. Dynamic range refers to noise characteristics and conversion linearity, and the way the two characteristics combine to produce dynamic range and the useful power level over which one can operate the mixer.

Conventional approaches to mixer implementation, and radio receivers that incorporate mixing devices, use sinusoidal LO drive waveforms to drive the switching elements to ON and OFF conduction states. FET switching elements are typically used, but other types of transistors may be employed such as bipolar transistors or diodes, including for example Schottkey diodes. However, in the inventive mixer 32 structure and method, the LO drive signal applied to switch the FETs is non-sinusoidal square wave or pseudo-square wave. These square waves are generated by a novel Local Oscillator drive circuit, such as a drive circuit employing two floating CMOS "AND" gates, to generate a pair of complementary square waves from a sinusoidal LO drive input. When the complementary square wave signals are applied to the gate terminals of the mixing FETs, superior intermodulation distortion suppression and dynamic range are obtained, as compared to conventional designs employing sinusoidal or nearly sinusoidal signals. A significant component of distortion is reduced as a result of the reduced duration switching device transition duration. The switching devices spend more time in the "ON" and "OFF" states and less time in the transition phase between "ON" and "OFF" where distortion generation is maximal.

The switching devices (e.g. FETs) exhibit relatively linear characteristics in the ON or OFF states, but less linear characteristics in the transition between ON and OFF states. The inventive square wave switch drive speeds the devices through transition, reducing the time period during which distortion is generated.

Although this description focuses on the difference between a conventional LO sinusoid applied on a switching signal, and ideal or near-ideal square wave, in practical terms any periodic waveform having monotonic rise and fall segment and having suitable amplitude to trigger the square wave regeneration circuit may be used to drive the square wave regeneration circuit, and the regenerated complementary square waves driving the switches need not be perfect square waves, what is important is that they have steep slopes in rise and fall (high slew rate) so that the transition period between ON and OFF is short. Logic gates readily provide the required input/output device characteristics.

Typically the third order intercept point of each mixer device 32 is improved by up to approximately 15 dB or better (for example, from about 40 dBm to about 55 dBm), more typically by at least from 5 dB to about 10 dB (for example, from approximately 40 dBm to about 50 dBm), and dynamic range is improved equivalently. Noise figure is also improved by the inventive mixer device structure and method, resulting in greater dynamic range for each mixer device 32, for example in one embodiment dynamic range is improved by from about 10 dB to 15 dB. Intermodulation distortion is suppressed commensurate with the third order intercept improvement described above. The required sinusoidal wave LO drive measured at the LO input port terminals is also reduced by about 10 dB. Furthermore, conversion loss, noise figure, port match, and isolation between the L-port (LO-port) and the R-port (RF-port) and I-port (IF-port) are also favorably effected by square wave drive. Noise figure is improved because the longer switch transition phase of conventional mixer configurations generates more noise than does the inventive mixer 32, and reducing the time spent in the transition phase reduces noise.

The improvements in each of these areas for the inventive mixer 32 may typically be about 1 dB (conversion loss), from 1 dB to about 3 dB (noise figure), from about 1 dB to about 5 dB (port match), and from about 1 dB to about 10 dB (L-port to I- and R-port isolation), often the larger figure will be achieved, and even greater figures may be achieved, however, these are only a typical range over which improvements may be expected. Because of the very large voltage gain of CMOS gates in the transition region (typically a voltage gain on the order of about $1 \times 10^5$), the LO drive requirement for the inventive mixer apparatus and method is comparable to the most ordinary mixers, that is about 13 dBm.

A comparison between several performance figures for a conventional mixer, the inventive super mixer 32, and a direct conversion system is provided immediately below in Table I. These performance figures are merely illustrative of the nature of performance differences to be expected and are not intended to characterize any particular circuit.

TABLE I

Comparison of Performance Figures

| | Conventional Mixer | Inventive Super-Mixer | Direct Conversion System |
|---|---|---|---|
| Insertion Loss | −7 dB | 6 dB | 8.5 dB |
| Noise Figure | 8 dB | 7.5 dB | 9.5 dB |
| IIP3 | +35 dBm | +50 dBm | +45 dBm |
| IIP2 | +65 DBm | +100 dBm | +95 dBm |
| LO Drive Level | +23 dBm | +13 dBm | +16 dBm |
| MXM | >70 dB | >95 dB | >95 dB |
| Amplitude & Phase Balance | | | <0.2 dB & <0.1 degree |

These features and advantages of the square wave drive circuit and method as well as other features and advantages of the present invention will no doubt become clear to those of ordinary skill in the art after having read the following detailed description of preferred embodiments of the inventive mixer device 32 which are illustrated in the following figures.

Although the sinusoidal-to-square wave generation or conversion circuit may be used in other than radio receivers, and for other than mixer applications, the regeneration circuit design is described in greater detail relative to embodiments of an up-frequency and down-frequency convention below.

The inventive mixer may be advantageously configured as an up-frequency converter or as a down frequency converter. A simple embodiment of the inventive mixer is described relative to FIGS. 2 and 3. The operation and structure of the up converter are described relative to the illustration in FIG. 4, after which minor difference in structure and operation are described for the second embodiment configured as a down-converter are described relative to FIG. 5.

Figure 2:
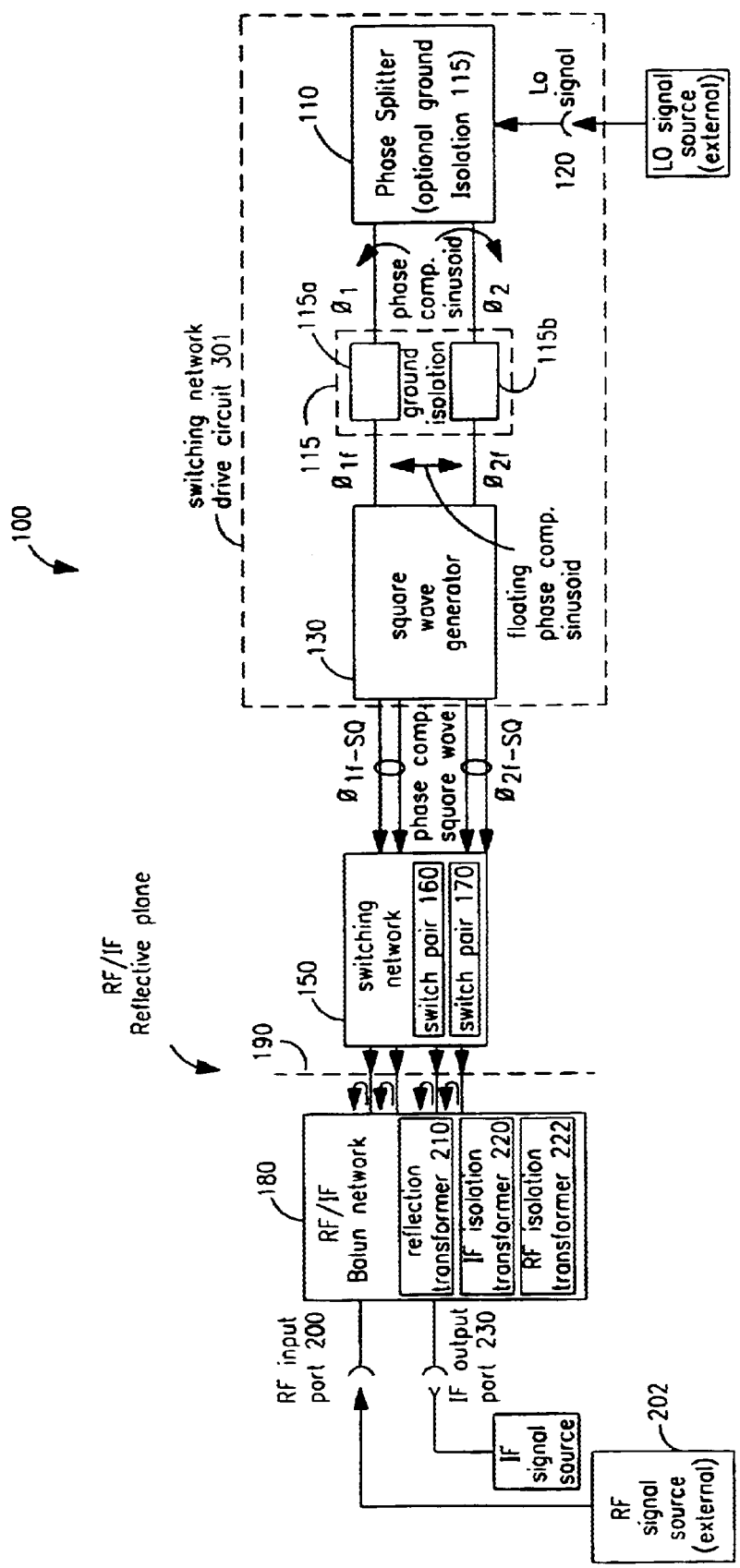
FIG. 2 is an illustration showing a simple embodiment in functional block form, of one embodiment of the inventive triple-balanced reflection FET mixer.

With reference to FIG. 2, there is shown a simple embodiment of the inventive triple balanced reflection mixer 100. Mixer 100 includes four primary functional components. A first functional component, the phase splitter 110, receives a Local Oscillator (LO) signal from an external LO signal source (not shown) at LO input port 120 and splits the LO signal into two separate phases to generate a pair of phase complementary output signals ($\phi 1$, $\phi 2$). Phase splitter 110 may also include ground isolation circuitry 115, such as ground isolation transformers 115a, 115b provided for each split phase or other means for providing ground isolation as is known in the art. Alternatively, and advantageously the ground isolation 115 may be provided by means separate from the phase splitter 110. The phase complementary signals ($\phi_1$, $\phi_2$) in the present context are signals that have substantially equal amplitude and 180-degree phase difference between them. The floating or differential signal output by the ground isolation circuitry 115 are designated $\phi_{1f}$ and $\phi_{2f}$ in FIG. 2.

A second functional component, the square wave generator 130, receives the two split phase floating sinusoidal signals from ground isolator 115 or from an integrated phase splitter 110 and ground isolation circuit 115, and generates a pair of "floating" (or differential) square wave switch drive output signals ($\phi_{1f\text{-}sq}$, $\phi_{2f\text{-}sq}$). The square wave signals are termed "floating" (or differential) because they are generated by a circuit which is isolated from ground, such as via isolation transformers. The square wave generator circuit 130 is only capable of injecting a current into a load that is connected across the two FET gate terminals 160, 170, and will not generally inject current into a load that has ground as the return path because the balanced circuit is isolated from ground, and does not desire to send current into a grounded circuit terminal or node.

A third functional component, switching network 150, here including two four-terminal switches 160, 170, one for each switch drive signal $\phi_{1f\text{-}sq}$, $\phi_{2f\text{-}sq}$, and advantageously implemented with two pairs of serially connected MESFETs (161, 162 and 171, 172) which receives the differential square wave output signals. In this embodiment, each two or pair of FETs (Q1, Q2 or Q3, Q4) forms a four terminal switching circuit (160, 170) such that each switching circuit has two input terminals and two output terminals, and that, in total, eight terminals exit from switching network 150. The switching circuits 160, 170 are switched to complementary ON and OFF conduction states by the square wave output signals during each half cycle of the LO input signal, one ON, one OFF.

Switching network 150 is connected to the reflection plane 190 of a fourth functional component, the RF/IF balun network 180. A Radio-Frequency (RF) signal is applied to mixer 100 at RF signal input port 200, and enters the RF/IF balun network 180. The RF/IF balun network 180 advantageously includes a balanced reflection transformer 210 having reflection plane 190. The ON or OFF conduction states of the switching network switch circuits 160, 170 provide the desired reflection characteristics, including occurrence and non-occurrence of signal phase reversal at the reflection plane 190. For a down converter implementation, the input RF energy reflects from switching network 150 and an IF signal emerges into an IF isolation transformer 220 and exits the mixer 100 at the IF output port 230. Advantageously, the structures of the aforementioned phase splitter 110, isolation circuit 115, square wave generator 130, switching network 150, and RF/IF balun 180 are selected to maximize second order intermodulation suppression, optimally correct any capacitive asymmetry that may be present in the RF/IF balun network 150, and are sized to prevent undue loading of the ground isolation circuit 115, such as ground isolation transformers 115a, 115b on the IF isolation transformer 220 or RF isolation transformer 222.

Figure 3:
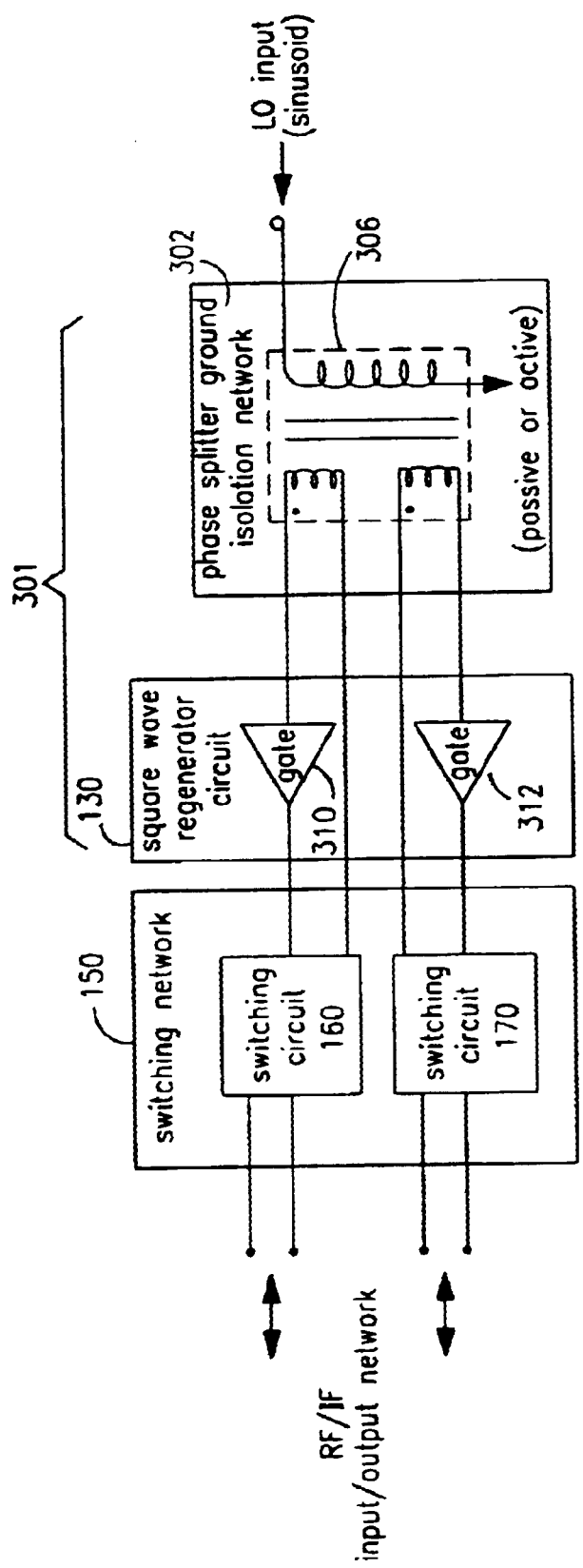
FIG. 3 is an illustration showing phase splitter, ground isolation, square wave generation circuit and switching network for an exemplary embodiment of the inventive mixer.

We now describe a simple embodiment of switching network drive circuit 301 coupled to switching network 150 with respect to the embodiment illustrated in FIG. 3. In this embodiment, phase splitter 302 also provides a ground isolation function and both phase splitting of the input LO sinusoidal signal are implemented with a passive transformer 306. In general, passive means such as a transformer having no semiconductors may be used, or alternatively, active means such as an amplifier, or floating logic gate circuit may be used, as well as other ground isolation structures and methods, as are known in the art. Square wave generation circuit 130 includes separate gates 310, 312 for each LO input signal phase output the phase splitter and the output of each gate 310, 312 is separately fed to a different switching circuit 160, 170.

Exemplary Up-frequency Converter Super-Mixer Embodiment

Figure 4A:
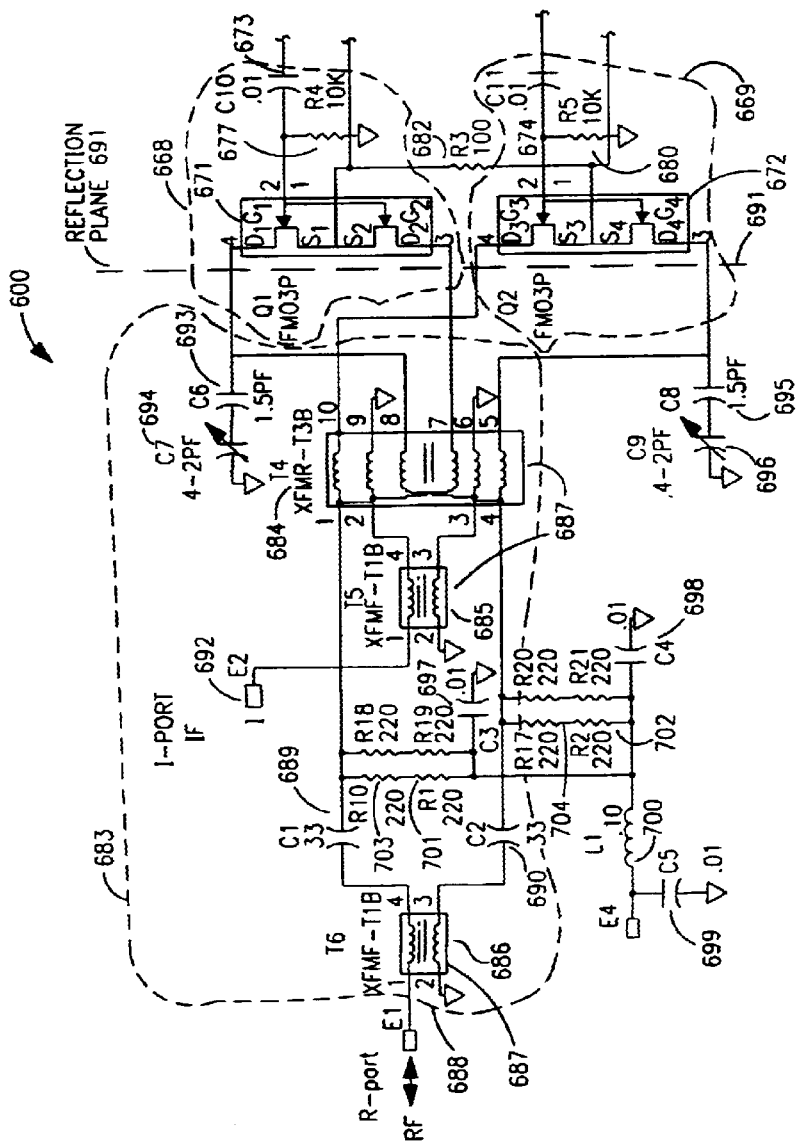
FIG. 4 is an illustration of an embodiment of the inventive triple-balanced reflection FET mixer showing additional structure of the local oscillator phase splitter, square wave generators, switching network, and RF/IF baluns, isolation transformers, as well as features enhancing performance of the mixer as an up-frequency converter.
Figure 4B:
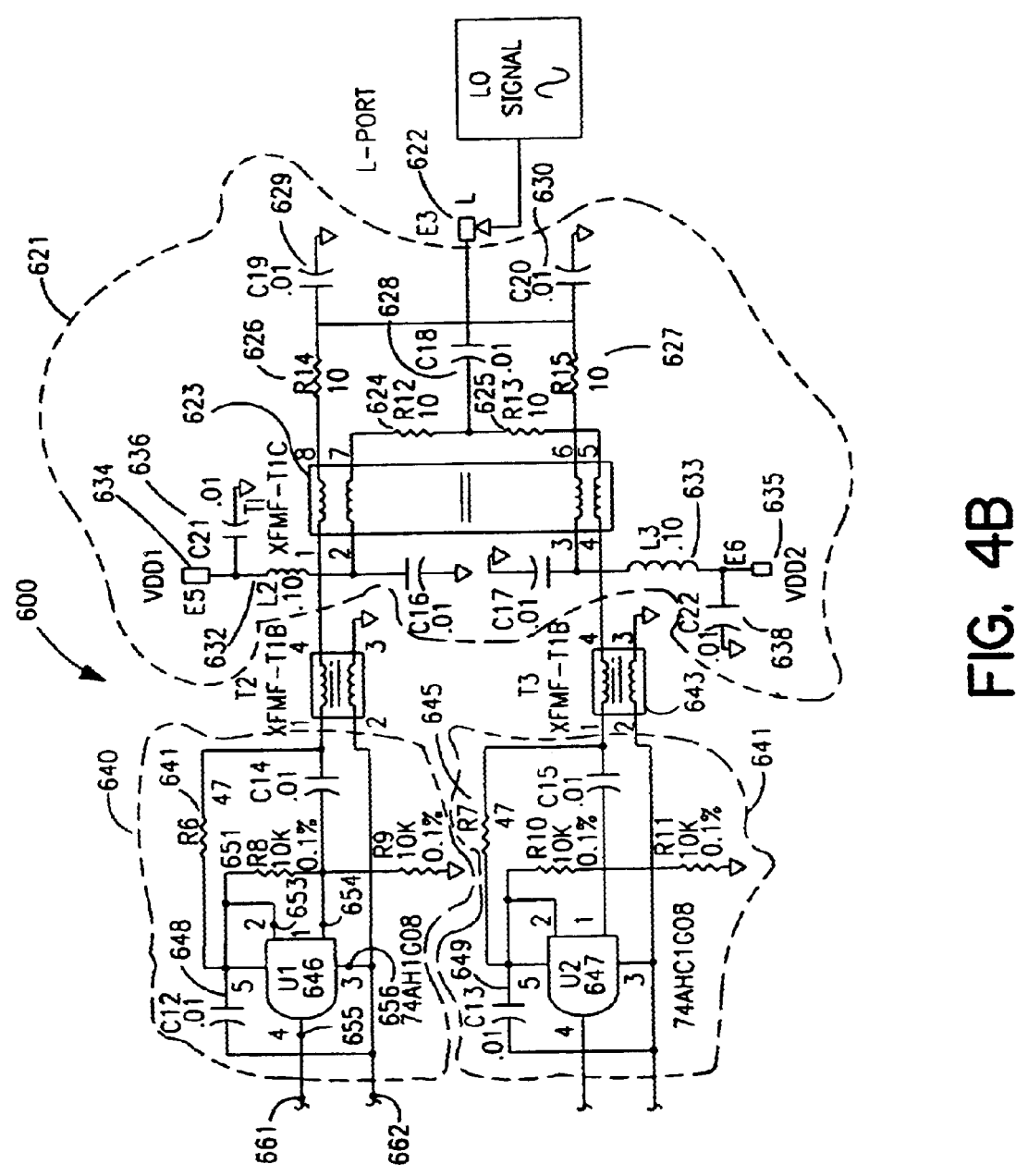

An exemplary embodiment of an up-frequency converter is now described relative to the structure in FIG. 4. Each of the five major functional components identified relative to the simple embodiment in FIG. 2 are now described in greater detail. Those workers having ordinary skill in the art will realize, in light of the disclosure provided herein, that each of the functional components has utility separate from the combination. For example, the square wave drive may be applied to other than triple-balanced mixers, or to mixers that are transmission type rather than reflection type, and that the phase splitter and/or ground isolation means are optional for some application, and may be provided by different circuits. For example, the phase splitter circuit 110 is not needed for mixers that do not use a balanced local oscillator or a complementary local oscillator.

Reference to input port and output port are indented to pertain to this particular embodiment of an up-frequency connector in the mixer environment; however, it is understood that the mixer has a first or input port and a second or output port and that depending upon the application, the input port may have higher, lower, or substantially the same frequency as the output port, and that more generally, the first and second ports may receive or deliver a signal to the ports.

The LO Phase Splitter is now described relative to the mixer 600 embodiment in FIG. 4. The LO signal from which is derived the switch signal is input at L port 622 where it enters LO signal conditional circuitry and phase splitter transformer T1 623. Resisters R12, R13, R14, R15 (624, 625, 626, 627) ensure good impedance match for the two 50 ohm outputs (terminal pairs 1, 2 and 3, 4) of the transformer 623 while maintaining good match at input L-port 622. Capacitors C18, C19, C20 (628, 629, 630) are DC blocking capacitors. Two independent bias voltages $V_{DD1}$ 634 and $V_{DD2}$ 635 are injected into the FET circuitry via transformer T1, inductors L2–L3 (632, 633), and bypass capacitors C21 636 and C22 638 and provide bias voltage for circuits in order to place FETs in their linear region. The output of phase splitter 621, and more specifically transformer 623, generates first and second ($\phi 1$, $\phi 2$) balanced signals that have matched signal characteristics.

The two LO outputs from phase splitter transformer 623 are separately fed to first and second isolation transformers T2 642 and T3 643 each of which receives a two-terminal input $\phi 1$ or $\phi 2$ and generates a ground (or other voltage referenced) isolated floating two-terminal output which is communicated to square wave generator circuit 640.

Square wave generator circuit 640, 641 receives each output of the phase splitter 621 via isolation transformers T2 642 or T3 643. DC bias voltage from the phase splitter circuit 621 passes through isolation transformer T2 and T3, and though resistors R6 644 and R7 645, and supplies the CMOS "AND" gates U1 646 and U2 647 respectively. Here, U1 and U2 are 74AHC1G08 AND gates made by Texas Instruments, Inc. The structure and operation of square wave circuits 640, 641 are the same so that only circuit 640 is described in detail. With respect to square wave generator circuit 640, current returns through transformer T2 to ground. The bias supply voltages are locally bypassed by capacitor C12 648 (or C13 649). Resister R6 644 (or R7 645) doubles as a termination resister for transformer T2 (or T3). One input 653 of gate U1 is tied to the bias supply, while the other input 654 is biased to half voltage by means of resister divider network R8 641 and R9 652. Capacitor C14 654 couples the LO signal to gate U1 646 without disturbing the gate U1 bias point. Pins 4 655 and 3 656 of U1 form a first floating square wave output at terminals 661 and 662. An identical second square wave generator 651 is fed by transformer T3 in analogous manner to form a second floating square wave output at terminals 663 and 664.

The use of transformer T1 623 at the output of phase splitter to provide some isolation from ground may be adequate for certain applications. In such cases, transformers T2 642 and T3 643 would not be required and the phase splitter outputs would be sent directly into the square wave generator circuits 640, 641. Transformers T2 and T3 serve to better isolate the floating circuitry, that is gates U1 646 and U2 647, and their surrounding components from ground. And, at the same time the burden of achieving the floating condition is advantageously removed from the phase splitter transformer T1 623, so that the two operations (LO signal phase splitting and ground isolation) may be separated and more precisely achieved by providing explicit separate transformers for each one operation. That is, transformer T1 is responsible for phase splitting, and transformers T2 and T3 are responsible for ground isolation, and each can be designed to optimally perform its function.

The inventive circuit 600 phase splitter and ground isolation means provides benefits or conveniences in addition to those already described. For example, a DC current path from the common sources (S1, S2) of the mixing FETs to ground is advantageously provided by transformers T2 and T3. Providing the transformers T2 and T3 in the circuit also provides the ground isolation very nicely without participating in the phase splitting function, and the phase splitter 621 accomplishes its job without having to generate a large amount of ground isolation. In fact, for this embodiment, phase splitter 621 does not have to generate any ground isolation because terminal pin 2 of transformer T1 is AC coupled directly to ground so that it is still a ground referenced signal. Terminal pin 3 for the second phase is also AC coupled to ground in like manner. Furthermore, phase splitting is more readily accomplished if one can maintain a ground referenced signal during the phase splitting operation, and then isolate those split signals from ground.

While one may accomplish phase splitting in a single ground isolated circuit, typically the accuracy of the operation is diminished when it is accomplished by a single transformer.

Square wave generation circuits 640 and 641, such as logic gates U1 and U2, may be implemented by NAND, AND, OR, NOR, XOR, XNOR gates with appropriate modification to the circuit, as well as other so-called primitive gates. A gate is designed to generate two discrete logic levels (about 0 volts and about 5 volts for CMOS) representative of the two levels of a square wave. These two levels as well as the voltage range provided by the logic gate are convenient for driving the mixing FETs, if the input is made to toggle from a one "1" to zero "0" by any means, whether it be another square wave (which is a traditional input to a for a logic circuit non-mixer application gate) or by a sinusoidal wave of proper amplitude, then the output of the logic gate will look like a square wave. It will toggle rapidly between "0" and "1" states and spend very little time in transition between the states. This is a highly desirable waveform shape for driving the mixing FETs. It is low-cost, physically small because the logic gates are integrated onto a single chip, easy to float in an RF circuit, and it consumes extremely small power (on the order of about 35 milliwatts) per gate.

Because the logic gates each generate two discreet levels (for example, about zero (0) volts and about five (5) volts for micro-gate logic family), the amplitude of the gate output is limited, and the output level does not correspond to a high amplitude sinusoidal signal except that in the sense that the slew rate of the square wave gate output signal is very high, this high slew rate has the effect of a very large amplitude sinusoid in terms of minimizing the period of time spent in transition between ON and OFF conduction states of the FETs. The need for a high sinusoidal LO drive level is therefore alleviated by the greatly improved high slew (square wave) drive waveform shape, hence, only about 20 milliwatt (mW) of power is required to operate the inventive structure. This compares to about 200 milliwatt for conventional structures. The benefit is achieved because the shape of the square wave is ideal, or at least more nearly ideal than the conventional sinusoidal signal.

Power consumption is also reduced because the gate does not drive a resistive load, rather it drives the small capacitive load of the FET junction capacitance. Impressing a voltage waveform across a capacitive load does not use or consume power in the manner that impressing a voltage waveform across a resistive load would. In general, it is good design practice for one circuit component to provide a good match with other circuit components and with the system as a whole, such that the power incident on an input port of the circuit should be properly terminated and converted to heat rather than reflected (unless such reflections are desired in a particular circuit). If the operating power of a circuit is high, then the power consumed is also high because all the energy required by the circuit is normally converted to heat when the circuit is properly terminated to eliminate reflections.

One embodiment of the inventive circuit only terminates about 13 dBm, which is 28 milliwatts. The circuit thereafter generates somewhat larger signal levels, which are more ideally shaped, but these signals are applied to a capacitive load and are not terminated into any resistive load. In fact, the signals are presented to the capacitive load of the FET gate, so that the inventive circuit is "power conservative" and the gates themselves require minimal power, typically only about 35 milliwatts to perform their mixing function. This circuit is therefore far more power conservative than conventional circuits that would use or require a large magnitude conventional sinusoidal signal LO drive, or LO drive coupled to a high gain amplifier to provide the 200 milliwatt operating power.

This inventive power conservation feature is advantageous for portable or battery powered radio products, and could for example be of great benefit in a mobile communication handset, in that better performance would be obtained at considerably lower power than is obtainable with conventional structures. The invention therefore provides for power conservation in mobile radios and modems, cellular telephones, and any other devices that use a mixer, especially for battery-powered devices where battery life and/or radiated power for a particular operating time are a significant concerns. Of course even in stationary or non-battery powered applications, the benefits of power conservation would be achieved. In both mobile and stationary application, heat generation and dissipation concerns that may reduce product life are also reduced. Satellite developed communication devices (typically dependent on battery, fuel cell, or solar power) employing large mixers may also benefit as a result of reduced operating power and reduced thermal power generation.

Separate phases ($\phi 1$, $\phi 2$) of sinusoidal LO signal are coupled to terminals of first and second logic gates 121, 122, here CMOS "AND" gates, such as the 74AHC1G08 manufactured by Texas Instruments. Those workers having ordinary skill in the art in light of this disclosure will appreciate that logic gates 121, 122 other than "AND" gates, such as, but not limited to, NAND, OR, NOR, XOR, and that other logic gates may be used either alone or with the addition of additional gates or conditioning circuitry, and that logic families other than CMOS, such as, but not limited to TTL, ECL, or other logic families may be used to implement the selected gates.

The gates 205, 206 form the square wave generator circuit and may alternatively be replaced with other circuits or devices which generate a high slew rate signal in response to the input sinusoid. For example, Schottkey diodes may be used in place of gates to increase the mixers applicability into the gigahertz (GHz) frequency range. Furthermore, it may be desirable to isolate the diodes from ground by providing ground isolation either within the phase splitter means or as a floating drive circuit. In some circuit topologies ground isolation may not be required.

Independent bias voltage inputs for the two CMOS "AND" gates allows precise trimming of the output square wave amplitudes, which is useful in optimizing second order intercept point. Due to the excellent gain of the CMOS logic gates, very little LO sinusoidal drive power is required. Potentially as little as 0 dBm of LO sinusoidal signal drive applied to the gates would still result in normal mixer operation. One embodiment of the inventive mixer device achieves a conversion loss of about 6 dB, a noise figure of about 7 dB, a port return loss of about 15 dB, isolation between any ports greater than about 40 dB, and input IP2 of about 90 dBm, and input IP3 of about 45 dBm. These input intercept points (IIP2 AND IIP3) are achieved with only a +13 dBm LO sinusoidal drive level.

In an alternative exemplary mixer configuration (not shown) that provides source-to-source serially connected FETs with grounded source, such mixer would also advantageously be provided with square wave LO signal derived drive. However, since the FET source terminals of such a mixer would be grounded, and the load connected to the mixer would be ground referenced, there is no need for a phase splitter. Such mixer configuration would only require the logic gate to receive the sinusoidal LO input signal directly.

In yet another alternative embodiment, if the load is merely grounded or ground referenced, then providing a floating square wave drive differentially placed across the FET gate and source terminals, there is no need for a balanced circuit, and one may use an unbalanced diplexer with its utility and advantages. Here, no phase splitter would be needed, but a transformer would be provided to achieve ground isolation.

Therefore, it should be understood, that the use of square waves for driving the FET switches is useful, and even more significantly, the use of non-ground referenced floating drive is compelling, and that greater benefit to performance is achieved by the combination of the square wave drive with floating or differential drive features.

Mixers are used in communications electronics including cellular communication systems and devices, space communications, ground communication stations, instrumentation and test equipment, no name only a few mixer applications. The particular embodiment of the device being shown and described with respect to FIG. 4 may have a useful bandwidth up to several hundred Megahertz. But, with appropriate modifications readily appreciated, in light of the disclosure provided herein, by workers in the art, other embodiments of the invention readily extend this bandwidth range to tens of Gigahertz. For example, the invention may also be used in a base station application where there may be more than one mixing or frequency conversion process during the down-conversion of the incoming 900 Mhz or higher frequency signal to an intermediate frequency (IF) signal, and then a second down-conversion from that IF to baseband. In this base station application, the inventive mixer device may be used for the second (IF-to-baseband) conversion to obtain very high linearity. This makes sense because the back end of such a system normally has the gain of previous stages to contend with, and so it is working at higher signal levels. Preservation of the higher levels of linearity are important in those back end stages in order to preserve the intercept point of the whole receiver.

There are other square wave regenerating devices and methods other than logic gates that could be floated in the manner described here, that have bandwidths up to one or a few gigahertz. Specifically, a method using step-recovery diodes as the square wave generation means may be applied up to about a few gigahertz, and which may be implemented in a small size within a floating environment. An amplifier run in hard saturation will also convert a sinusoidal wave into a square wave by clipping it symmetrically. Even a simpler embodiment of the mixer circuit may be provided that would allow the level of the sine wave be fairly high and by using back-to-back Schottky diodes the large amplitude sine wave would be clipped into a lower amplitude square wave. While this alternative technique would not be very power efficient, requiring relatively large sine wave power levels, it would be elegant, and could be implemented at microwave frequencies up to several to tens of gigahertz, for example from about 1 GHz to 50 GHz or more. Therefore, such a circuit may also be provide for operation a cellular band and/or PCS band frequencies.

Small physical device or component size is important when trying to float a component because large physical dimensions typically imply a large amount of coupling capacitive or inductive parasitics between the component and the ground plane of the circuit or to the enclosure of the circuit. By keeping dimensions of the logic gates that generate the square wave small (easily accomplished using readily available commercial logic gate chips or custom designed and fabricated logic gates), the coupling is minimized and it is possible to float circuits and isolate them from ground and from the enclosure very effectively. These commercial logic gates cost on the order of less than a dollar per gate in small numbers, and fractions of a dollar per gate in quantity so that use of such gates in the mixer has significant cost advantages as well as performance advantages.

Switching devices, such as FETs, have undesirable characteristics at points of transition in replicating a short circuit and an open circuit. For a switching device, one prefers the device to be operating as either a short or as an open circuit, and rapidly toggling between the two states. In order to get between the states, the switching device must pass through a transition state. It is during the transition state or phase that the transistor, diode, or other switching element or circuit being used, displays the maximum amount of nonlinearity, generates the maximum amount of distortion components, and injects a maximum amount of noise into the circuit. The perturbation (or destruction) of mixer port-match and mixer isolation is also typically worse during the transition phase than at any other time because the non-ideal (and typically time varying) impedance value exhibited by the switch during the transition, is a different impedance than the circuit has been designed to have. Therefore, the faster the switch moves through the transition phase, the less time the mixer circuit has to endure the hardships associated with transition phase characteristics. An "ideal" square wave is infinitely fast and does not spend any time in the transition. The ideal square wave also has a fifty-percent (50%) duty cycle and perfect signal symmetry (e.g 180 degrees). Feedback circuits can also optionally be used to insure that perfect symmetry and duty cycle characteristics are precisely maintained over a range of operating conditions and environments. In practical terms, a real square wave or pseudo-square wave form by high slew rate but which is somewhat bandwidth limited transits the transition phase in a minimum time. For these and other reasons, the square wave is an optimal waveform for driving a mixing device.

All of the benefits for method an structure for reducing intermodulation distortion as a result of back-to-back (source-to-source) serial connection of the FETs making up a switch in U.S. Pat. No. 5,513,390 which is incorporated herein by reference remain valid, and the use of the square wave to drive the FET switches further reduces the distortion that might otherwise require cancellation, and also provides the additional benefits already described. The pair of series connected mixing FETs in the inventive mixer device offer the benefit of improved linearity and reduced distortion over that of a single FET.

With respect to the signal mixing structures and methods generally, the use of series connected (source-to-source) Field Effect Transitions (FETs) to reduce intermodulation distortion in a mixer and other advantages has been described in U.S. patent application Ser. No. 08/574,071, copending with this application and titled Method and Apparatus For Reducing Intermodulation Distortion in a Mixer.

Figure 6:
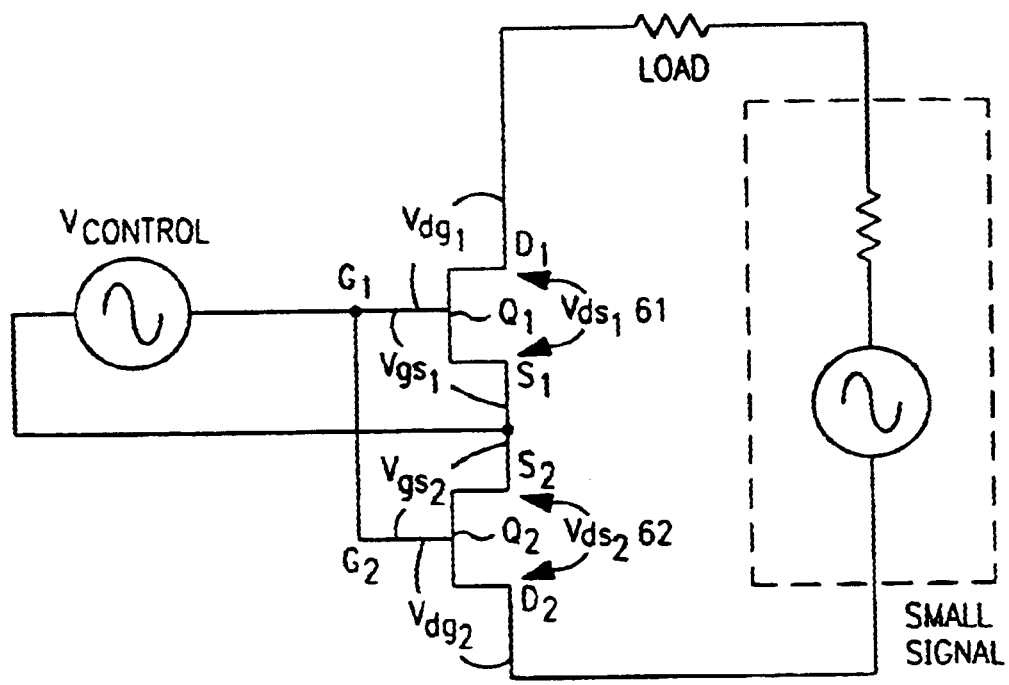
FIG. 6 is an illustration showing a source-to-source serially connected dual-FET structure and the manner in which the structure reduces distortion.

FIG. 6 aids in illustrating how back-to-back FETs cancel intermodulation distortion in the mixer circuit. For the circuit of FIG. 6, the gate-to-source voltages for each FET are equal and also equal to the FET control voltage. Furthermore, for each FET the SUM of the gate-to-source voltage and the source-to-drain voltage is equal to the gate-to-drain voltage. Therefore, $Vg_1s_1 = V_{control}$ $Vg_2s_2 = V_{control}$ $Vg_1d_1 = Vg_1s_1 + Vs_1d_1$ $Vg_2d_2 = Vg_2s_2 + Vs_2d_2$ To a first approximation, $Vs_1d_1 = -Vs_2d_2$ where $Vs_1d_1$ is the source-to-drain voltage across transistor Q1, and $Vs_2d_2$ is the source-to-drain voltage across transistor Q2. Also, to a first approximation, $\Delta R_{ds} = c \times \Delta V_{gd}$, which says that the channel resistance across the drain-to-source channel ($\Delta R_{ds}$) is linear (to a multiplicative constant c) to gate bias voltage ($\Delta V_{gd}$). This assumption is nearly correct during the time that the FETs are heavily conductive. Note that the two FETs are ideally matched such that they behave the same, and let $Rd_1d_2$ be the total series resistance of the two FETs Q1 and Q2, and the change of channel resistance $\Delta Rd_1d_2$ be that component of the channel resistance causing intermodulation distortion. Then, $$\Delta Rd_1d_2$$
$$= c \times (\Delta Vg_1d_1 + \Delta Vg_2d_2)$$
$$= c \times (Vs_1d_1 + Vs_2d_2)$$
$$= 0$$

The small signal passes through the FET channel combination without controlling its resistance. This condition is equivalent to infinite intermodulation suppression. This is the technique used in mixer to help reduce intermodulation distortion.

Aspects of distortion cancellation in series connected FETs is now described. When a signal voltage is applied to the drain of a FET, there exists a voltage $V_{ds} = V_{sig}$ across the channel of the FET. Regardless of the gate voltage, the channel resistance (and impedance) of the FET is not constant, but is modulated by the voltage $V_{sig}$. The result or effect of this process is nonlinearity distortion signals generated across the channel and appearing as a distortion voltage $V_{dist}$. Hence, the total voltage across the FET drain to source channel ($V_{ds}$) is the sum of the signal voltage ($V_{sig}$) plus the distortion voltage ($V_{dist}$); such that:

$$V_{ds} = V_{sig} + V_{dist}.$$

In general, the distortion signal can be separated into two distinct components. The first component is the "odd order" distortion voltage ($V_{dist,odd}$). It has the property of retaining the sign information of the signal voltage that caused it, whence:

$$V_{dist,odd}(-V_{sig}) = -V_{dist,odd}(V_{sig})$$

On the other hand, the "even order" distortion voltage ($V_{dist,even}$) does not retain the sign information, so that:

$$V_{dist,even}(-V_{sig}) = V_{dist,even}(V_{sig})$$

When two FETs are connected serially back-to-back, with their respective sources tied to one another and their respective gates tied to one another, a signal voltage $V_{sig}$ can be applied to the FET pair as a potential difference between the two drains $D_1$ and $D_2$. This results in the relationships:

$$V_{ds1} = V_{sig}/2$$

$$V_{ds2} = -V_{sig}/2$$

where $V_{ds1}$ is the drain-to-source voltage for the first FET and $V_{ds2}$ is the drain-to-source voltage for the second FET and the total voltage is split between the two. Taking the distortion components into account, the relevant voltages are:

$$V_{ds1} = V_{sig}/2 + V_{dist,odd}(V_{sig}/2) + V_{dist,even}(V_{sig}/2)$$

$$V_{ds2} = -V_{sig}/2 + V_{dist,odd}(-V_{sig}/2) + V_{dist,even}(-V_{sig}/2)$$

Utilizing the definitions of even and odd order distortion described above, it follows that:

$$V_{ds1} = V_{sig}/2 + V_{dist,odd}(V_{sig}/2) + V_{dist,even}(V_{sig}/2)$$

$$V_{ds2} = -V_{sig}/2 - V_{dist,odd}(V_{sig}/2) + V_{dist,even}(V_{sig}/2)$$

When this connection of FETs occurs in a mixer, the distortion that is coupled to the surrounding circuitry and to the output port of the mixer is the difference in potential between the two drains:

$$V_{ds1} - V_{ds2} = V_{sig} + [2 \times V_{dist,odd}(V_{sig}/2)]$$

Thus, in theory complete cancellation of the even order distortion can occur, while no cancellation of odd order distortion is obtained. These relationships hold irrespective of whether the FET drain $D_2$ is grounded or not.

Several benefits follow from the FET-pair connectivity and voltage relationships. First, complete cancellation of intermodulation distortion requires that the distortion be generated in precisely equal magnitude within each of the two FET's, and summed in opposite directions to achieve the distortion cancellation. Where some slight variation in magnitude may be present, such as might be present by normal device process variation, the distortion is reduced commensurate with the degree of matching.

Second, the generation of equal magnitude distortion by each transistor (FET) requires that the transistors have identical gate-source voltages ($V_{gs}$) at all times, that is during all phases of the control (e.g local oscillator) signal. This second condition is strictly true in the invention because the two FET's have common gate terminals and common source terminals, so that these terminal pairs are always at the same voltage potential independent of the absolute voltage potential or time.

Third, distortion cancellation also benefits from having the same drain-to-source ($V_{ds}$) voltage for the two FET's in each switch at all times. This condition also is present because the identical gate-to-source voltage ($V_{gs}$) results in the same channel resistance for the two FET's, which results in an identical voltage drop across the two FET channels.

Finally, the distortion produced by each of the two FETs operating as a pair is summed by means of the back-to-back serial connectivity between the two FETs, so that the distortion is canceled. This condition is met in the invention by the common source connection of the two FETs, and by the connection of the two drains of the FET pair to the mixer ports.

Conversion loss, noise figure, and intermodulation suppression are even further enhanced by the use of a square wave gate drive. The square wave switches the mixing FETs rapidly between ON and OFF states, thus avoiding the lossy and strongly nonlinear transition state substantially. Further improvements in second order intermodulation suppression are achieved by providing precise balance in the mixer circuit, which assists in maintaining cancellation of unwanted mixer products. The balance desired, and the performance achieved in one embodiment, is at least partially attributed to the ideal characteristics of the balanced reflection transformer which cancels second order non-linearities.

Isolation transformers are advantageously used at the RF and IF ports, as well as at the CMOS gate inputs to preserve the balance of the mixing process. The balance is advantageously improved even further by providing a well matched LO phase splitter transformer 623 in the mixer 600, where input series resistors (e.g. R12, R13, R14, R15) are added to completely eliminate standing waves in the transformer 623. Resistors R12–R15 along with capacitors C19–C20 decouple the LO signal from the gate bias. This structure ensures very accurate phase control.

Those workers having ordinary skill in the art in light of the description provided herein will now appreciate the benefit of providing a square wave switching drive signal but may not immediately appreciate the manner in which the inventive structure and method provide the means for achieving a square wave drive in the mixer circuit or within the direct drive receiver system without adversely effecting other conditions of the circuit or system in order to obtain high-performance. The inventive structure provides a synergistic set of structures and processor to introduce square waves into the mixer. Also, to implement the square wave drive, over a broad band of frequencies in balanced form, and/or in ground isolated form is difficult and not disclosed or suggested by conventional structure or methods know to the inventors.

If the square waves were merely generated at a point in the circuit where the square wave signals were still ground referenced, a portion of the mixer circuit design might be somewhat simplified as compared to the inventive mixer circuit in which the square wave drive signals are generated separate from ground isolation; however, in such a circuit, there would be a further requirement to pass the ground referenced square wave through an isolation transformer.

It is well known that square waves have a very large bandwidth. Unless the transformer(s) had incredibly high performance, including of course a very large bandwidth, such isolation transformer(s) would bandwidth limit and otherwise distort the square wave, and one would wind up with a distorted output signal that might no longer look or perform like the input square wave and would no longer work to drive the switches as required. Implementation of such very high performance transformer with its associated high costs in a mixer would probably not be practical, even if such an optimal transformer were available. It is also noted that digital circuits having logic gates, such as CMOS "AND" gates, are generally ground referenced, so that application of digital gates in a floating signal environment particularly in an analog circuit is advantageous but quite unusual. Finally, it should be noted that square wave drive (in floating or non-floating environment) such as a square wave device using digital logic gates, is also applicable apart from mixer circuit.

The FET Switching Networks 668, 669 are now described relative to the embodiment illustrated in FIG. 4. FET pair Q1 is formed from a pair of identical MESFETs each having a drain (D1, D2), a gate (G1, G2), and a source (S1, S2) connected together to form a four terminal switching circuit 671. The first switch circuit 671 is switched on and off by the square wave output of gate U1 646, which is capacitively coupled to the gates of Q1 via capacitor C10 673. Note that the gates of the FETs making up Q1 are tied directly together and that the sources are also connected together so that the two FETs are connected serially back-to-back (source-to-source). Capacitors C10 and C11 serve to allow the gate terminal of Q1 to self bias while resistors R4 and R5 acts to further control the self bias point by a gate ground return. The second switching circuit Q2 672, capacitor C11 674, and resistor R5 680 function in a like manner. Resistor R3 682 ties the two switching networks 668, 669 together at the common FET source nodes and how a resistance value (here 150 ohm) is chosen to maximize second order intermodulation suppression. Second order intermodulation suppression is positively affected by R3 because it keeps Q1 and Q2 at equal potentials but isolates them.

The exemplary RF/IF Balun Network 583 is now described relative to the embodiment illustrated in FIG. 4. Transformers T4, T5 and T6 (684, 685, 686) operate as a balun network 687. For a mixer operating as a down converter, RF signal energy enters the mixer at the R-port 688 where it is ground isolated by RF port isolation transformer T6 686, through DC blocking capacitors C1 689 and C2 690 as the RF signal enters balanced reflection transformer T4 684. Switching networks Q1 and Q2 (671, 672) are connected to the reflection plane 691 of transformer T4 634 such that the RF signal energy reflects off Q1–Q2 and emerges as the IF signal into IF isolation transformer T5 685 and out the I-port 692. Slight capacitive asymmetry in the balun network, if any, may be trimmed out by means of capacitors C6 693, C7 694, C8 695, and C9 696. Means for injecting a drain bias at Vdd bias for Q1 and Q2 is provided by filtering network C3 697, C4 698, and C5 599 and L1 700, and by resistors R1 701, R2 702 and R16 703, R17 704. The four resistors (R1, R2, R16, R17) are chosen to prevent undue loading of the RF isolation transformer T6 and T4.

Exemplary Down-Frequency Converter Super-Mixer Embodiment

Figure 5A:
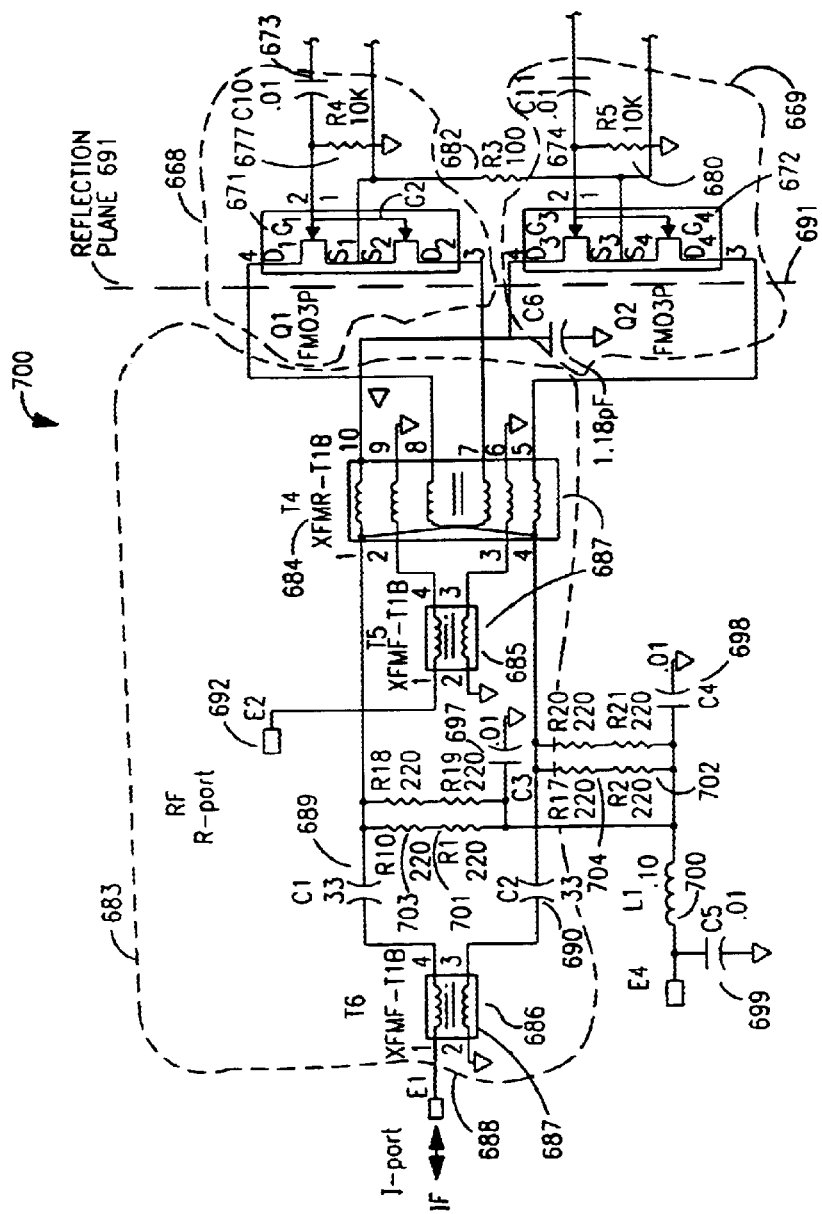
FIG. 5 is an illustration of yet another embodiment of the inventive triple-balanced reflection FET mixer showing additional structure of the local oscillator phase splitter, square wave generators, switching network, and RF/IF baluns, isolation transformers, as well as features enhancing performance of the mixer as an down-frequency converter.
Figure 5B:
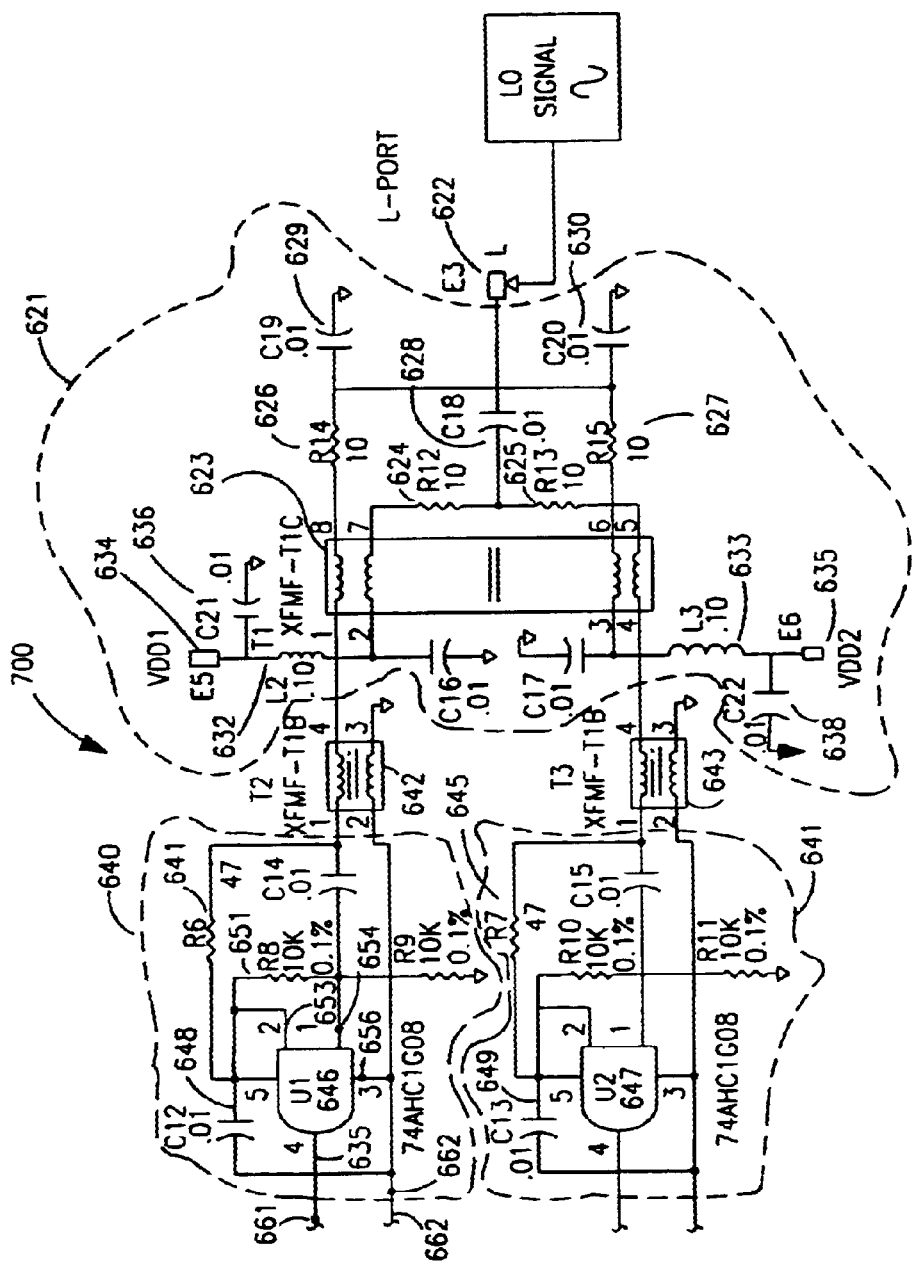

Having described an embodiment relative to the circuit in FIG. 4, we now describe a second mixer 700 embodiment that is particularly suited for a down-frequency convertor mixing circuit with respect to FIG. 5. It will be evident from inspection of the circuits in FIG. 4 and FIG. 5, that the primary functional and structural components are the same for the two embodiments, and that only the RF/IF balun network circuits have been modified. In particular, the capacitors C6 693, C7 694, C8 695, and C9 696 provided in the circuit of the up-converter shown in FIG. 4, have been eliminated in the down connector embodiment of FIG. 5, and replaced with capacitor C6 (1.8 pF) connected to the drain (D) terminal of the upper FET in switch Q2 in the embodiment of FIG. 5. The use of the R port and I port have also been reversed in the two embodiments. These different elements provide more optimal operation desired for up- or down-frequency converter operation in the respective circuits, however, either embodiment may be used for up- or down-conversion with some performance loss.

Figure 7A:
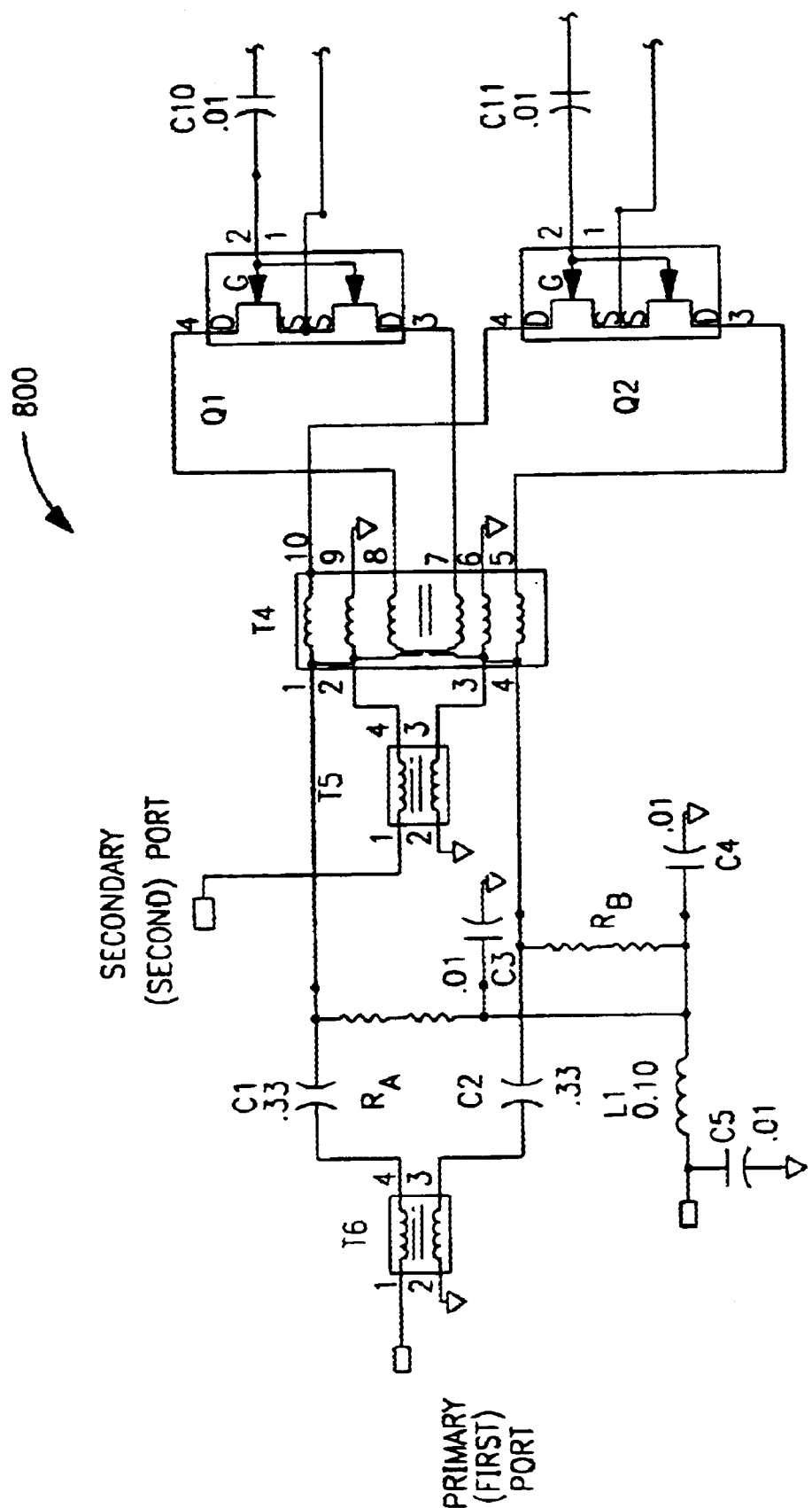
FIG. 7 is an illustration of still another embodiment of the inventive triple-balanced reflection FET mixer showing alternative structure of the local oscillator phase splitter, square wave generators, switching network, and RF/IF baluns, isolation transformers and eliminating some optional circuit elements.
Figure 7B:
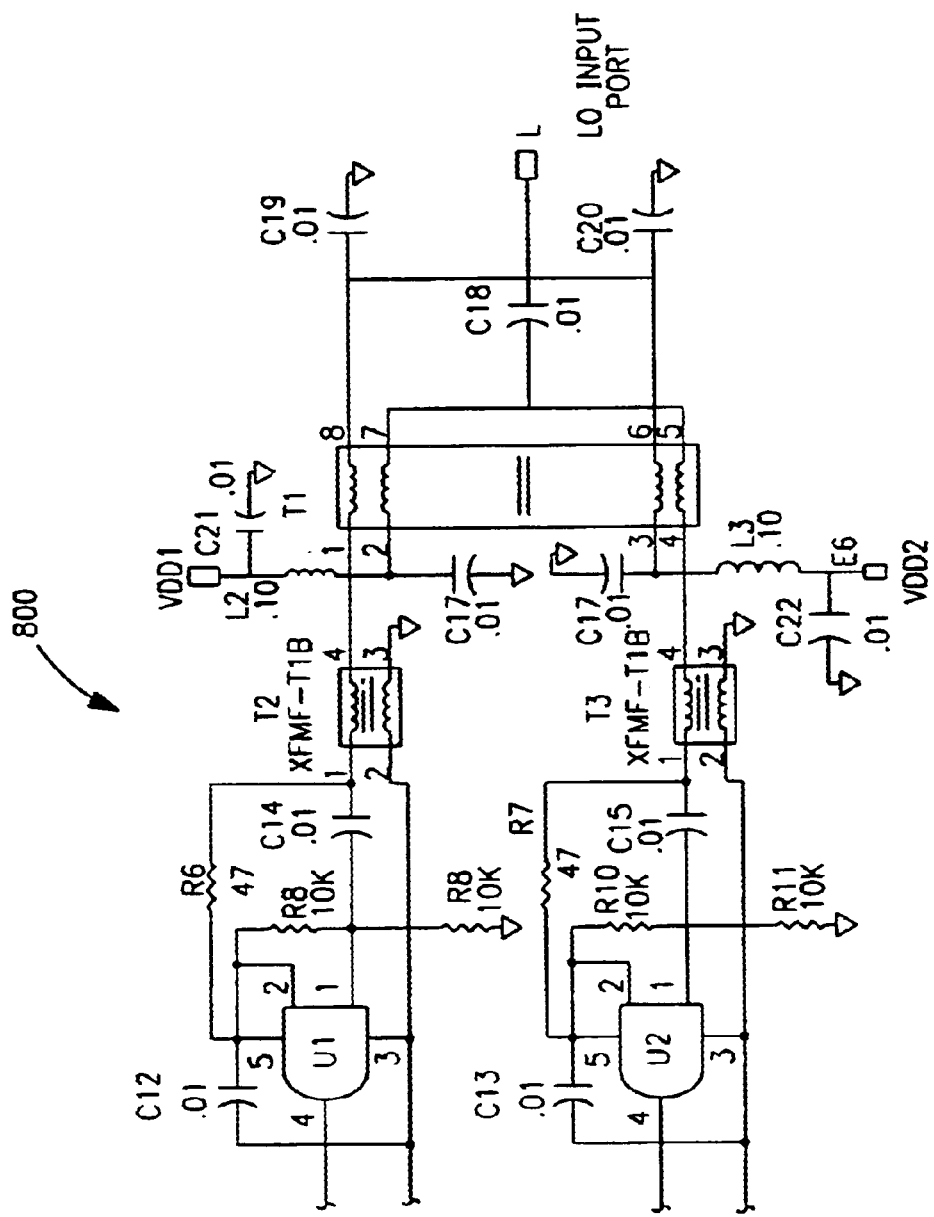

A third alternative mixer 800 embodiment is illustrated in FIG. 7. In this embodiment, several clearly optional components have been eliminated from the mixer circuit. Here, for example, the resistive networks R16, R18, R19, R1 and R17, R20, R21, R2 provided in this serial-parallel combination of FIGS. 4 and 5 for power handling receivers have been simplified to two resistors RA, RB. Also, the resistors provided in the LO input stage (R14, R15, R12, R13) for LO decoupling have been eliminated, as have resistors R4, R5 for FET gate self bias in the gate drive circuit.

Figure 8:
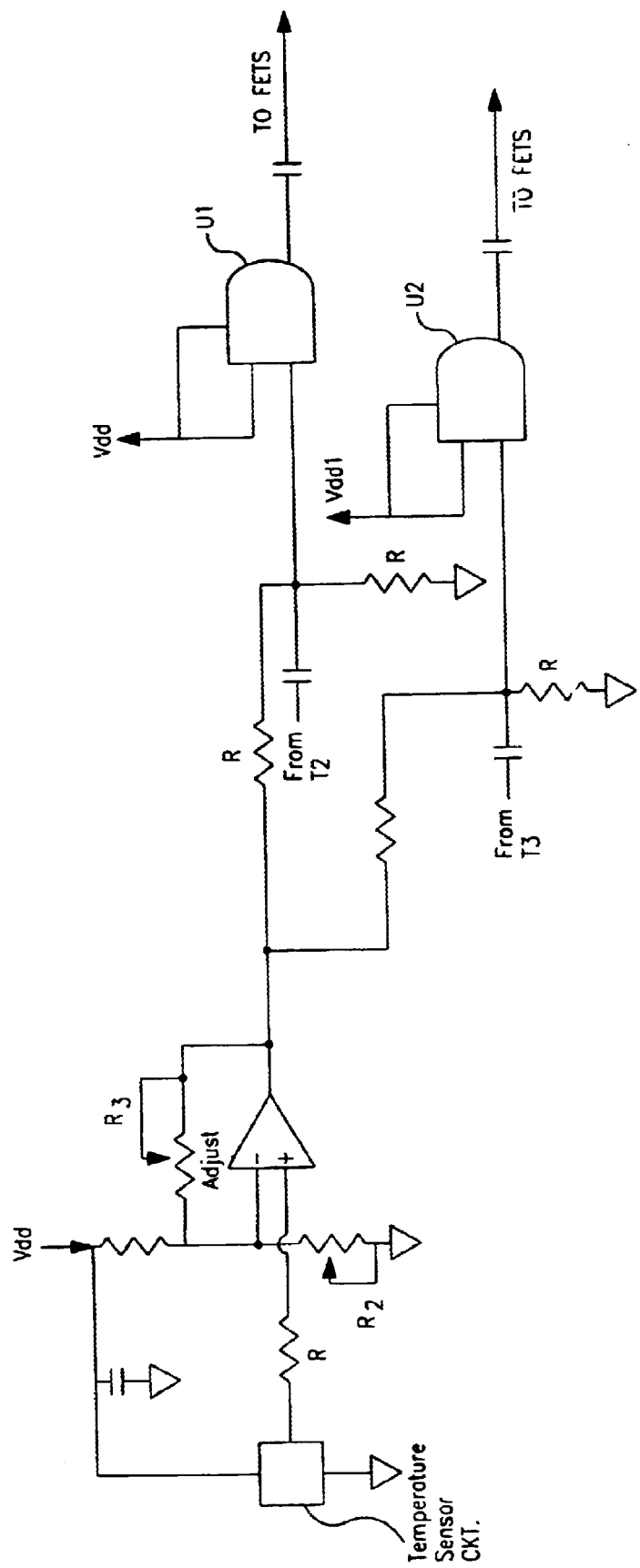
FIG. 8 is an illustration showing an optional temperature compensation circuit for improving the temperature range performance of the inventive structures.

A further performance improvement to the inventive mixer (both up- and down-frequency conversion mixers) may be realized by providing temperature compensation circuity to compensate the logic gate circuits for operating temperature. In such an embodiment show in FIG. 8, a voltage divider pair of resistors pull-off of the $V_{dd}$ voltage supply terminal of the chip, divide the voltage in half and put the half voltage in the gate to set the operating point. This compensation is desirable because it was discovered that going over the operating temperature range of the mixer, some compensation is at least desirable because the particular CMOS gate (Model No. 74AHC1GOB) manufactured by of Texas Instruments, Inc. has an internal reference voltage that may drift with temperature and it is desirable for the bias point to drift with the drifting reference voltage. As the ambient temperature changes, the temperature sensor puts out a proportional voltage. Initially, at room temperature, resistor R2 is set for 5 volts for gate bias. As the temperature changes, this initial voltage at R3 is adjusted at the temperature limits of −10 C. and +60 C. to compensate for gate bias changes.

Exemplary Homodyne and Heterodyne System Topologies that Include Super-Mixers

Having described the inventive super-mixer in some detail, we now turn our attention to particular radio/tuner/transmitter/receiver topologies in which the inventive super-mixer 32 may advantageously be used.

These structures and the methodological procedures described below use the super-mixer to overcome problems and limitations of the prior art described earlier. We begin by addressing some of the practical and theoretical problems that have limited conventional devices and systems, and the manner that the invention improves on the prior-art performance, followed by more detailed descriptions of the structure and operation of particular embodiments of these homodyne, heterodyne, and super-mixer topologies.

Briefly, one aspect of the present invention includes a mixer device structure 32 and mixing method, and structure and method for a tuner and transmitter/receiver. Depending upon the implementation, either homodyne or heterodyne tuners and/or receiver/transmitters may be provided, and reference to either type in this disclosure is not to be construed as limiting the invention to one type or the other. Generally, we will refer to tuner, receiver, or transmitter, and the particular type will be apparent from the structure shown or described, or the description will be applicable to all types.

We first describe an overview of radio tuner structure, function, performance and design parameters and techniques so that the inventive receiver/transmitter, radio tuner, and component mixer may be more readily understood when described in greater detail following this overview.

Figure 9:
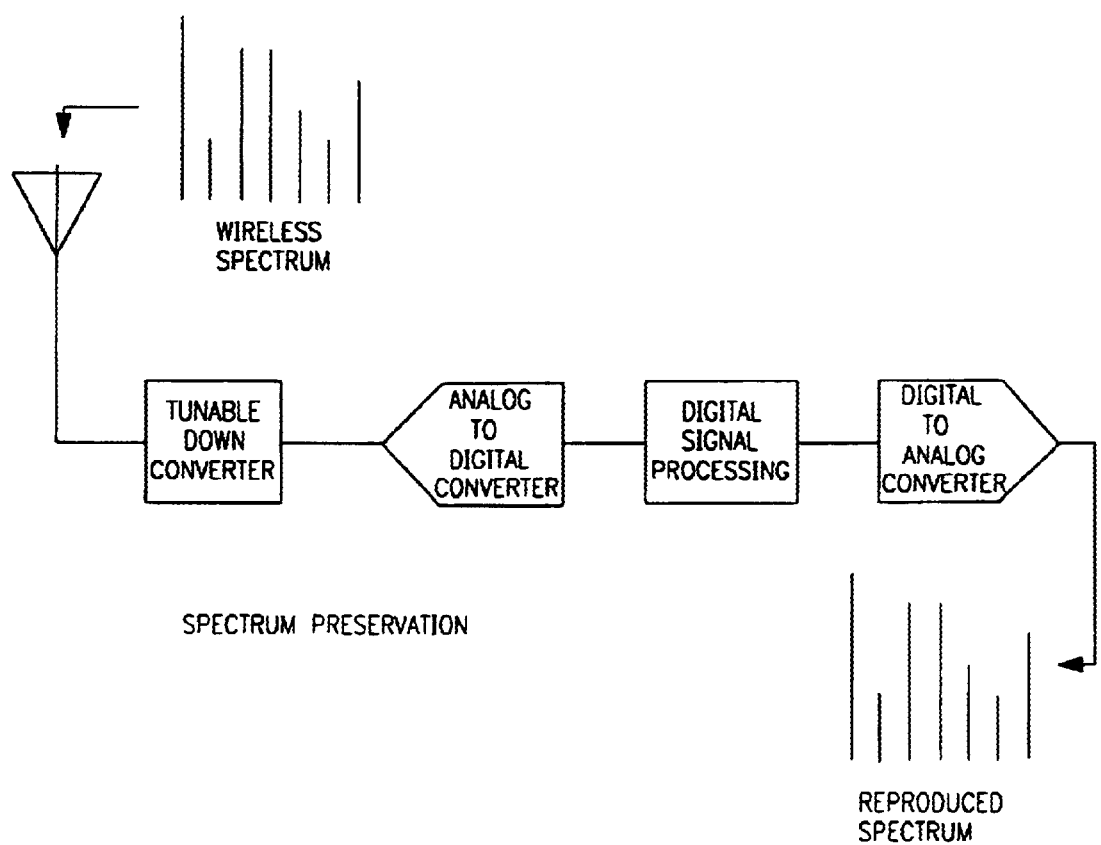
FIG. 9 is an illustration showing the tuner's function of preserving the spectrum for the digitizing process.

The inventive tuner has high-dynamic-range, and may be used to convert wireless spectrums down to baseband. Analog to Digital (A/D) Converters digitize the analog spectrum and Digital Signal Processors extract the modulation intelligence from the signal. When required, Digital to Analog (D/A) Converters can reproduce any part of the input spectrum at baseband or any modulation back to analog form. This entire conversion process illustrated relative to FIG. 9, should ideally replicate the wireless spectrum exactly with no distortion added at any stage or step of the process. One can measure this distortion less process as a function of dynamic range. The inventive tuner keeps up with the state of the art stages and provides more than sufficient performance which meets or exceeds the dynamic range of next-generation high performance 14-bit and 16 bit A/D Converters.

Figure 10:
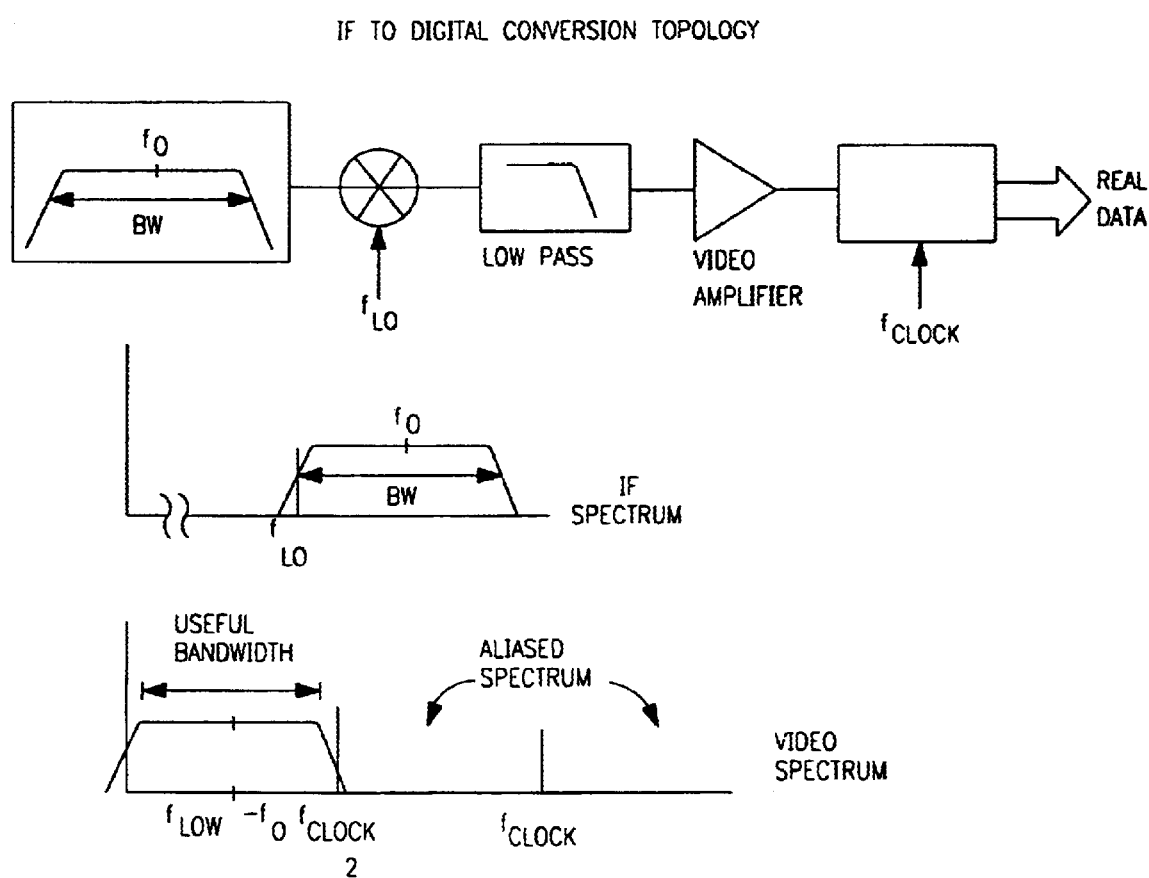
FIG. 10 is an illustration showing Intermediate-frequency (IF) to Digital conversion.

FIG. 10 shows a digital conversion system topology. The final IF is band-limited with a standing acoustic wave (SAW) filter, converted to baseband, low-pass filtered, and amplified to the drive level required by the A/D converter, typically about 1 to 2 volts. This process must provide enough selectivity to prevent the A/D converter from converting image and alias spectral components and producing spurious signals.

Figure 11:
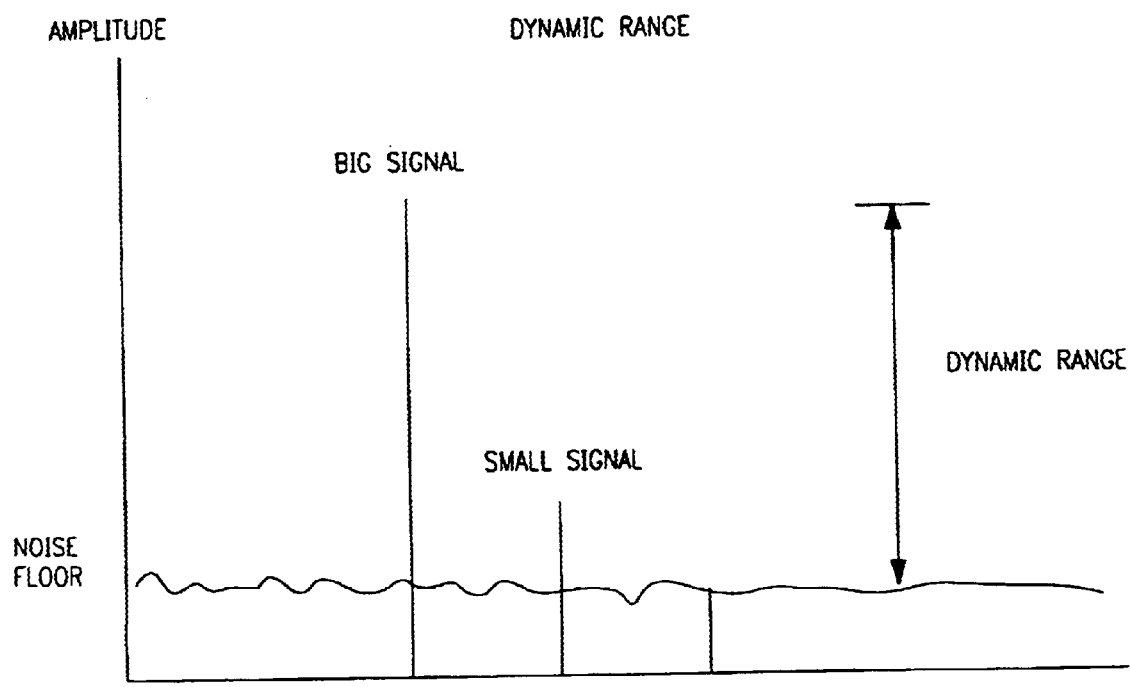
FIG. 11 is an illustration showing dynamic range as the largest signal to the noise floor.
Figure 12A:
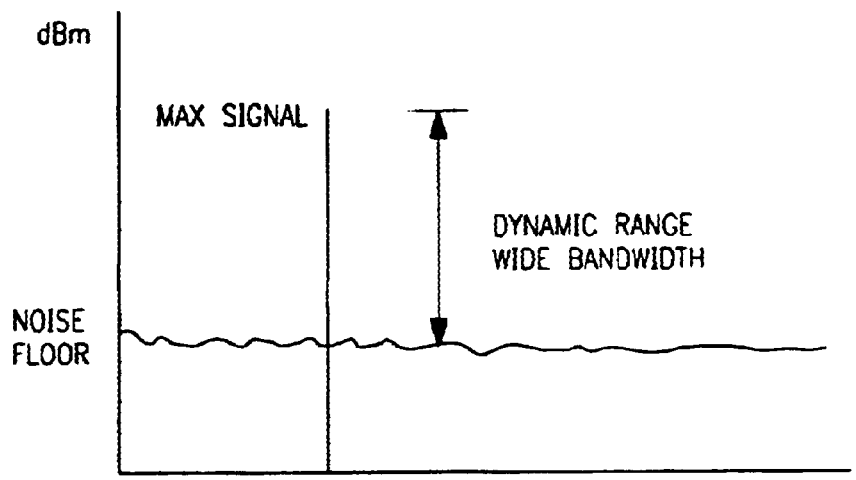
FIG. 12 is an illustration showing effects of resolution on dynamic range.
Figure 12B:
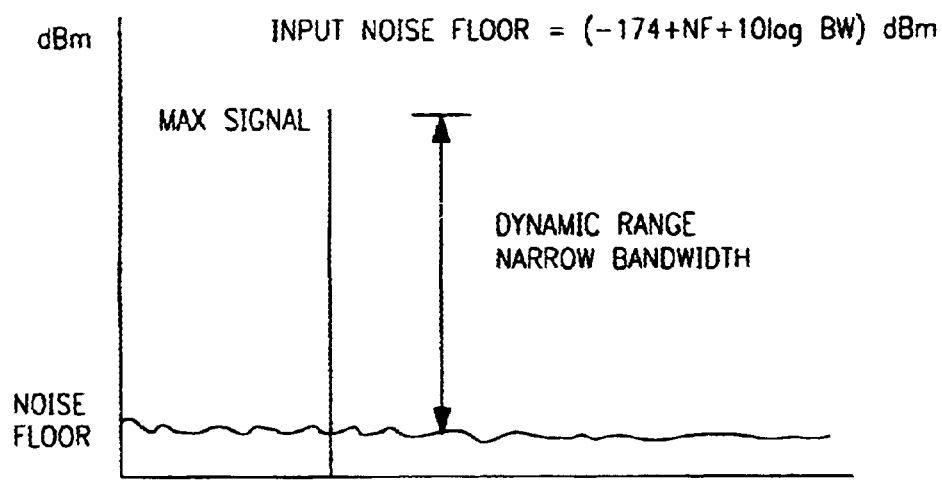

For this digitizing process, we define dynamic range as the ability to replicate large and small signals in the presence of noise with no or substantially no distortion producing spurious signals (FIG. 11). Bandwidth, in the form of A/D-converter bit resolution for post processing, can reduce or raise the noise floor as shown in FIG. 12. One can best express distortion tests in tuners in terms of second-and third-order intercept points (IP2 and IP3). These artificial intercept points are calculated as the result of two signals causing distortion product signals when their frequency relationship to the tuned signal is:

$$f_1 \pm f_2 \text{ for } IP2;$$

and $$f_1 \pm 2f_2, \text{ or } f_2 \pm 2f_1, \text{ for } IP3;$$

where $f_1$ is the frequency of the first signal and $f_2$ is the frequency of the second signal. Other ways to express these intercept points are as IIP2 or IIP3 for the input to a tuner stage, or as OIP2 or OIP3 for the output of a tuner stage. The output IP differs from the input IP by the gain or loss of the stage. A/D-converter manufacturers have their own unique way of specifying spurious signal content.

Figure 13:
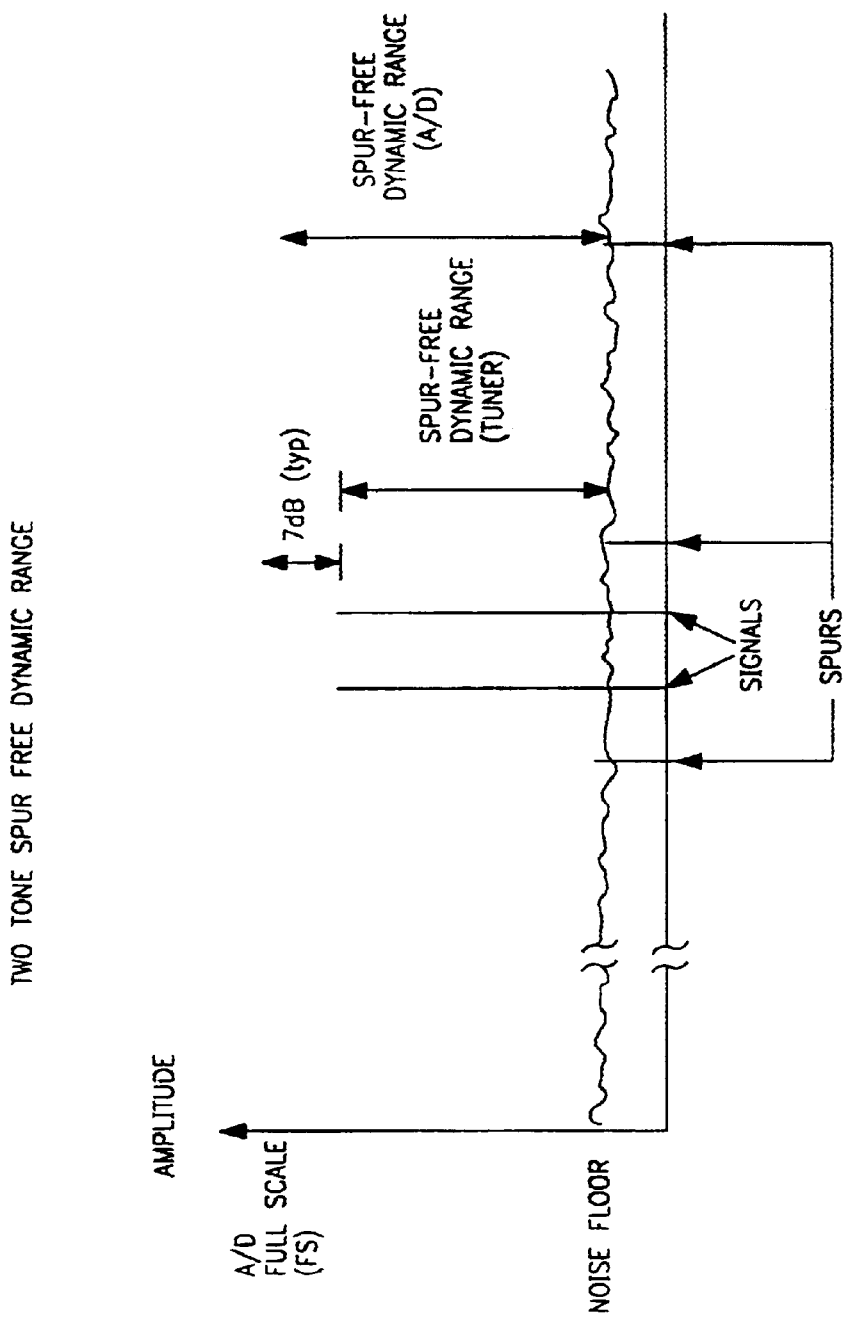
FIG. 13 is an illustration showing two tone spur-free dynamic range (SFDR) description.

Spur-Free Dynamic Range (SFDR) as dB from full scale to the spurious signal with two signals being 7 dB from full scale is described relative to FIG. 13. Note that this definition of SFDR differs from the classic analog form that we describe later.

The A/D-converter performance specifications control how much dynamic range a tuner requires in order to faithfully process large and small signals, while overcoming the A/D-converter noise floor with distortion less tuner gain. The A/D converter industry has made much progress in the past few years. Until recently, a state-of-the-art A/D converter for use with a tuner would have 12-bits resolution sampled at a 65-MHz clock rate, and 80-dB SFDR over a 25-MHz bandwidth.

Figure 14:
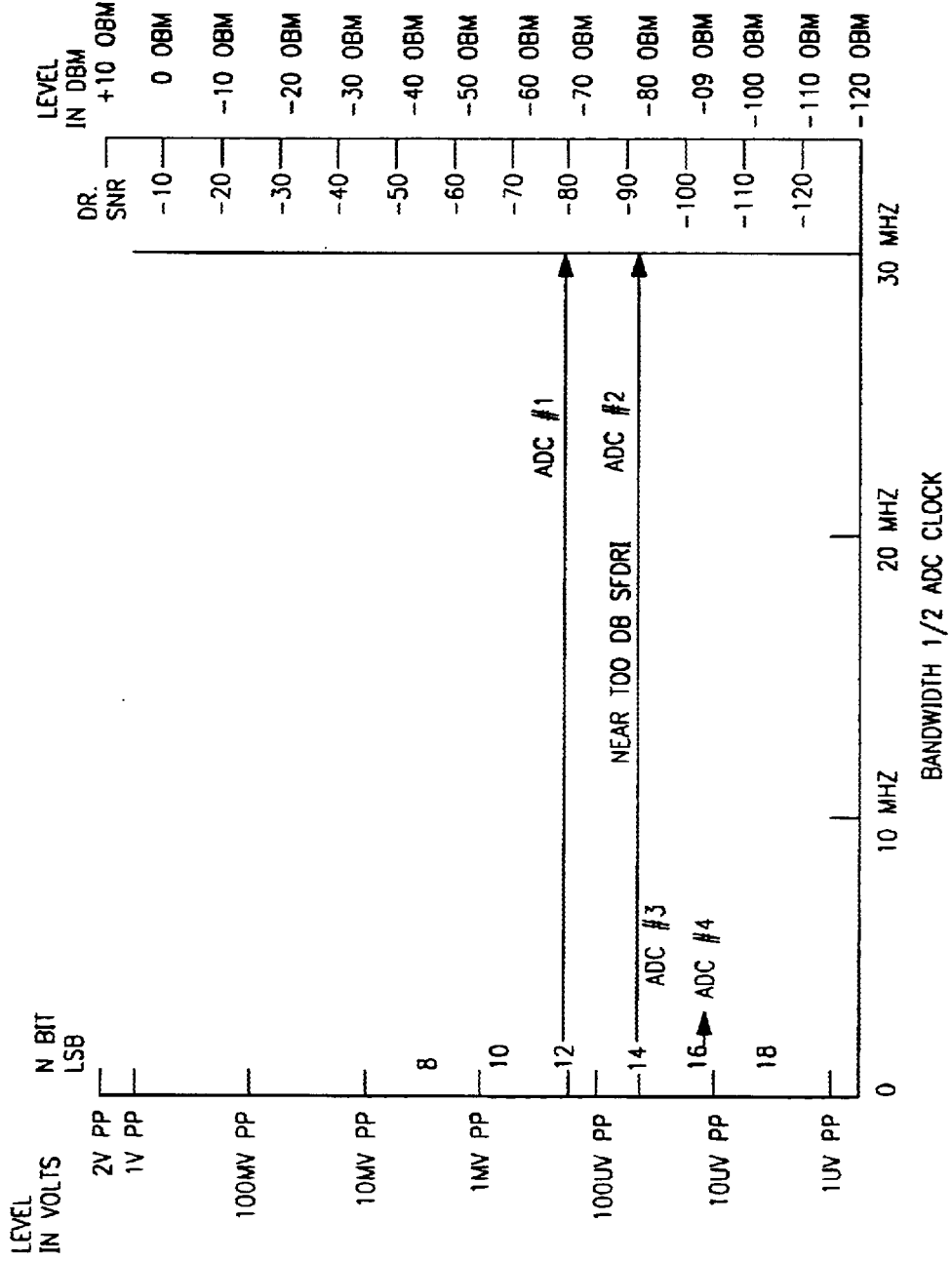
FIG. 14 is an illustration showing analog-to-digital (ADC) bit resolution versus dynamic range.

State-of-the-art A/D converters have at least 14-bits resolution (some are expected to provide 16-bit resolution) a near 100-dB SFDR, a Signal to Noise Ratio (SNR), and a full-scale signal level, and, when clocked at 65 MSPS, will support IF bandwidths out to 30 MHz (See FIG. 14). This is 20-dB higher dynamic range than A/D converters available in 1997.

Figures 15A, 15B:
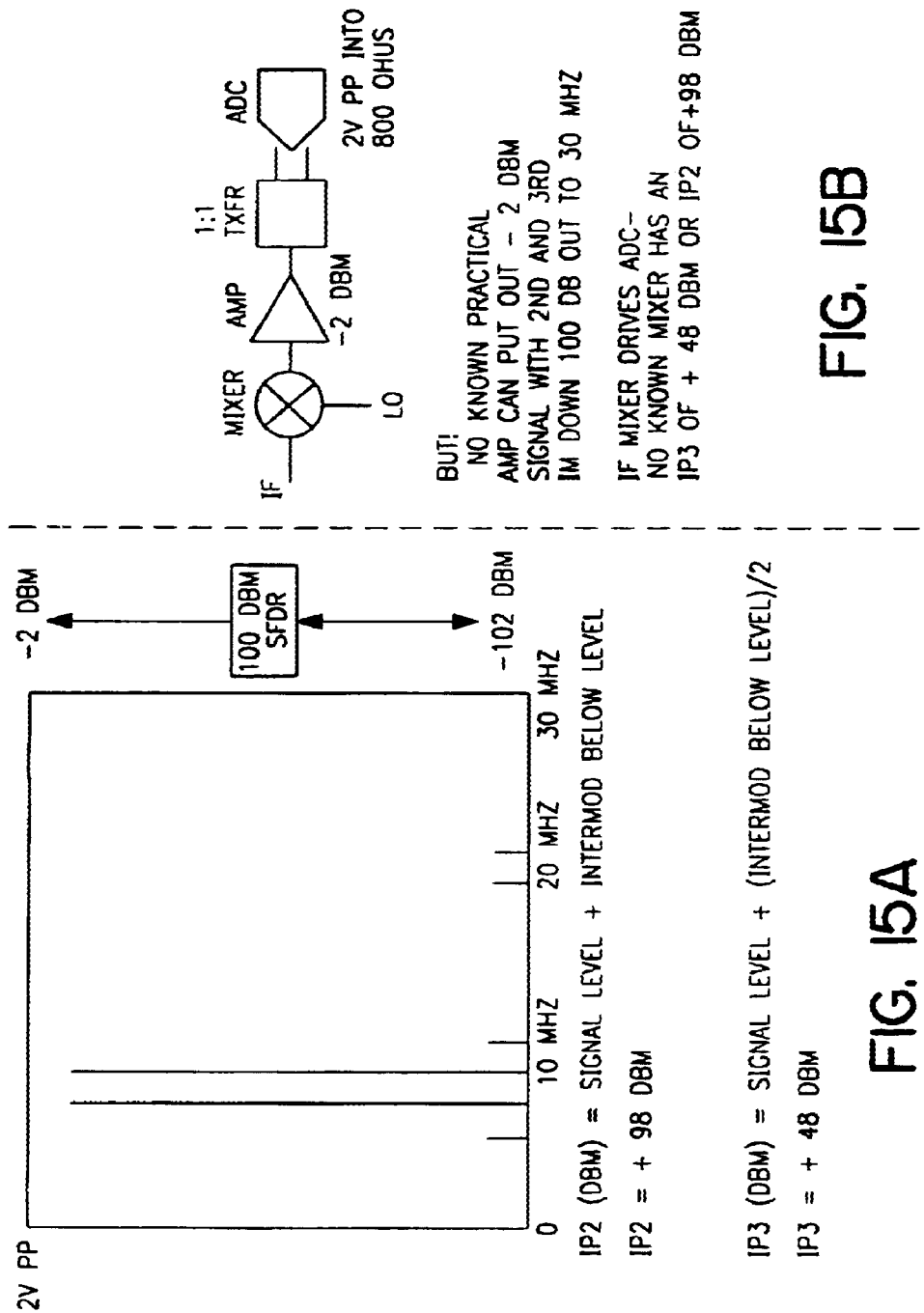
FIG. 15 is an illustration showing high ADC SFDR causing 100 dB problem for the final stage of a tuner.

We now address aspects of the inventive tuner structure and function. FIG. 15a is a graph illustrating a 100-dB SFDR signal spectrum into these 14-bit A/D converters. The tuner requires a capability to process two signals, without producing spurious signals over 100 dB from full scale. The final frequency converter processes the largest tuner signals and must supply the A/D converter with up to about 2-volts peak-to-peak (P-P) into 800 Ohms as illustrated relative to FIG. 15b. The signal transformed down to 50 Ohms should be about 2-dBm for full-scale drive. The IP2 and the IP3 calculation shows the final frequency converter needing an IP2 of about +98 dBm and IP3 of about +48 dBm. This calculation uses 6 dB as a safety factor to account for possible differences in A/D-converter SFDR and the analog drive requirement. No practical A/D-converter driver amplifier known to the inventors can process a signal at −2 dBm out to 30 MHz with the second and third harmonic i.e., N×N distortion (e.g. 2×2, 3×3, etc.) down 100 dB. Eliminating the A/D converter driver amplifier and driving the A/D converter directly from the mixer would require a +4 dBm input, an input IP3 of +54 dBm, and an IP2 of +104 dBm. The inventive mixer provides performance that meets or exceeds these specifications for this final frequency conversion stage.

The noise floor (expressed in −dBm)=6.02N+10 log (fs/2), where fs is the sampling frequency and N is the number of A/D bits. For a 14-bit A/D, and fs=30 MHz, the noise floor is about −160 dBm. An A/D converter for a tuner application may also have a high noise figure. The increased bits of resolution of the 14-bit A/D reduces the noise floor as compared to earlier 12-bit A/D converters. The noise figure (dB) is given by the expression:

$$\text{Noise Figure (dB)} = -174 - \text{SIG}_{fullscale} - \text{NOISE FLOOR},$$

where −174 is the nominal noise floor of a 50 ohm resistor in a 1 Hz bandwidth at room temperature, and $\text{SIG}_{fullscale}$ is the signal level at full scale. For the 14-bit A/D converter, this results in a Noise Figure of 25 dB. With respect to FIG. 16, and for this description, if the overall tuner requires a noise figure of 10 dB, then the overall tuner gain (tg) in front of the A/D converter must be approximately 16 dB with a very large signal-handling capability.

Tuner design is complex, with the competing demands of balancing noise figure and dynamic range requires both skill and a deep knowledge of preselectors, mixers, amplifiers and filter components. Too much gain, to get a better noise figure, hurts the intercept points; too little gain cannot overcome the high A/D-converter noise figure. These principles are understood by workers having ordinary skill in the art of mixer design. All stage component parameters in the tuner signal path contribute to this dilemma. One of a mixer designer's first tool for this balancing act is the Gain (G), Noise Figure (N), Intercept Point (IP) computer aided design (CAD) program—sometimes called a GNIP run or simulation, which programs are known in the art and not described further here.

Figure 17:
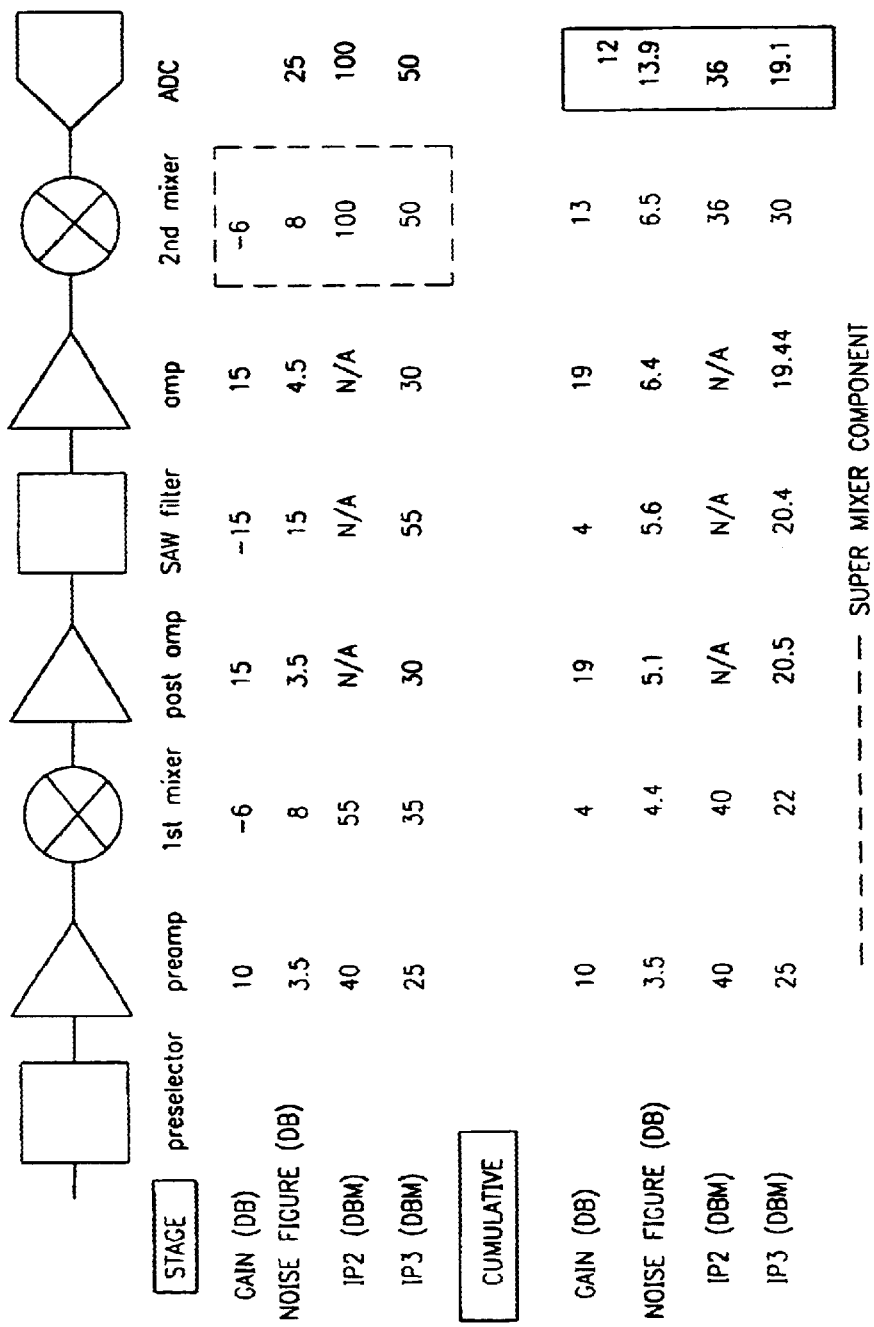
FIG. 17 is an illustration showing an exemplary first GNIP simulation run with the inventive super mixer as the first mixer but with dynamic range limited by the preamplifier and the first mixer.

FIG. 17 illustrates a GNIP run of a hypothetical tuner equipped with the best known conventional components presently available; and it includes an exemplary inventive super-mixer structure as the final conversion stage. Exemplary values for stage gain, stage noise figure, stage IP2 and IP3, as well as cumulative values for stage gain, stage noise figure, stage IP2 and IP3 are indicated for the GNIP simulated configuration. Note that the preamplifier and first mixer severely limit both IP2 and IP3 as recorded in the cumulative run. A sub-octave preselector can help reduce the IP2 requirement, but adds a costly component to the tuner.

Figure 18:
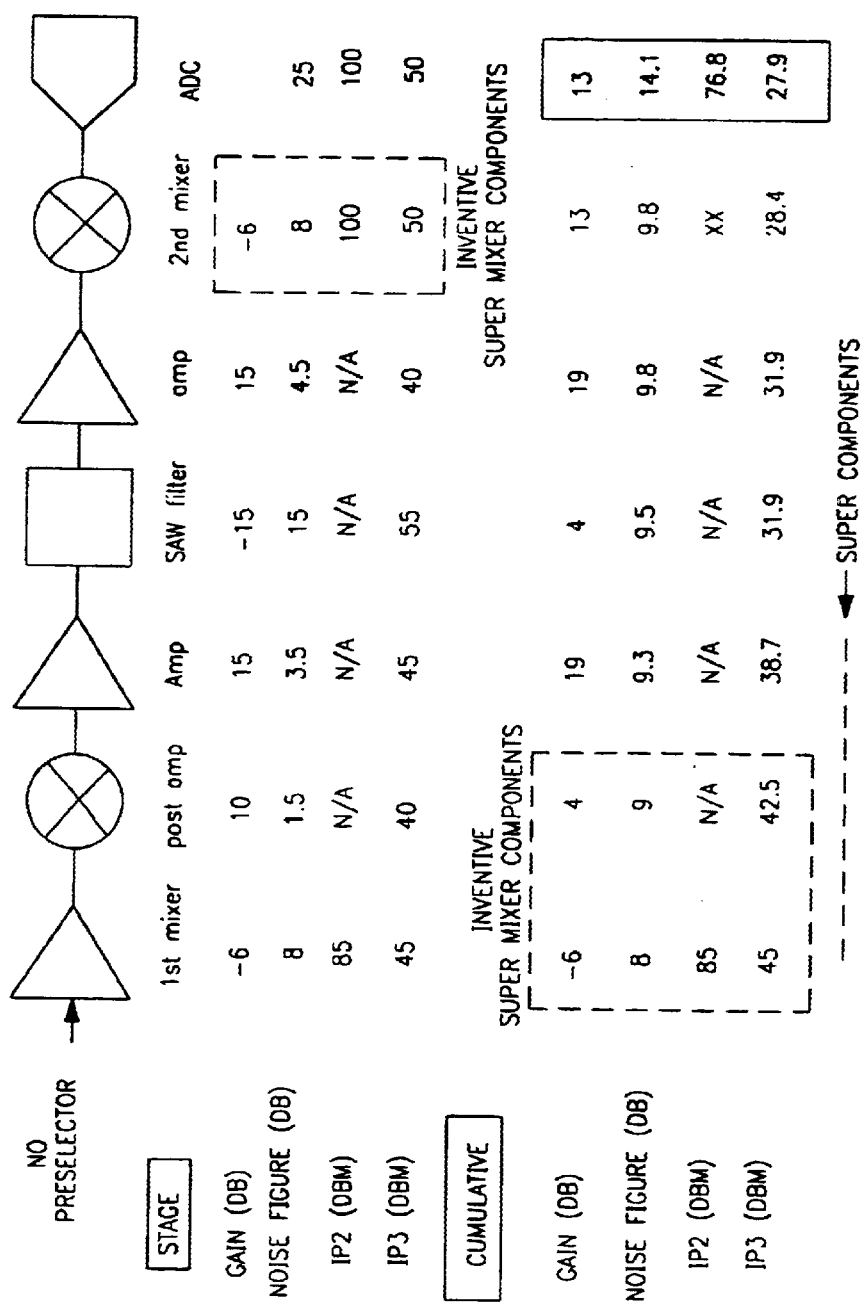
FIG. 18 is an illustration showing a second exemplary GNIP simulation run with the inventive super mixer as the first mixer but with the preamplifier moved to provide post mixer amplification resulting in improved dynamic range compared with configuration of first GNIP simulation.
Figure 19:
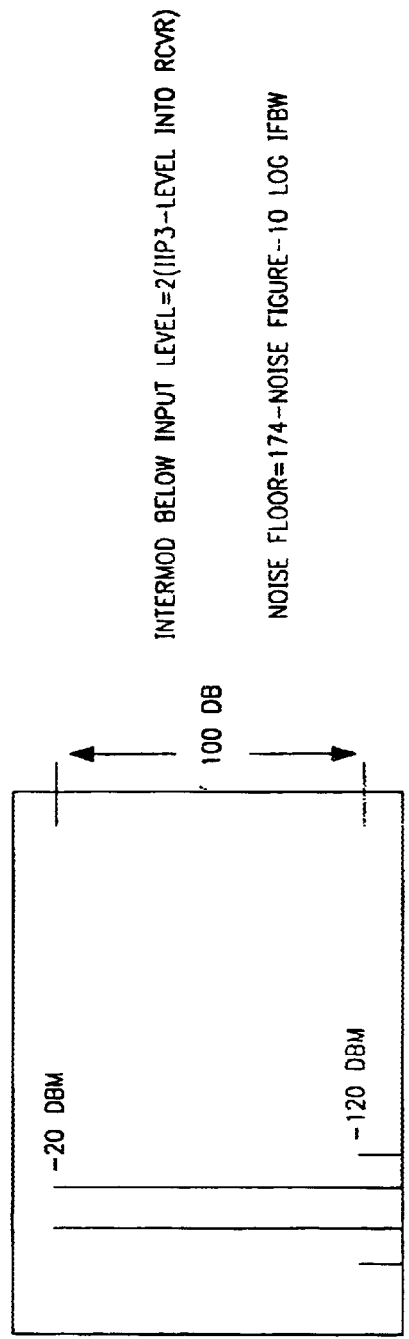
FIG. 19 is an illustration showing a summary of the improved dynamic range characteristics.

If the mixer and amplifier reverse positions, the IP2 and IP3 improve (lower mixer-signal level), but the noise figure increases. One can solve this by using a super up converter followed by a very low-noise amp with an extremely high IP3. One need not consider IP2 at this stage, because the amplifier processes the signal at the IF frequency. FIG. 18 shows the GNIP run performance with the new super components. The super mixer eliminates the costly preselector. FIG. 19 relates the 100-dB dynamic-range super-mixer performance to both real-world signal conditions and the classic analog dynamic-range formula.

Figure 21:
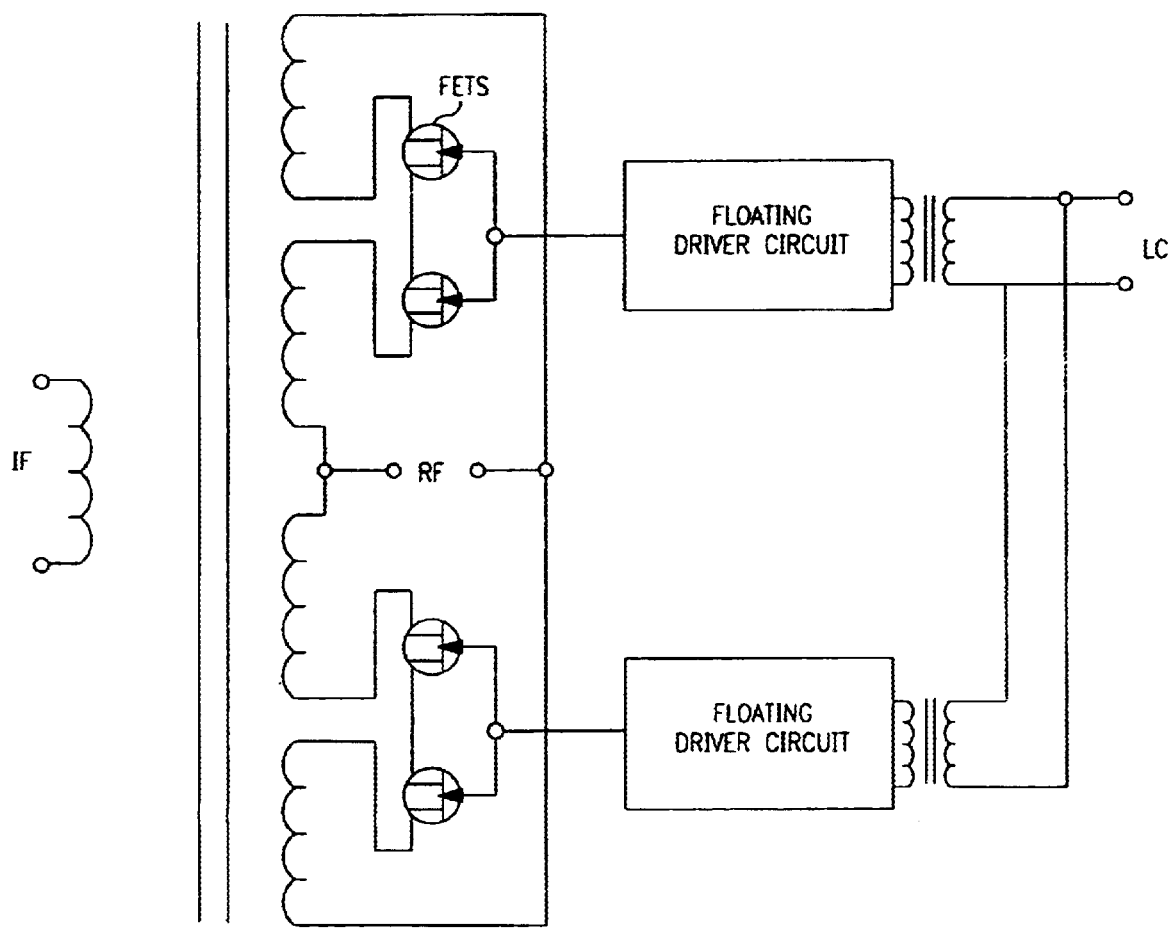
FIG. 21 is an illustration showing an exemplary super-mixer functional block diagram.

FIG. 20 provides some specifications for these mixer components. Ideal mixers require perfect or nearly perfect switching functions with no or substantially no non-linearities. FIG. 21 is a high level block diagram of one embodiment of the mixer showing the IF, RF and LO circuits, switching circuits (FETs) floating driver circuits, and the connections therebetween, which may be used either for frequency up or down converting. FETs are advantageously selected and matched or fabricated to a high level of exactness and precision. The LO circuits that produce nearly perfectly symmetrical switch signals only need an external drive level of about 100 millivolts. The LO drive circuitry and FET switches are embedded on the tuner printed-circuit board and need not be confined in a metal can. This allows considerable design freedom with circuit-component values adjusted for proper balance and drive level.

Figure 22:
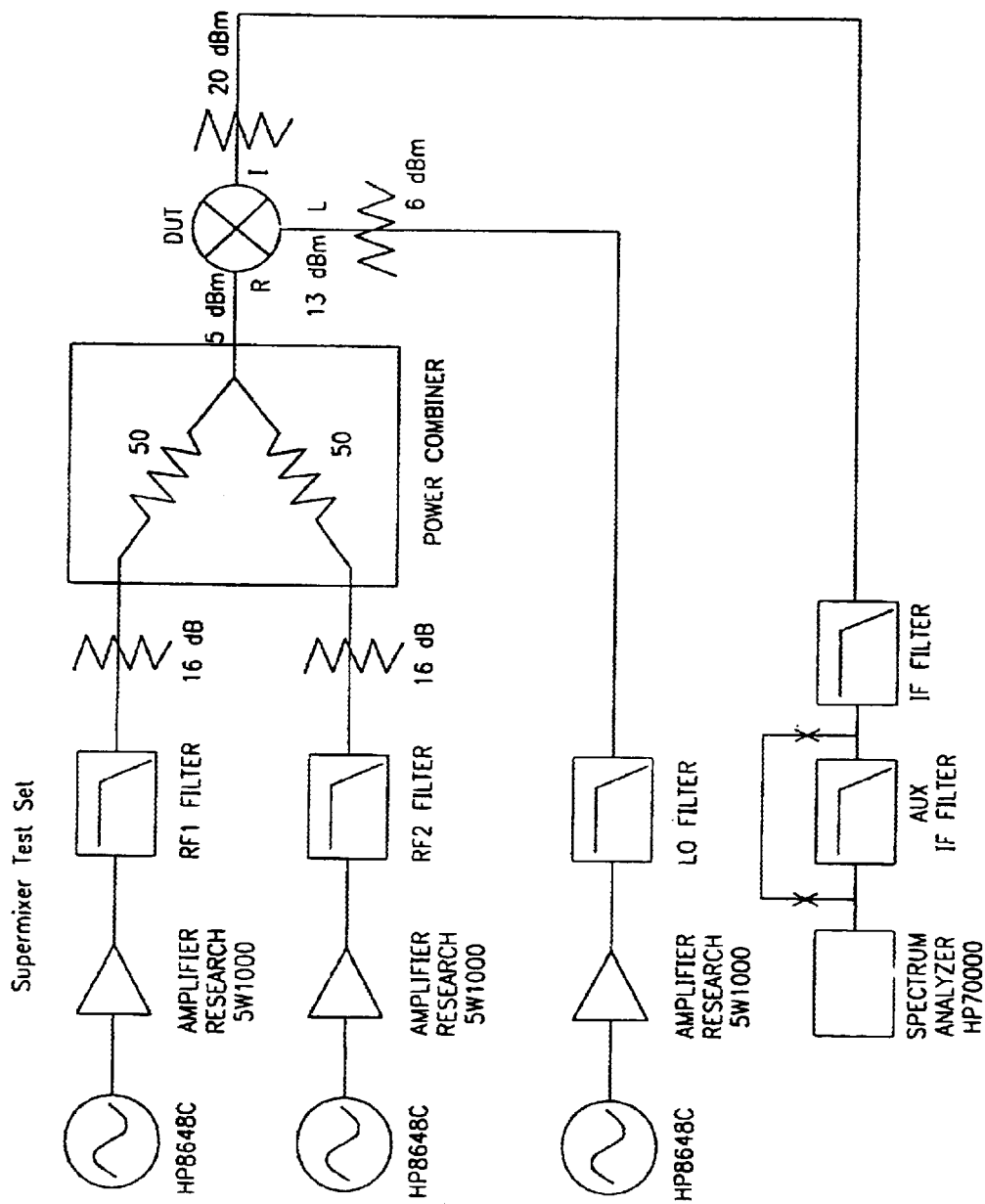
FIG. 22 is an illustration showing an inventive mixer test configuration.

One of the most difficult tasks for assessing the inventive structure involves measuring distortion parameters for the inventive mixer and tuner. Only high-level signals with the purest spectral content could be used. Conventional signal generators capable of providing the two-tone test may not be generally available, nor may spectrum analyzers that would not intermodulate and produce a signal in the wanted-signal output-test spectrum. An exemplary test configuration for measuring distortion parameters is shown in FIG. 22. Note the power amplifiers used to boost the signals and the low-pass filters to clean up the harmonics. The mixer was terminated into 1:1 VSWR load for the tests. The converted signal was then notched or low-pass filtered in order to measure only the super-mixer distortion products.

Figure 23:
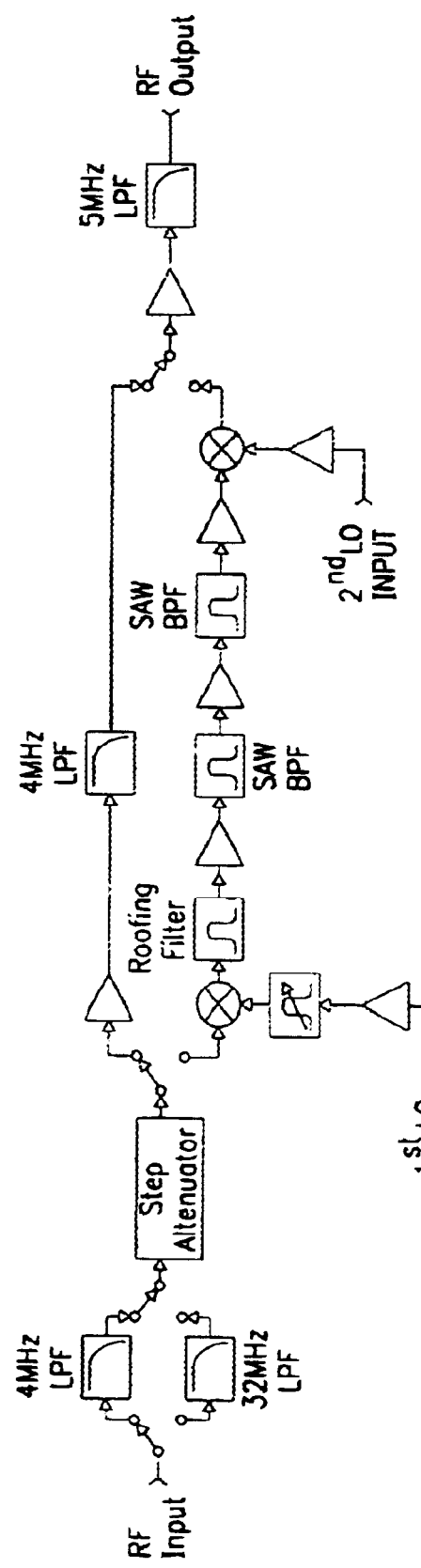
FIG. 23 is an illustration showing a particular embodiment of the inventive structure.

One embodiment of the inventive mixer is incorporated into a Dual Tuner Module (DTM) intended for HF applications requiring maximum dynamic range in minimum space. The particular tuner embodiment specifically interfaces with the Hewlett-Packard E1430A A/D Converter for both single and multichannel applications. It covers the 0.1 to 32 MHz frequency range providing over 95-dB instantaneous SFDR in a 4-MHz bandwidth (and 8 MHz option may also be implemented). The tuner uses state-of-the-art architecture and component technology and achieves an out-of-band IP3 of from +40 dBm to more than +45 dBm and out-of-band IP2 of from +80 dBm to more than +90 dBm, and an overall dynamic range of from 95 dB to more than 100 dB. Direct and frequency converted paths as illustrated in FIG. 23, ensure maximum performance for any frequency. The tuner switches the upper frequency band (here, about 4 to 32 MHz) to a signal path that amplifies and up converts it to a 70-MHz first IF. The tuner then amplifies, filters, and down converts the signal to near baseband. SAW bandpass filters obtain sharp shape factors and provide constant group-delay characteristics.

The low-band (about 1–4 MHz) and high-band (about 4–32 MHz) frequency paths again come together for final amplification, impedance transformation and filtering. It is advantageous that these baseband amplifiers exhibit extremely low spurious output because the super-mixer does not drive an A/D converter directly. An optional internal noise source at the front end of the RF tuner advantageously provides built-in-test operations. The inventive embodiment gives special attention to optimizing conversion performance by using the inventive mixer since spurious outputs of the down-conversion mixer and amplifier, as previously explained, are critical and can limit the SFDR performance of the tuner. The N×N (2×2, 3×3, etc., etc.) products are key, since they fall within the IF passband. For this particular embodiment, this performance is achieved in a small physical package with two HF tuners housed in a single-width C-size VXI module.

With respect to the afore described Automatic Link Establishment (ALE) or Adaptive HF technology, the inventive system provides the required SFDR performance (e.g. 100 dB of Spur Free Dynamic Range) with a 14-bit or higher-bit ADC (that is from about 6 dB to about 9 dB of dynamic range per ADC bit) and the capability of providing this digitization over a 30 Mhz frequency spectrum. The system circuit topology as well as the circuit implementation of the FET super-mixer also provides this level at a modest cost as compared with the cost for conventional approaches even if they could someday achieve the required performance.

Figure 24:
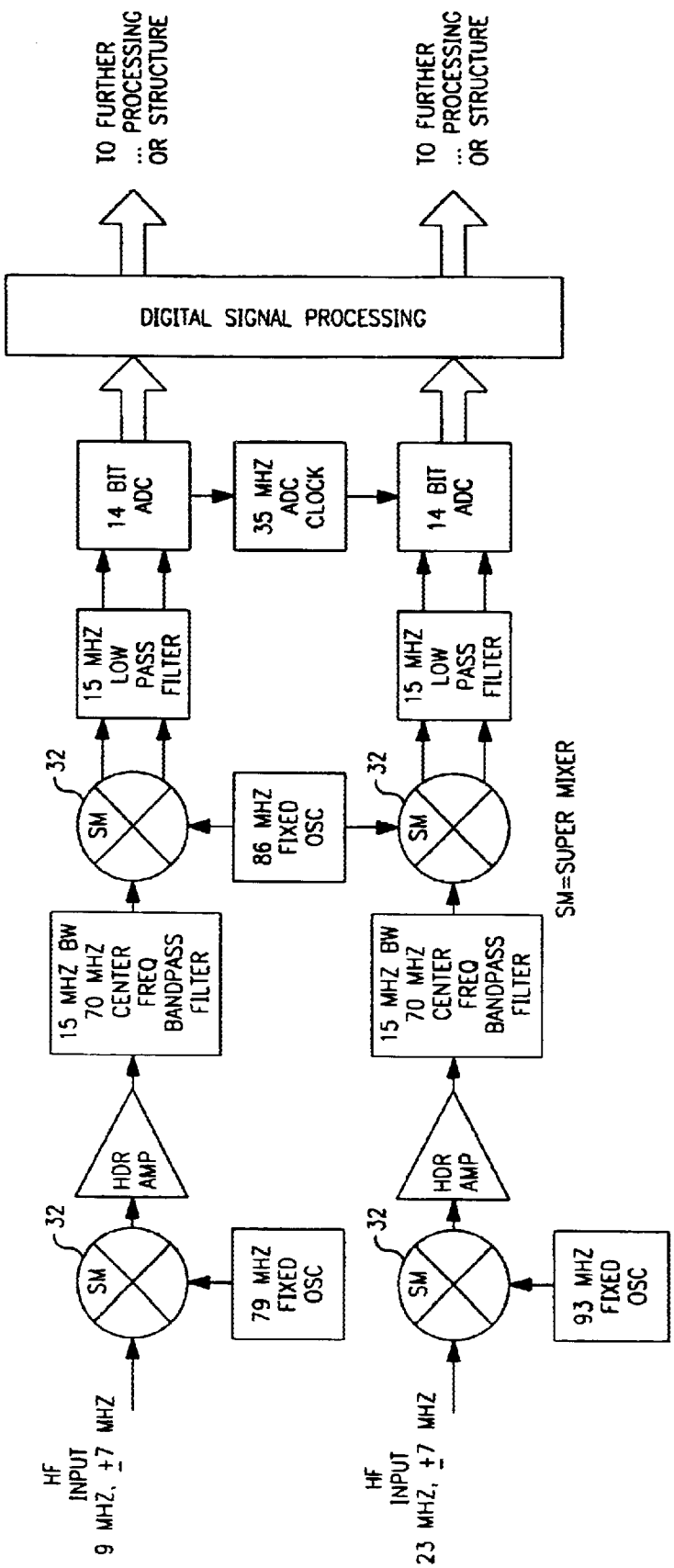
FIG. 24 is an illustration showing an exemplary alternative HF collection system using two-tuners to divide the HF spectrum into two parts, each tuner employing two of the inventive signal mixing devices.

One HF collection topology for the ALE which collects all of the HF signal spectrum in one band using two tuners (each including the inventive super mixer 32) is illustrated in FIG. 24. Two tuner sections are used to cut the HF bandwidth (here, 2 Mhz to 30 Mhz) in half (e.g. 9 Mhz±7 Mhz, and 23 Mhz±7 Mhz) and two leading edge ADCs are used to cover the HF band in two parts. Four of the inventive super-mixer 32 are used in this topology, along with suitable amplification and filters as shown. The ADCs are 14 bit to preserve the sensitivity and resolution to required levels. These tuners must have a high dynamic range, and although such tuners are available (such as from Watkins-Johnson Company) of Palo Alto, Calif., the present cost of such very-high performance high-dynamic range tuners satisfying the specifications for ALE monitoring sites would be higher than that of other alternatives using a single tuner for the entire HF band as described elsewhere in this specification.

A single heterodyne HF band tuner using super-mixer as the first frequency converter, a 70 Mhz IF bandpass filter and a direct conversion I/Q down converter provides as good or better performance. Each of the ADC's coupled to the I and Q channels need only 15 Mhz of bandwidth instead of 30 Mhz, and the DSP circuitry receiving the ADC digitized output can run at a slower clock speed. The direct I/Q conversion topology described herein provides a basis for this operation in that the I and Q signals are amplitude and phase matched within a very small percentage over a wide frequency range, LO quadrature may be maintained by providing LO feedback circuits, and the RF signal is provided in-phase to the mixers.

The applicability of the direct conversion/ADC approach for down-conversion and for up-conversion when combined into a single receiver/transmitter system provides total "software radio" communications capability, where the receive and transmit components operate under total computer or processor software (including hardwired, firmware, or hybrid software/firmware/hardware) control.

Figure 25:
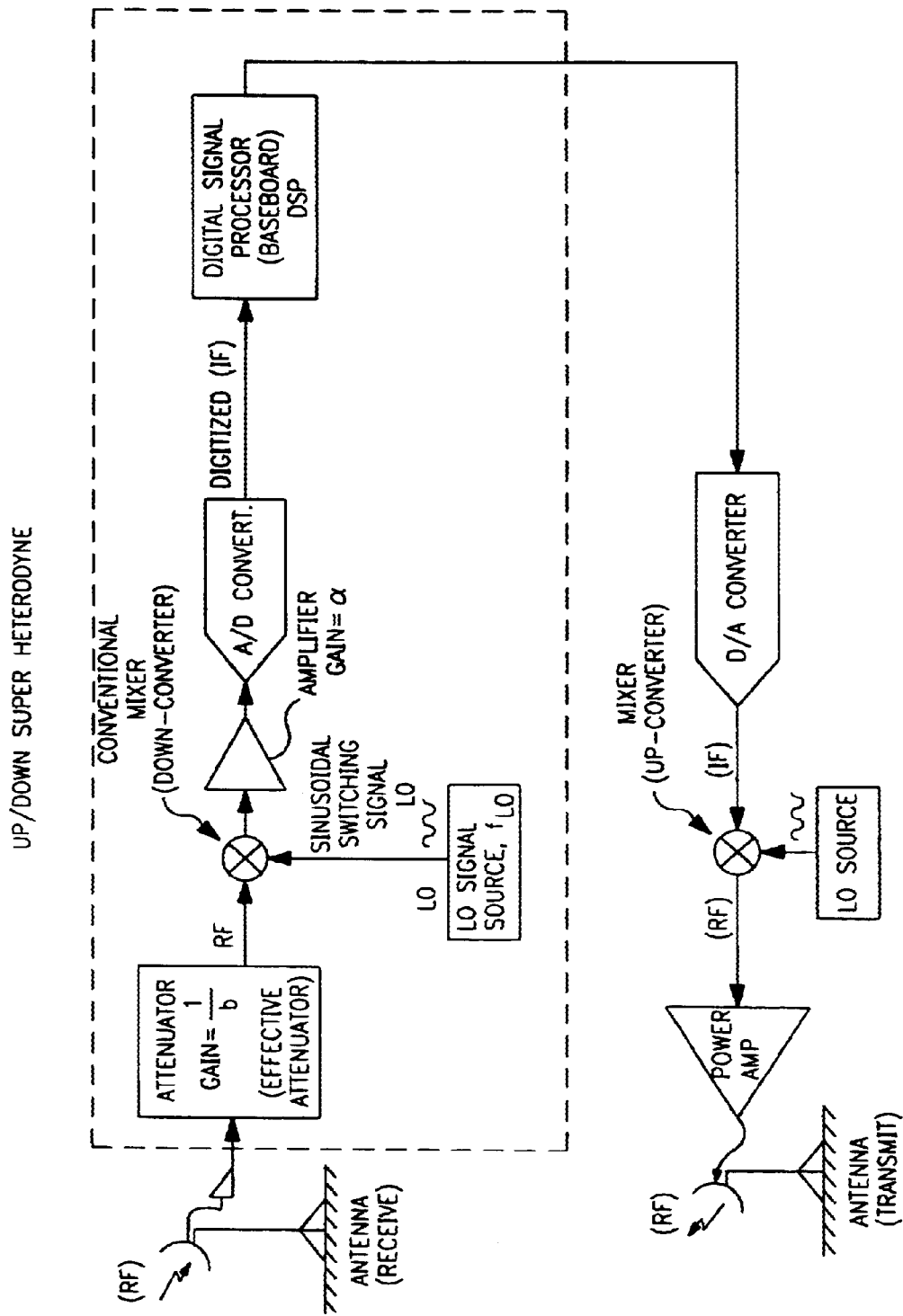
FIG. 25 is an illustration showing elements of up- and down-conversion in a conventional final conversion mixer system in a heterodyne radio.
Figure 26:
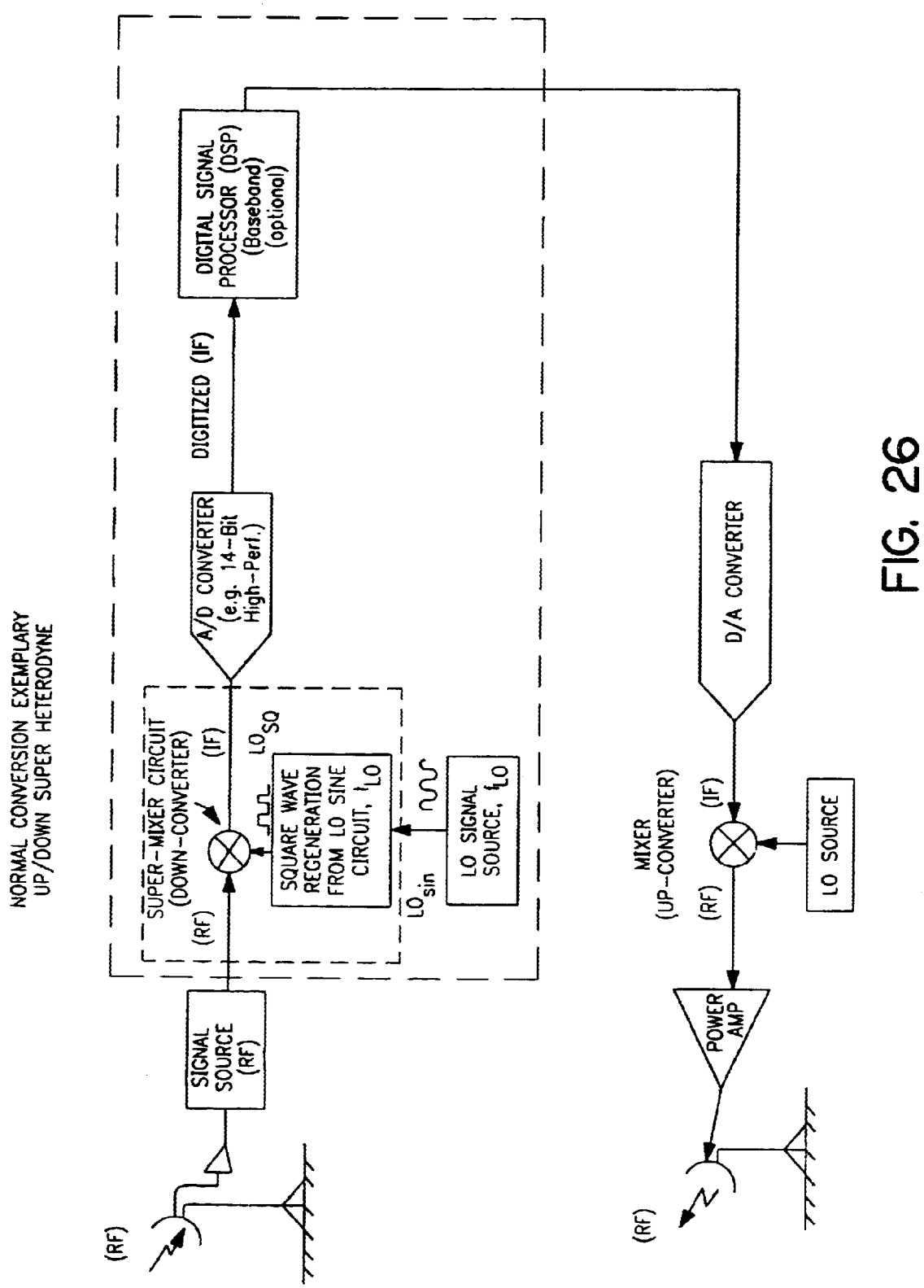
FIG. 26 is an illustration showing an embodiment of the inventive final conversion mixer system in a heterodyne radio.

The inventive structure is now described relative to a conventional heterodyne receiver 21 illustrated in FIG. 25 and an embodiment of the inventive heterodyne receiver in FIG. 26. It should be understood that in some implementations the conversion from a first frequency (e.g. RF) to a second frequency (e.g. IF or Baseband) may be accomplished with a single mixer or mixing stage, or that such overall conversion may be accomplished by a plurality of stages, and that when such plurality of mixers are implemented, benefits and advantages of the invention may be realized by incorporating the inventive super-mixer circuit into only one stage, or into more than one stage, and that the invention is not limited to systems or devices where all of the mixing structures are the inventive super-mixer structure.

The inventive mixer achieves over +50 dBm IP3 and over +100 dBm IP2 as a baseband converter that can directly drive 14-bit analog-to-digital Converters (ADCs). This combination of mixer and ADC places all spurious responses close to 100 dB from full scale over a 30 MHz bandwidth. This super mixer is a near perfect analog converter with insertion loss approaching theoretical. It is based on a grown GaAs FET switch with excellent switch properties. The LO signal (switch control) has a square-wave generation circuit designed with very accurate switch waveform for symmetrical complimentary switching the RF signal. While conventional mixers must be limited to a low level input signal (effective attenuation relative to the inventive super mixer) in order to minimize spurious signals to an acceptable level, and then require post-mixer amplification to achieve ADC full scale, the inventive super-mixer's IF port (baseband) can be made to drive an ADC full scale directly without the limitations of a high powered amplifier. These post mixer amplifiers, even the best, typically create second and third order harmonics that exceed ADC input specification limits. The inventive mixer is capable of down-conversion and up-conversion.

In FIG. 25, there is shown a conventional overall heterodyne receiver system topology 21 including an IF signal source 22, IF signal attenuator 23 (shown here to emphasize the higher input level of the inventive mixer 31 even though an attenuator 23 may not actually be provided), a conventional mixer device 24 which receives the IF signal having amplitude A, from attenuator 23, and a sinusoidal local oscillator (LO) drive signal provided from an external LO signal source 25, and output power amplifier 26. By comparison and as illustrated in FIG. 26, the inventive radio receiver 31 topology which includes the inventive mixer device 32, efficiently eliminates the attenuator 23 (by virtue of its lower drive requirement) and output amplifier 26 (by virtue of its higher output level). Typically the IF signal to the inventive direct drive receiver mixing device, may be on the order of 10 times greater than that provided to conventional mixer so that attenuator gain is 20 log 1/b=20 dB.

The conventional receiver 21 requires a lower input IF signal level (attenuator 23) so that spurious signals are minimized or controlled to acceptable levels and requires an output amplifier 26 to subsequently achieve full ADC scale. Even the best amplifiers known to the inventors at the time of the invention create second and third order harmonics that exceed ADC specification limits for spurious free dynamic range. On the other hand, the inventive mixer topology 31 including the inventive mixer device 32 allows a higher IF (or RF when used to down current signals) signal level input, provides lower loss internally, has lower spurious signal generation levels that are well within the ADC limits, and does not require an output amplifier 26 to provide the required output level (up to about 2 Volts peak-to-peak signal level or 0.1 watts of power).

In the conventional mixer system 21, the output of amplifier 26 would be fed to ADC 27 at about a 2 volt peak-to-peak signal level. A signal notch filter 28 may be provided to remove the wanted converted signal in order to measure the performance on a spectrum analyzer during calibration and performance testing since the otherwise the spurs may be so small as to be undetectable with generally available laboratory instrumentation, but no such notch filter would be used in an actual system since the objective is to pass the converted signal not suppress it. For the inventive mixer system 31, the performance would be a mixer device 32 output signal level of 0.5 volt peak-to-peak.

The inventive mixer device 32 provides structure and method for a mixer system with about +50 dBm IP3 and about +100, dBm IP2, and provides a baseband converter that is capable of directly driving 14-bit ADCs with 65 MSPS conversion rates. In one embodiment, this combination of mixer and ADC places spurious responses close to 100 dB from fill scale over a 30 MHz bandwidth. The inventive mixer is a near perfect converter with insertion loss approaching theoretical limits of about 5.5 dB. The mixing device 32 may advantageously incorporate a GaAs FET switch with near ideal switch properties. The switch control circuit (LO drive circuit) provides an ideal or near ideal switch waveform for symmetrical complimentary switching the RF signal. The mixer's IF port (baseband) can drive an ADC fill scale directly without the limitations of a high powered amplifier.

The invention could also provide a homodyne mixer using two super mixer circuits. (An exemplary homodyne structure is described relative to FIG. 27.) In one embodiment, the inventive LO drive circuit switches two sets of FETs, advantageously implemented as GaAs FETs, in perfect quadrature thereby insuring near perfect in-phase and quadrature phase baseband signals. The two mixers have high intercept points (IP2 and IP3) to reduce spurious signals below all other conversion errors in the mixer, even including phase and amplitude conversion errors. The mixer circuits desirably have matched baluns and phase and amplitude errors are reduced in the in-phase (I) and quadrature-phase (Q) output signals. The direct drive to the ADC also preserves the I/Q signal linearity by eliminating the final amplifier used in conventional systems that typically may introduce non-linearities. The I/Q signals are only one-half (½) the bandwidth of the RF signal, and therefore, the two ADC's need sample clocks (fs) running at one-half frequency.

The inventive homodyne mixer has significant advantages and applications over the conventional heterodyne structure and method including: providing structure and method for a HF/VHF/UHF wide band down converter, providing better multichannel beam forming with improved phase and amplitude match, reducing a radio's complexity by one IF stage without a reduction in dynamic range, elimination of Surface Acoustic Wave (SAW) filters and their insertion loss and cost, use of a fixed LO signal frequency over the entire cellular band (about 800 Mhz to about 1 GHz) to provide improved phase noise characteristics, and to provide an inexpensive two-device radio using the mixer and ADC/DSP integrated circuit.

The inventive mixer circuits 32 utilize a switch, desirably implemented with a GaAs FET transistor, which is characterized by nearly ideal mixer switching properties and a switch control (Local Oscillator driver) circuit designed and implemented with a nearly ideal switching waveform, capable of converting the Radio-Frequency (RF) signal at such high levels and low loss that the IF output can directly drive the afore described state-of-the-art ADCs without limiting SFDR.

The inventive homodyne receiver 31 may also desirably utilize "embedded technology" a technique that provides a radio tuner having the mixer and any balun circuits right into the pads of the printed circuit board, thereby eliminating a separate and costly packaging stage and allowing the circuit to be optimized for near perfect LO duty cycle, symmetry, and balance.

The direct drive conversion receiver advantageously provides better RF tuner dynamic range than would be provided by existing state-of-the-art ADCs or by predicted state-of-the-art ADCs for the foreseeable future, has lower conversion stage costs as the result of embedded technology, provides a basis for a Super Homodyne (as compared to heterodyne) receiver in that the IF stages are eliminated, boosts performance of both receiver and transmitter dynamic range for base stations as a result of lower spurious conversion, implements the receiver in hard to copy embedded circuits.

Other enhancements may also be provided to optimize receiver and mixer performance in order realize even higher dynamic range. For example, it may be desirable to: (i) optimize amplitude and phase match over a wide band by monitoring duty cycle symmetry, (ii) to provide feedback from the FET source to the digital gates to provide optimal LO quadrature, (iii) to provide in-phase RF signal to the mixer and IF output balance to the ADC, and/or (iv) to add some correction algorithms to the DSP in order to compensate for phase and amplitude and correcting any in-phase and quadrature signal errors.

The homodyne receiver provides structure and method for implementing an inexpensive approach for digitizing the radio-frequency spectrum with the resolution and dynamic range required for advanced communication, detection, and surveillance systems. The inventive structure and method provide for both up- and down-frequency conversion so that, in general, references to RF signals as input and IF signals as output in the specification may be reversed. An IF signal may be provided as the input and the RF signal may be generated or extracted on the output, and more generally signals may be referred to as the input and output and the ports which receive or output the signals referred to as first or primary port and second or secondary port.

Figure 27:
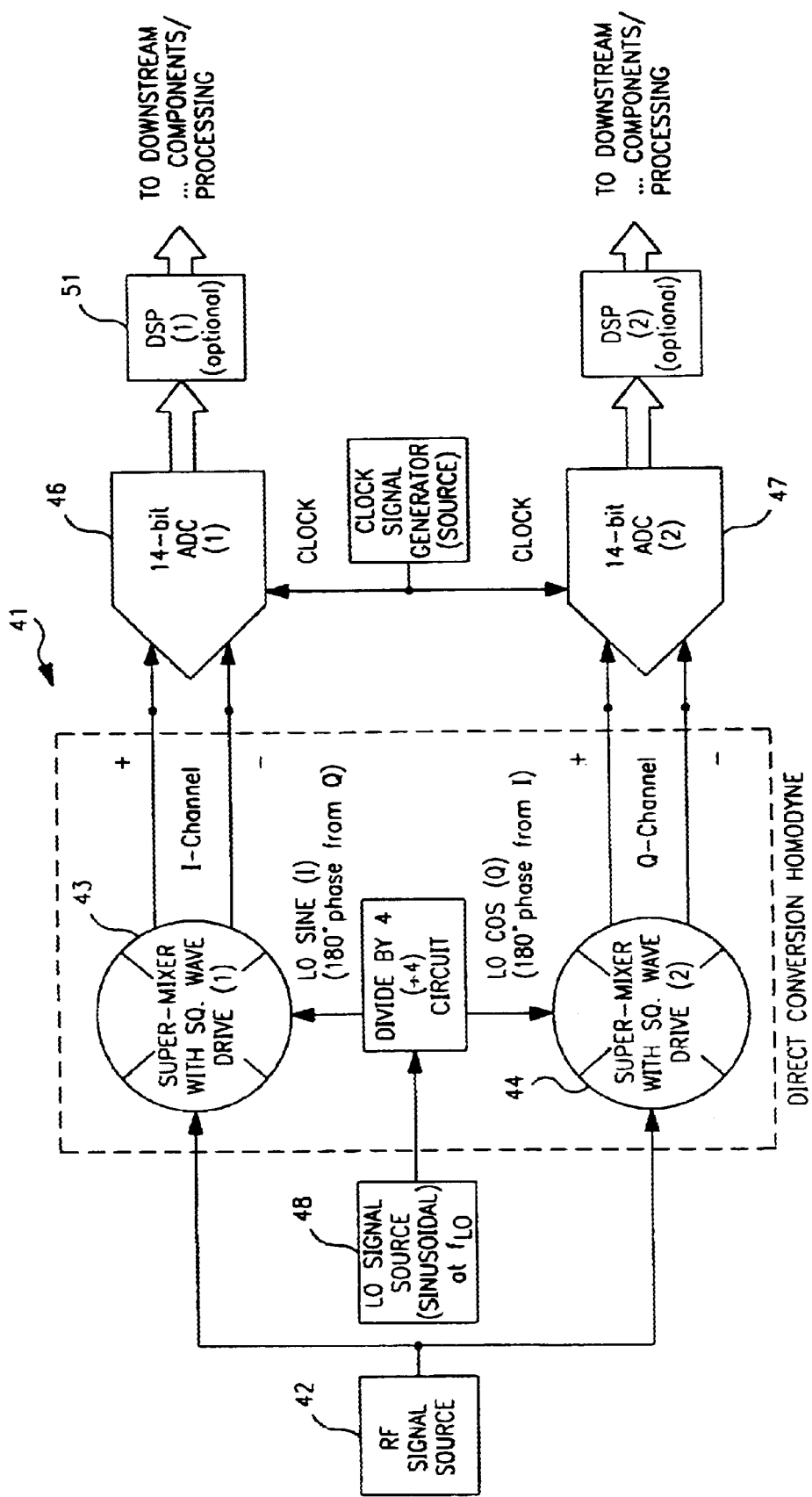
FIG. 27 is an illustration of showing an exemplary direct conversion ADC structure, including dual super-mixer circuit structures combined to provide a homodyne receiver configuration.

An exemplary direct conversion circuit topology 41 using two of the inventive super-mixers is illustrated for down-conversion is illustrated in FIG. 27 which shows RF and LO derived sine and cosine signal components generated by a divide-by-four circuit 45 from RF signal source 42 as inputs to first 43 and second 44 super mixer devices. The sinusoidal LO input signal derived FET switching signals are coupled to two sets of FETs, advantageously GaAs FETs, to switch the sets of FETs in near perfect quadrature, thereby insuring perfect or substantially perfect sine and cosine (I and Q) baseband signals. The direct drive to the ADC also preserves the I/Q linearity by eliminating any need for a final amplifier as typically provided in conventional systems.

In this inventive topology 41, two super-mixers are provided for directly converting the signal, where the same frequency LO derived signal driving the two super mixers in quadrature. The in-phase (I) and quadrature (Q) channel outputs from these mixer devices 44, 45 are fed to first 46 and second 44 analog-to-digital converters (here shown as 14-bit ADCs), each of which ADC also receives a clock input to clock the ADCs from system clock 49. Of course, this same topology may be used with ADC's having fewer bits (for example, 8-, -10, or 12-bits), or with a greater number of ADC bits (for example 16-, 18-, 20-, 24- or more bits when available), with overall performance (lower for fewer bits, and potentially higher for greater bits) commensurate with the resolution and sensitivity of the ADC. The output of each of the two ADCs 46, 47 are digitized versions or representations of the in-phase and quadrature-phase signals which are then fed to the DSP circuits 51, 52 for use in DSP demodulation. A comparable implementation to that illustrated and described relative to FIG. 27 will work for up-conversion where the IF signal is input to mixer devices 43, 44 and the RF signal is output to DSP circuits 51, 52. The inventive mixer may be used for both up- and down-conversion in the same system, thereby providing structure and method for a software radio having both transmit and receive (transceiver) capabilities.

The inventive topology has several advantages over conventional heterodyne converter, including elimination of a conversion stage, elimination of the final amplifier to the ADC, requires only one-half the ADC needed bandwidth by digitizing analog I and Q signals, providing about 40 dB more dynamic range than conventional converters.

The inventive structure and method achieves at least about +50 dBm IP3 and +100 dBm IP2 as a baseband converter that will directly drive state-of-the-art 14-bit ADCs for example, the Analog Devices AD6644 made by Analog Devices, Inc. with 65 MSPS conversion rates as well as the narrower bandwidth 16-bit ADCs. In one embodiment of the inventive receiver 31, the combination of the inventive mixer 32 and high-performance ADC 46 places all spurious responses at 100 dB or below full scale over a 30 MHz or greater bandwidth. In another embodiment of the inventive mixer optimized for first stage mixer performance, the mixer 32 provides a near perfect first stage converter having high dynamic range and insertion loss approaching theoretical insertion loss limits.

Figure 28:
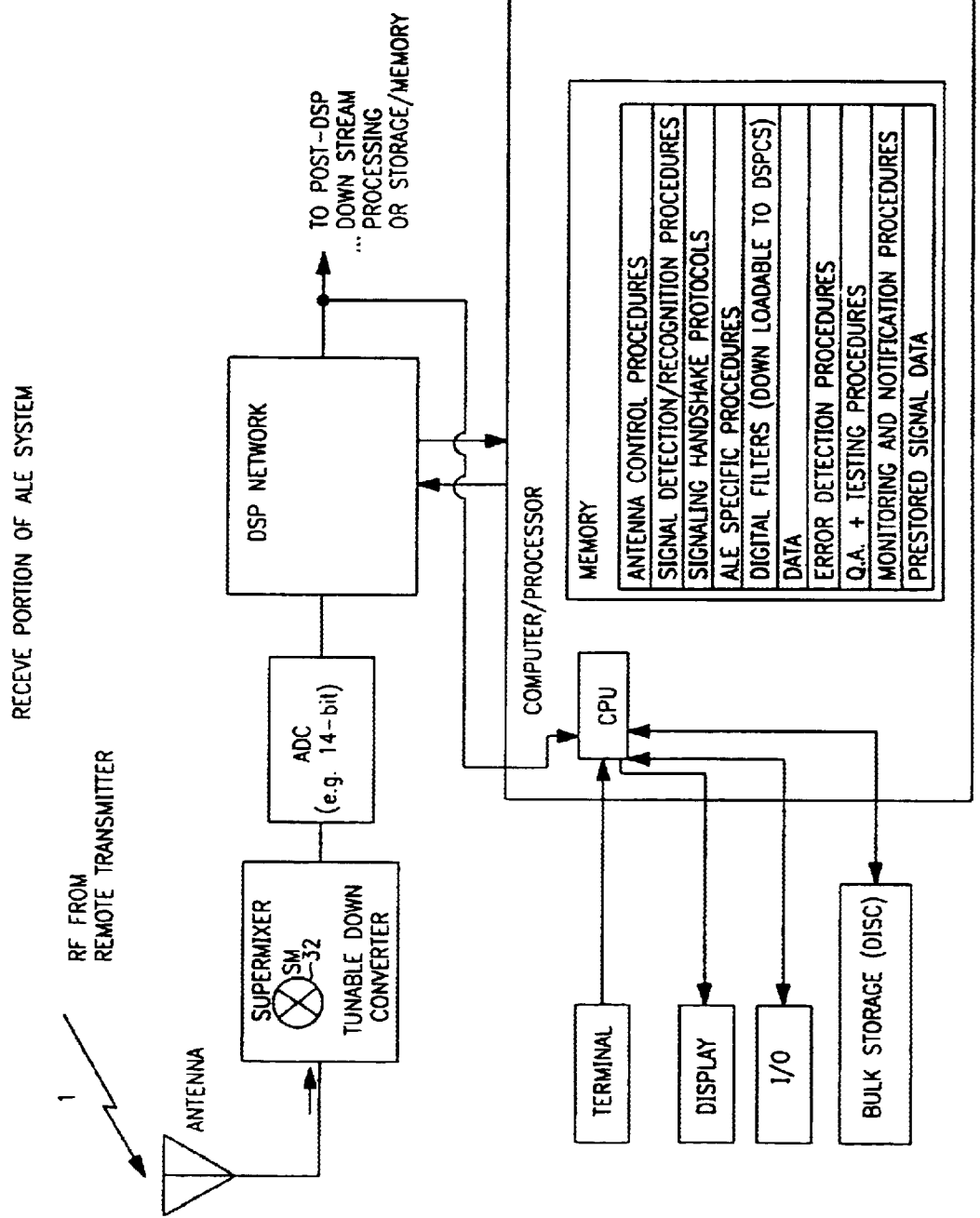
FIG. 28 is an illustration of showing an exemplary embodiment of an Automatic Link Establishment system incorporating the inventive radio topology and super-mixer.

In FIG. 28 there is shown an illustration of functional block diagram of an exemplary embodiment of an Automatic Link Establishment system incorporating the inventive radio topology and super-mixer. The system includes an antenna for receiving a RF signal from a remote site, a tunable down converter including one of the inventive super-mixer devices for generating a tuner output signal. This output signal is then digitized by the ADC as already described and then passed to a DSP for further processing. A computer having a processor (CPU) memory connected to the processor for storing data and procedures, and further including a terminal device, display, bulk storage, and one or more input/output devices as is commonly known in the art. The memory is partitioned and defines a data structure of the procedures and data stored therein. Workers having ordinary skill in the art will appreciate that a transmit configuration for the ALE may be provided in analogous manner and is not described further here.

Additional Embodiments Incorporating Duty-Cycle and Symmetry Feedback Control

Several embodiment of the super-mixer 32 have been described including embodiments for frequency up-conversion and for frequency down-conversion. When used for converting an RF signal spectrum to an IF spectrum signal, the super mixer performs the RF-to-IF signal spectrum conversion by turning the RF signal ON and OFF at the rate or frequency of the LO signal. This creates two IF signal frequencies equal to RF−LO (down conversion) and a RF+LO (up conversion). The efficiency of conversion (also referred to as the insertion loss) typically depends on the FET switching losses and the so called push-pull balance of the reflection transformer, for example, reflection transformer T4 684 of the embodiment in FIG. 4 or reflection transformer 210 of the FIG. 2 embodiment.

For best performance, this conversion from RF to IF should desirably be exact (or nearly exact) over a large range of RF signal amplitudes and produce a minimum of extraneous signals. Dynamic range of any mixer is the usual measure of this faithful reproduction of the RF spectrum to the IF spectrum. The primary measuring tools are second- and third-order intercept points. The inventive super mixer 32 achieves very high second- and third-order intercept points because of its excellent balance and switching characteristics.

Figure 29:
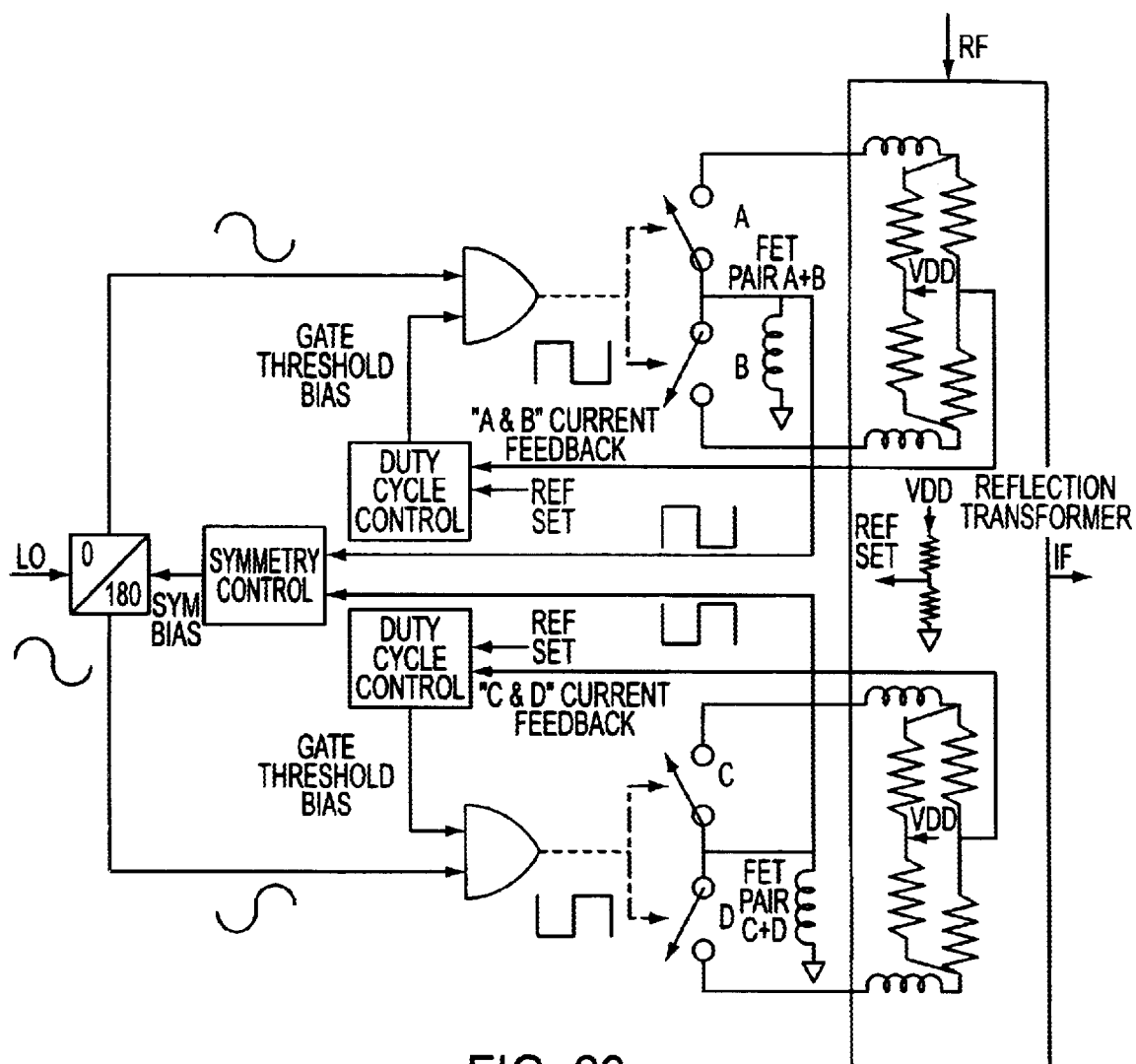
FIG. 29 is an illustration showing an exemplary embodiment of a duty-cycle and symmetry feedback control circuit and method and its relationship to elements of the mixer circuit.

With respect to FIG. 29 there is illustrated a block diagram of an embodiment of the super-mixer switching circuitry. The embodiments of the super-mixer and radio incorporating the super-mixer described heretofore rely to at least some extent on matched (or substantially matched) pairs of FETs (or other mixing devices) and the symmetrical (or substantially symmetrical) switching action of the FET pairs. In these embodiments, matched FET pairs are driven by the complimentary LO square wave in such a way that the duty cycle is near a 50/50 (50%) duty cycle. In this instance a current waveform from a first pair of FETs (for example, from FETs A and B in FIG. 29) are or nearly are exactly 180-degrees out-of-phase from the current waveform of a second pair of FETs (for example, from FETs C and D in FIG. 29). When the FETs are matched, the waveforms are in proper phase relationship, and other prudent circuit design precautions observed, almost no time is spent crossing the FETs ON/OFF (conducting/non-conducting) region and the 'OFF' set of waveforms is coincident in time with the 'ON' set of waveforms. If these two conditions deteriorate, second and third order intermodulation products degrade the dynamic range of the mixer.

When conditions are correct, the IP2 for the exemplary circuits (for example the embodiments in any of FIG. 4, FIG. 5, or FIG. 7) approaches +100 dBm and IP3 approaches +50 dBm at RF input levels of +5 dBm. However, if the duty cycle deteriorates to, for example a 49/51 split (49%/51%) as may be observed in the duty cycle waveform, the 1% error can result in a 20 dB degradation of the second order intercept IP2 (e.g. 10 log 0.01). Perfect (or near perfect) symmetry and duty cycle depend on several factors, primarily on having matched FET pinch-off voltages, matched FET gate bias thresholds, varying or undesirable LO signal level, LO 0/180 degree phase splitter accuracy, and balun winding match. Some or all of which may likely very with operating temperature, manufacturing tolerance, and circuit component aging. Hence, in practice some effort must be undertaken to select matching components and tune the components to provide the highest levels of performance. In spite of the evidence that even uncompensated super-mixers of the type described perform better than other mixers commercially available, compensating for operating temperature variation and differential component aging remains problematic, and keeps the inventive super-mixer from achieving its theoretical performance levels. These super-mixers operate without feedback in an open-loop manner.

Figure 30:
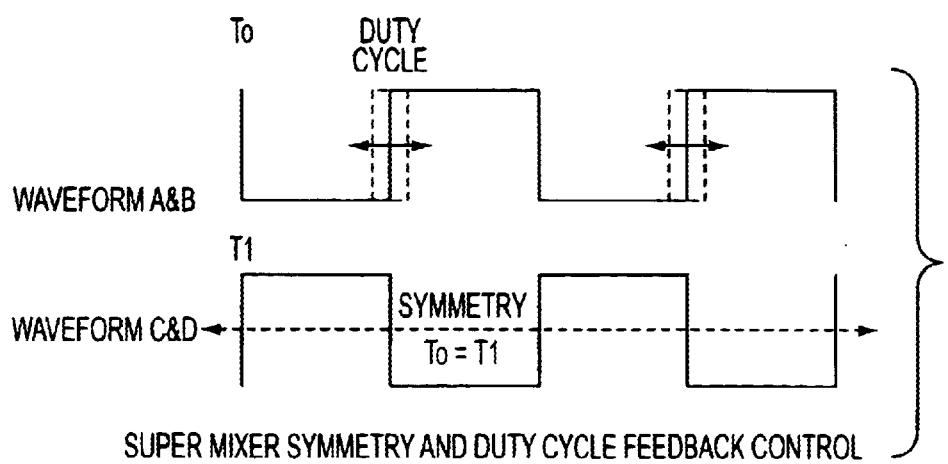
FIG. 30 is an illustration showing signal waveforms pertaining to the duty-cycle and symmetry control circuit and method of the embodiment in FIG. 29.

With these observations at hand, the afore described embodiments of the super-mixer 32 are improved by adding feedback circuitry to compensate for duty cycle variation and asymmetry. The manner in which the duty cycle and symmetry may vary and are controlled is indicated in FIG. 30. This feedback is provided by the feedback components, including duty cycle control circuits, and a symmetry control circuit illustrated in the embodiment of FIG. 29 and enclosed by the broken line. This circuitry overcomes the open-ended errors, independent of their origin, by providing feedback of duty cycle and symmetry current waveforms after FET switching. This feedback accumulates the result of all the above described errors, that is, errors introduced by unmatched FET pinch-off voltages, unmatched FET gate bias thresholds, LO signal level, LO 0°/180° (0 and 180 degree) phase splitter inaccuracy, and/or balun winding mismatch, as well as other circuit variables that would be reflected in the feedback loop.

A single duty cycle control circuit that provides the described operation for both FET pairs may be used, however, it is simpler to describe two duty cycle control circuits or blocks each receiving an appropriate FET current feedback signal and generating a compensating gate threshold bias signal at its output. Hence dual duty cycle control circuits are shown in the embodiment of FIG. 29.

By continuously compensating and correcting for any deviation in duty cycle and/or switching points (symmetry), very high IP2 and IP3 intercepts are obtained and the super mixer and any radio or other circuit incorporating the inventive super-mixer with feedback achieves a very high dynamic range. An added benefit of the incorporation of the feedback circuitry into the super-mixer is the ability to relax FET matching and adjustment requirements as well as other mixer adjustment requirements and still achieve maximum performance over temperature, manufacturing, and other variations.

Attention is now directed to enhanced mixer topology and mixer circuits, analogous to those already described relative to the embodiments of the invention in FIGS. 1, 4, 3, 4, 5, and 7. These enhanced mixer circuits and topologies may also be used in conjunction with the optional temperature compensation in the FIG. 8 embodiment, though some or all of the benefits of the temperature compensation are also provided by the feedback control aspects of the invention.

Figure 31:
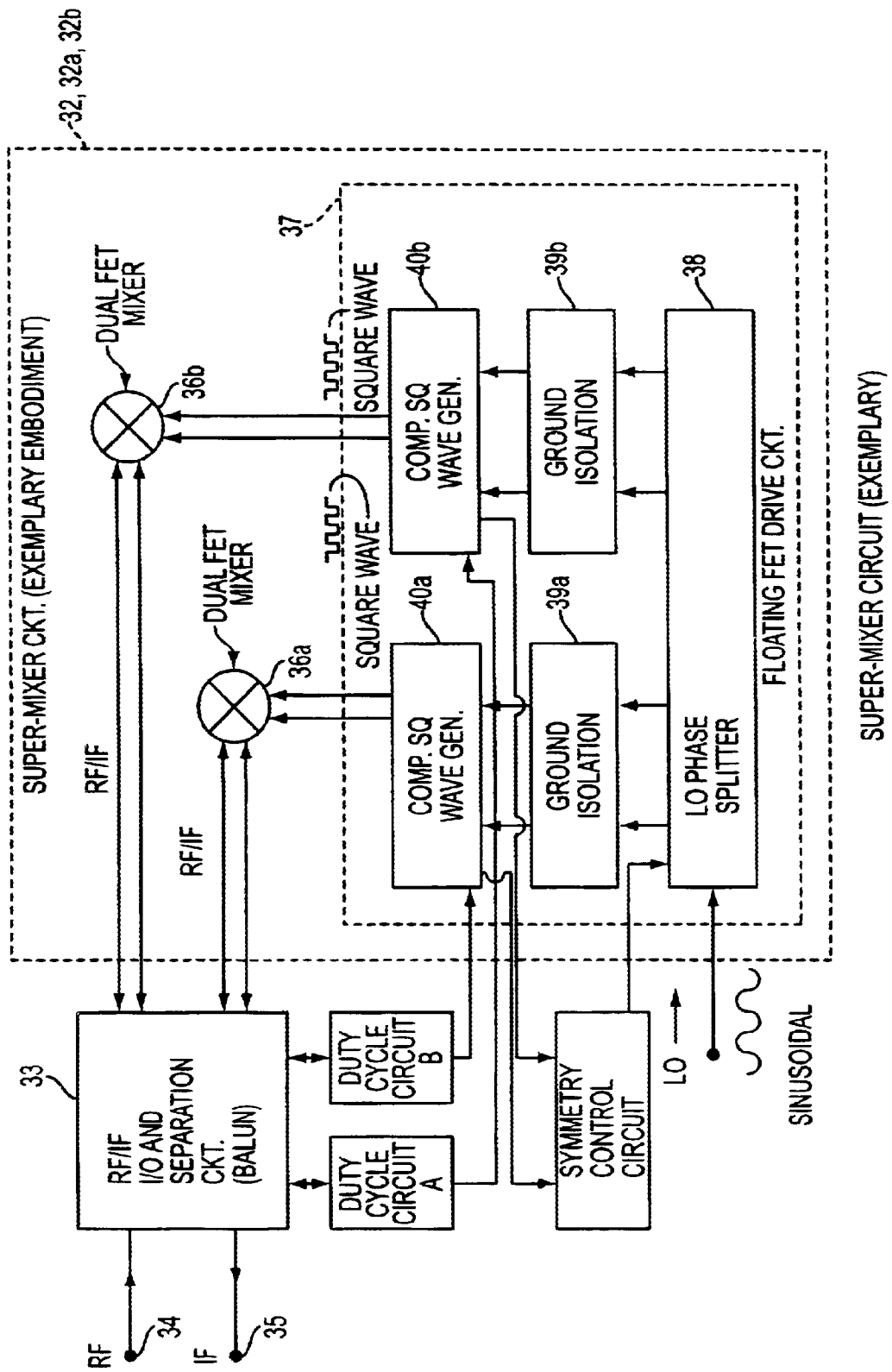
FIG. 31 is and illustration showing simplified embodiments of the invention including an inventive mixer device topology that may be used in the homodyne and heterodyne topologies and includes the inventive duty-cycle and symmetry feedback and control circuits.

The embodiment of FIG. 31 illustrates the manner in which the afore described embodiment of FIG. 1C may be modified to provide duty cycle and symmetry feedback and control. In this particular embodiment, mixer switching device current waveform signals are obtained from each FET after switching from the RF/IF I/O separation circuit 33. In a preferred embodiment, the mixer switching devices are FET pairs and currents are sensed for each FET during is operation, and the RF/IF separation circuit is implemented as a balun, such as for example, using a reflection transformer. The sensed currents from the first switching device (such as for example from the switching device including FETs A and B) are processed by a first duty cycle control circuit, and the sensed currents from the second switching device (such as for example from the switching device including FETs C and D) are processed by a second duty cycle control circuit.

A first duty cycle control circuit compares the integrated individual FET feedback current waveforms (from FETs A & B or FET pair A&B) with a fixed set or reference voltage. A second duty cycle control circuit compares the integrated individual FET feedback current waveforms (from FETs C & D or FET pair C&D) with the same fixed set or reference voltage. A symmetry control circuit compares the integrated individual FET pulse waveform (from FETs C and D or FET pair C&D) with the pulse waveforms (from FETs A and B). Signals in the form of pulse A and B set logic data input of the phase detector and pulse C and D clock the D input to the Q and $\overline{Q}$ output. If D input lags the C input, Q goes low. If D leads C, then Q goes high. The RC integrator forms a DC voltage proportional to the phase difference of A&B to C&D. This voltage changes the capacitance of the variable reactor (Varactor) which in turn modifies the time the sine wave gets squared up as compared to the one that is 180 degrees out of phase. Both 180 degree sine waves will be differentially delayed until symmetry is reached. (These structures and relationships are illustrated in somewhat greater detail by the circuit embodiments of FIG. 33.)

Figure 32:
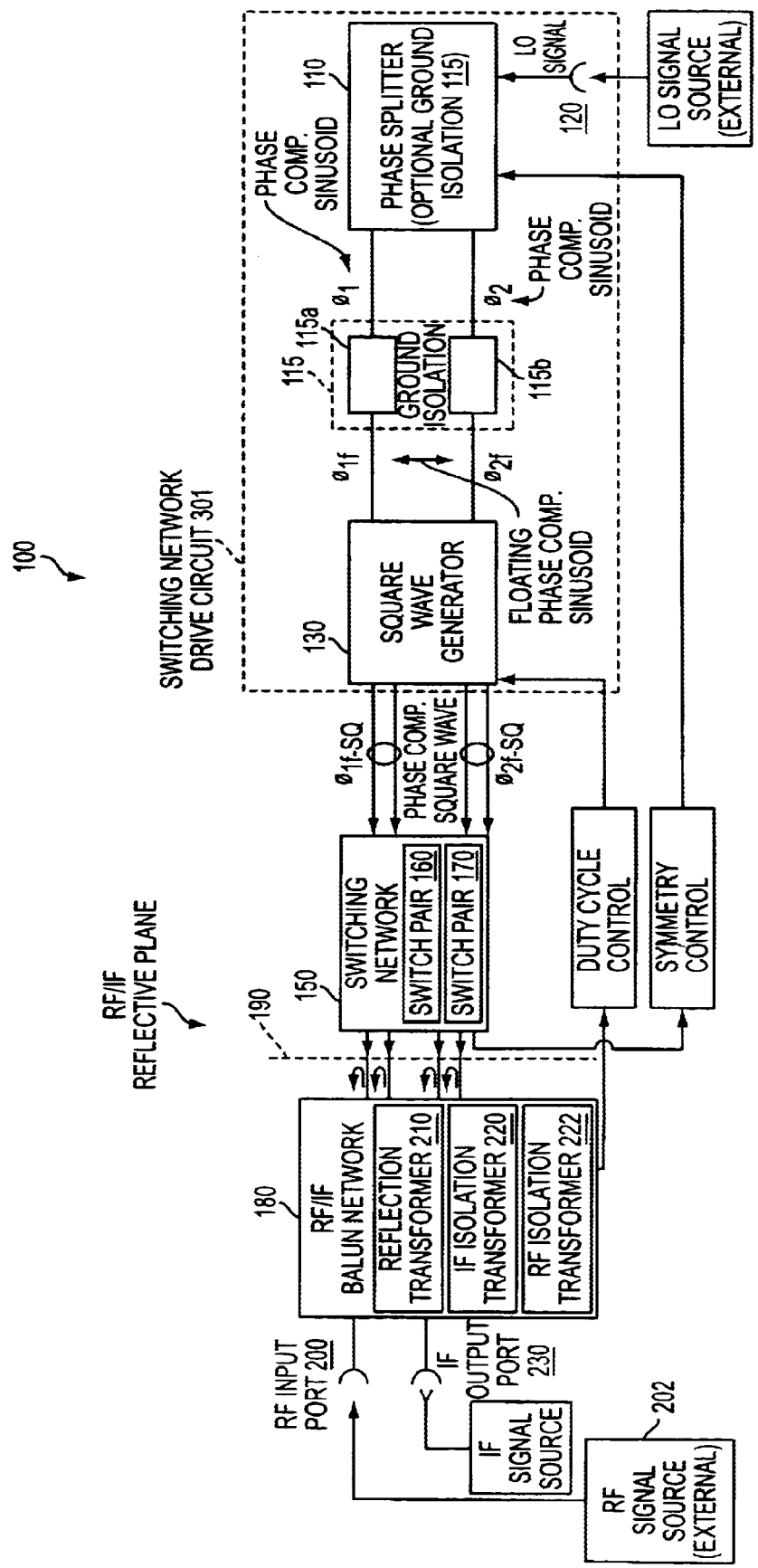
FIG. 32 is an illustration showing an embodiment in functional block form, of one embodiment of the inventive triple-balanced reflection FET mixer analogous to the embodiment in FIG. 2 and additionally including the inventive duty-cycle and symmetry feedback and control circuits.

FIG. 32 is a diagrammatic illustration showing the manner in which signals downstream from the switching network 150, such as signals within the RF/IF separation circuit 180, are extracted and used in the feedback control loop. The same or different signals may be extracted for the duty cycle control and for the symmetry control. In preferred embodiments of the invention different, but related signals (signals from different ones of the FETs) are used. This or these signal are then used by the duty cycle control circuit which generates a contrl signals to the square wave generator circuit 130 and by the symmetry control circuit which generates a control signal to the phase splitter 110. Although these control circuits may readily be implemented in hardware, software or programmatic elements or components may be incorporated if desired. In one embodiment, shown in FIG. 33, the FET drain voltage representing currents from FETs A and B are input to an operational amplifier (such as a MC3402 operational amplifier) configured as a voltage comparator. The output of the operational amplifier is a voltage related to the difference in voltage of A and B. When the duty cycles are not equal the output voltage will be either more or less positive depending upon the connections to the inverting and non-inverting op-amp terminals and the relative ON time of both FETs. For example, if the FET A&B switching current is input to the non-inverting op amp terminal and is ON for a longer period of time (for example ON for 51% of the time), then the op-amp integrated output voltage is less positive. This duty cycle control circuit op-amp output terminal is connected to the input of the two-input gate through a resistor so that the output voltage operates to bias the gate threshold. When the bias is less positive, the gate switch stays on and when the bias is less positive the gate switch stays off. The op-amp circuit, resistor, and other components are adjusted so that the voltage bias applied to the gate yield the appropriate duty cycle correction. The duty cycle for FETs C and D are adjusted in analogous manner. The mixer will continuously seek a condition under which the duty cycle of FET A&B matches a 50% duty cycle, and the duty cycle of FET C&D matches a 50% duty cycle. The improved circuit also has symmetry control which in the preferred embodiment is separate from the duty cycle control.

The symmetry control circuit measures the switching points of the first FET pair versus the switching points of the second FET pair in time and adjusts the phase splitter continuously to achieve coincidence of the switching points.

Recall that the circuitry in the dotted lines in FIG. 29 overcomes the open-ended errors by providing feedback of duty cycle and symmetry current waveforms after FET switching. This feedback accumulates the result of all the above errors. Duty cycle control compares the integrated individual FET feedback current waveform to a set reference and will be near ½ VDD volts if switching 50%. The symmetry control measures the switching points of FETs A&B versus FETs C&D in time and adjusts the phase splitter to achieve coincidence. A measure of the feedback circuitry success is that the FET matching and adjustment can be relaxed requirements and still achieve maximum performance over temperature and manufacturing variations.

A more detailed illustration showing embodiments of the inventive mixer with duty-cycle and symmetry control circuits (FIG. 33A), phase detector circuit (FIG. 33B), and reference voltage generating circuit (FIG. 33C) is shown in FIG. 33. Note that the various signals and waveforms described herein are identified with corresponding letter symbols in the drawings. The duty cycle is controlled by comparing the voltage, which represents the current through FETs A&B and C&D to the set reference. This voltage will be near ½ VDD if 50% duty cycle is achieved. If the A&B FETs are on more than off, the A&B voltage will decrease due to more current being drawn. A decrease in A&B voltage compared to the set voltage will cause the op-amp output to be more positive and the gate to be OFF more than ON and the FETS to decrease their ON time. The same would be true for the C&D FET pair.

The symmetry is controlled by monitoring the switched square waves G and H across the resistor that ties the A&B FET's sources (S) to the C&D FETs sources (S) together. Square wave G is ideally 180 degrees out of phase from square wave H. Each waveform is amplified by the NAND gates and applied to the "D" type flip-flop that here acts like a phase detector. If the positive portion of the G waveform is at the D (data) input to the flip-flop when the positive going edge of waveform H arrives at the C (clock) input to the flip-flop, a logic high will be at the flip-flop Q output. If waveform D is low when the flip-flop is clocked then the Q output will be low. The RC network integrates the pulses and represents a direct-current voltage that varies as a function of the timing between the edges of waveforms G and H.

The Varactors (voltage variable capacitor diode) will increase their capacitance if their cathodes approach their anode voltage potential (diode varying degrees of reverse bias). They conversely decrease capacitance if the cathode goes more positive with respect to the anode. This change in capacitance in conjunction with the series 47 Ohm resistor will cause a varying delay in the sign wave from the phase splitter. Note that the Varactors are reversed in the H and G side. An increase in phase detector voltage will cause the G side more delay (Varactor voltage potential decreasing) and the H side less delay (Varactor voltage potential increasing).

If the positive portion of the G square wave signal is at the phase detector when the H waveform signal goes positive, then the output voltage goes more positive. This causes an increase in capacitance in the G waveform signal Varactor and decrease in capacitance in the H waveform Varactor. The G side sine wave will be delayed more than the H side and cause the H side to clock the flip-flop when the G side is low at the D input. The output will be low at that point, lowering the voltage to the Varactors, and therefore synchronizing the G and H square waves to be exactly 180 degrees out of phase.

Having described the top level topology relative to FIGS. 29 and 31–32, as well as an exemplary detailed structure relative to FIG. 33, it will be readily apparent to those workers having ordinary skill in the art in light of the description provided here, that the feedback enhancement may be extended to the other mixer circuits, such as the embodiments of FIGS. 4, 5, and 7, as well as to the HF collection system (See FIG. 24), heterodyne radio (See FIGS. 25–26), homodyne receiver (See FIG. 27), automatic link establishment system (See FIG. 28), as well as many other systems and applications in which signal mixing is desired for whatever purpose.

Figure 34A:
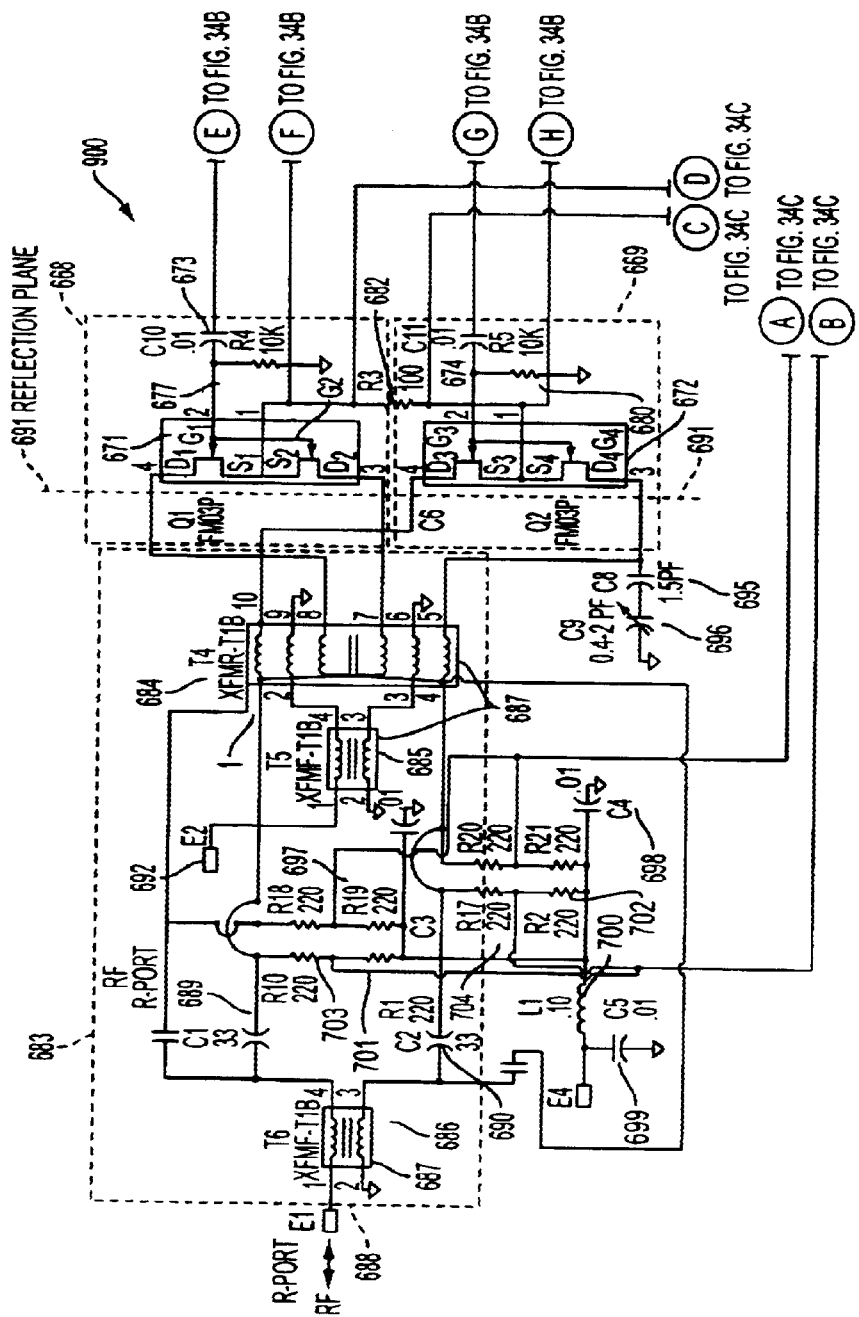
FIG. 34 is an illustration of an embodiment of the inventive triple-balanced reflection FET mixer analogous to the embodiment in FIG. 4 but also including the duty-cycle and symmetry feedback control circuits.
Figure 34B:
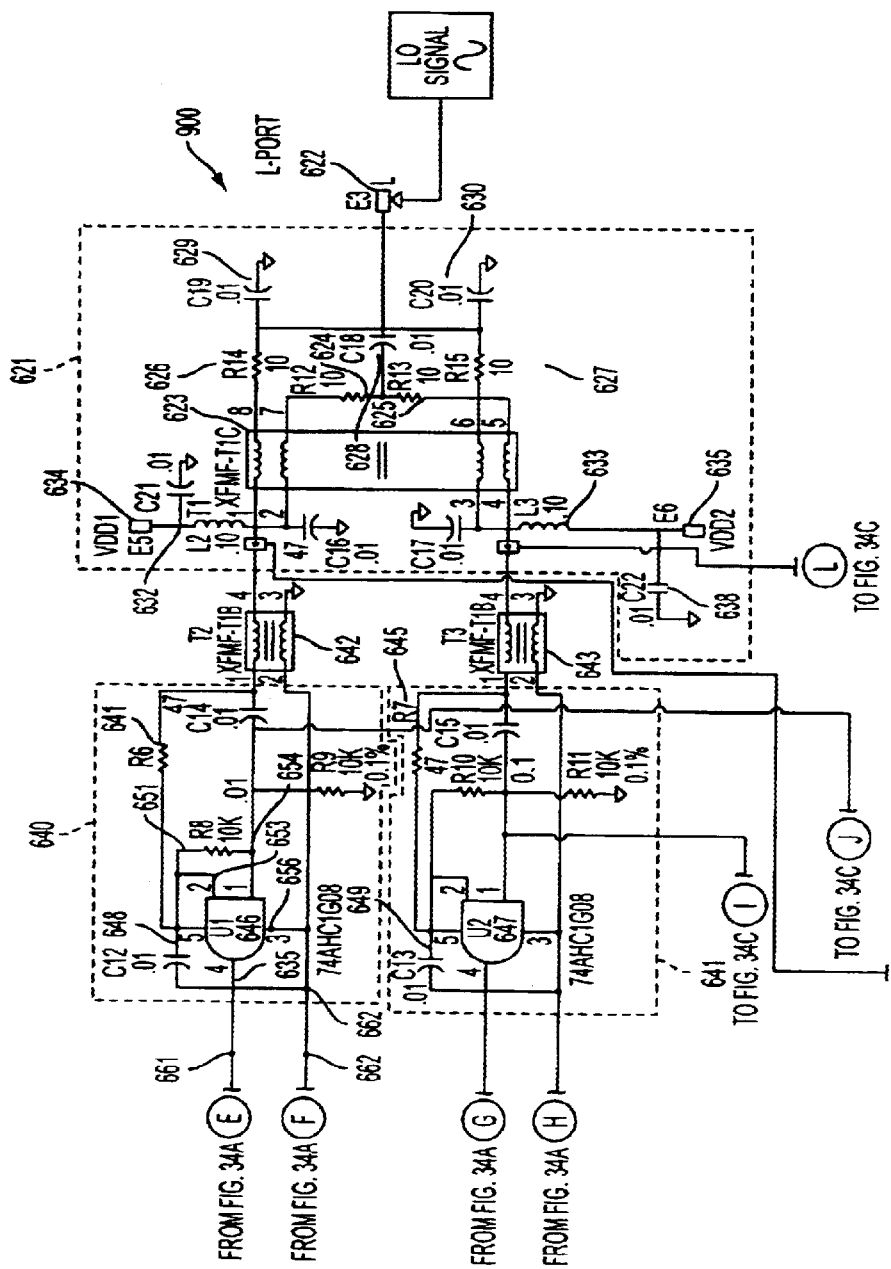
Figure 34C:
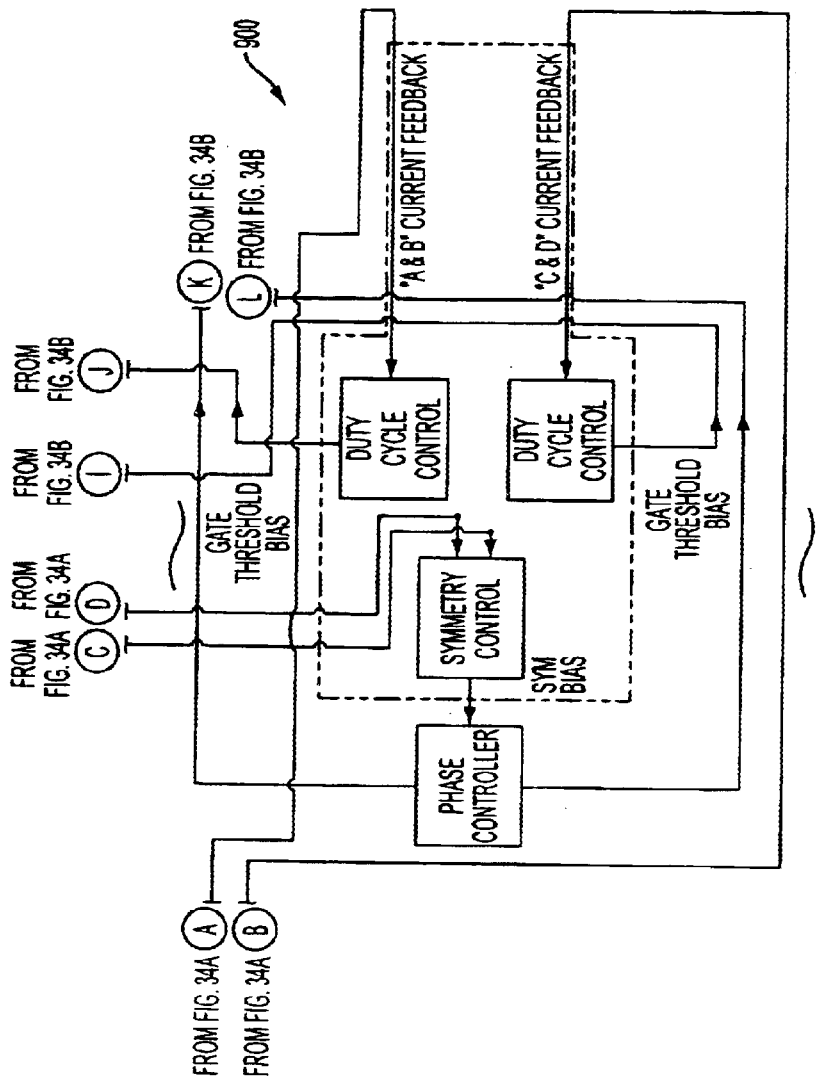
Figure 35A:
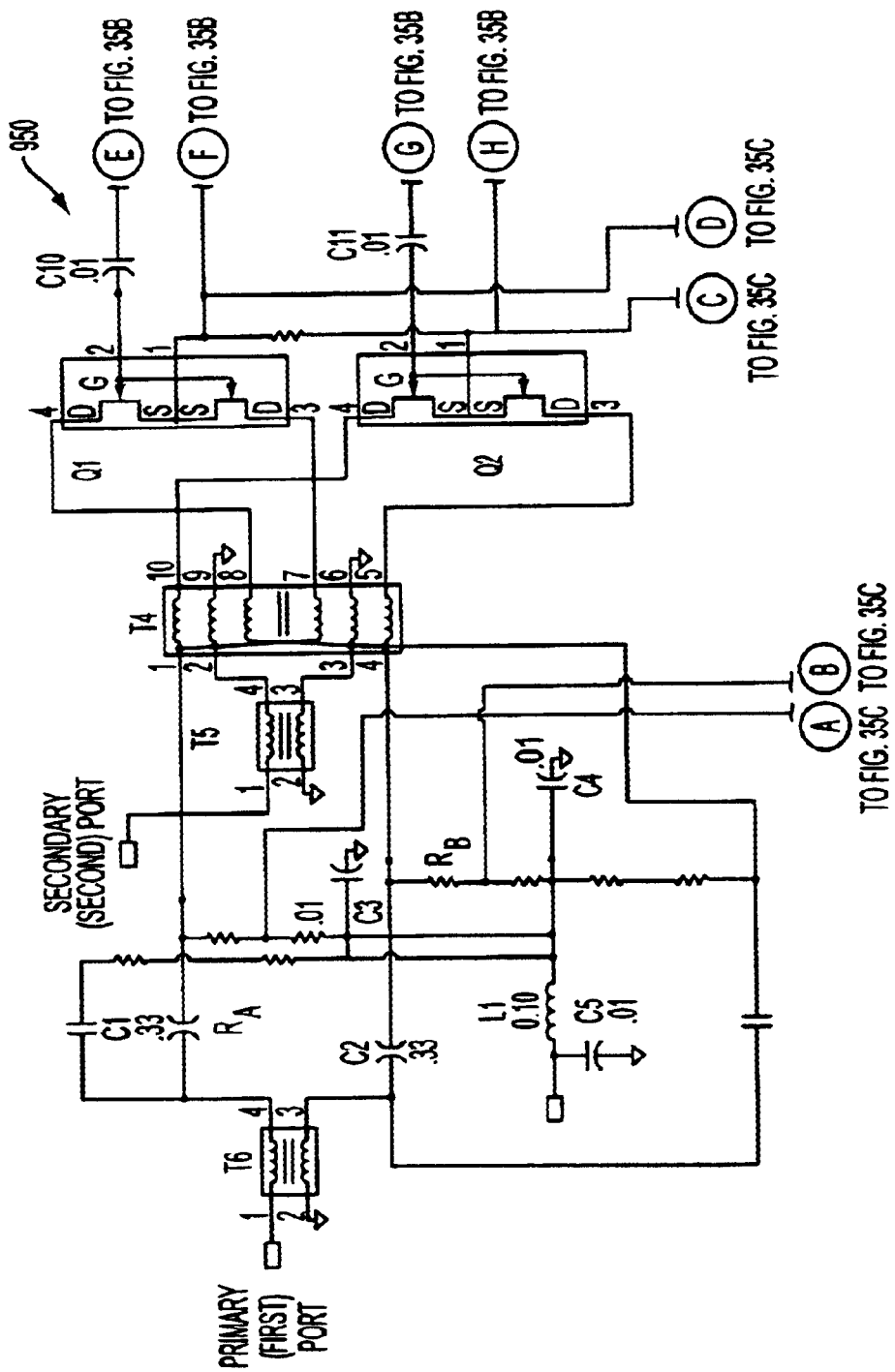
FIG. 35 is an illustration of an embodiment of the inventive triple-balanced reflection FET mixer analogous to the embodiment in FIG. 7 but also including the duty-cycle and symmetry feedback control circuits.
Figure 35B:
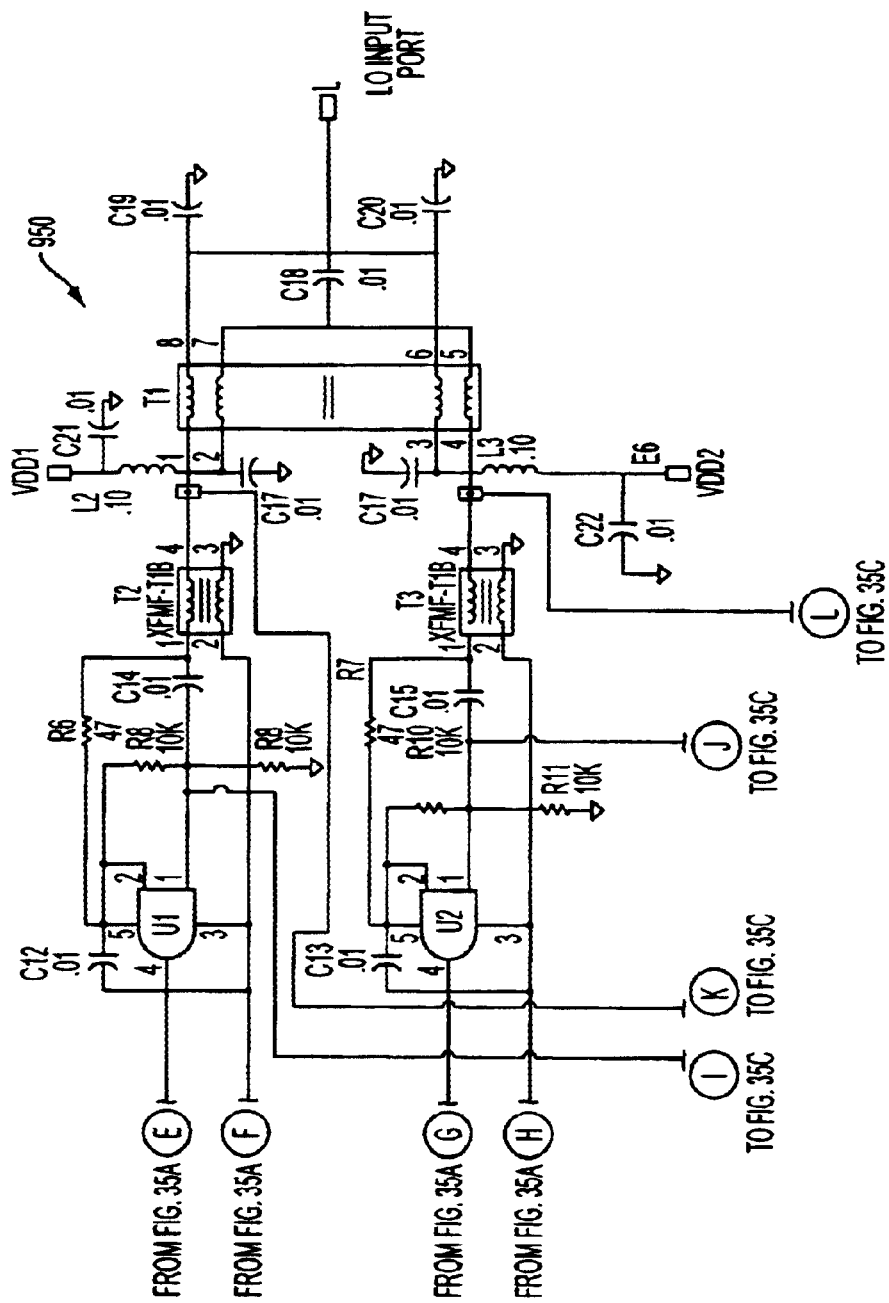
Figure 35C:
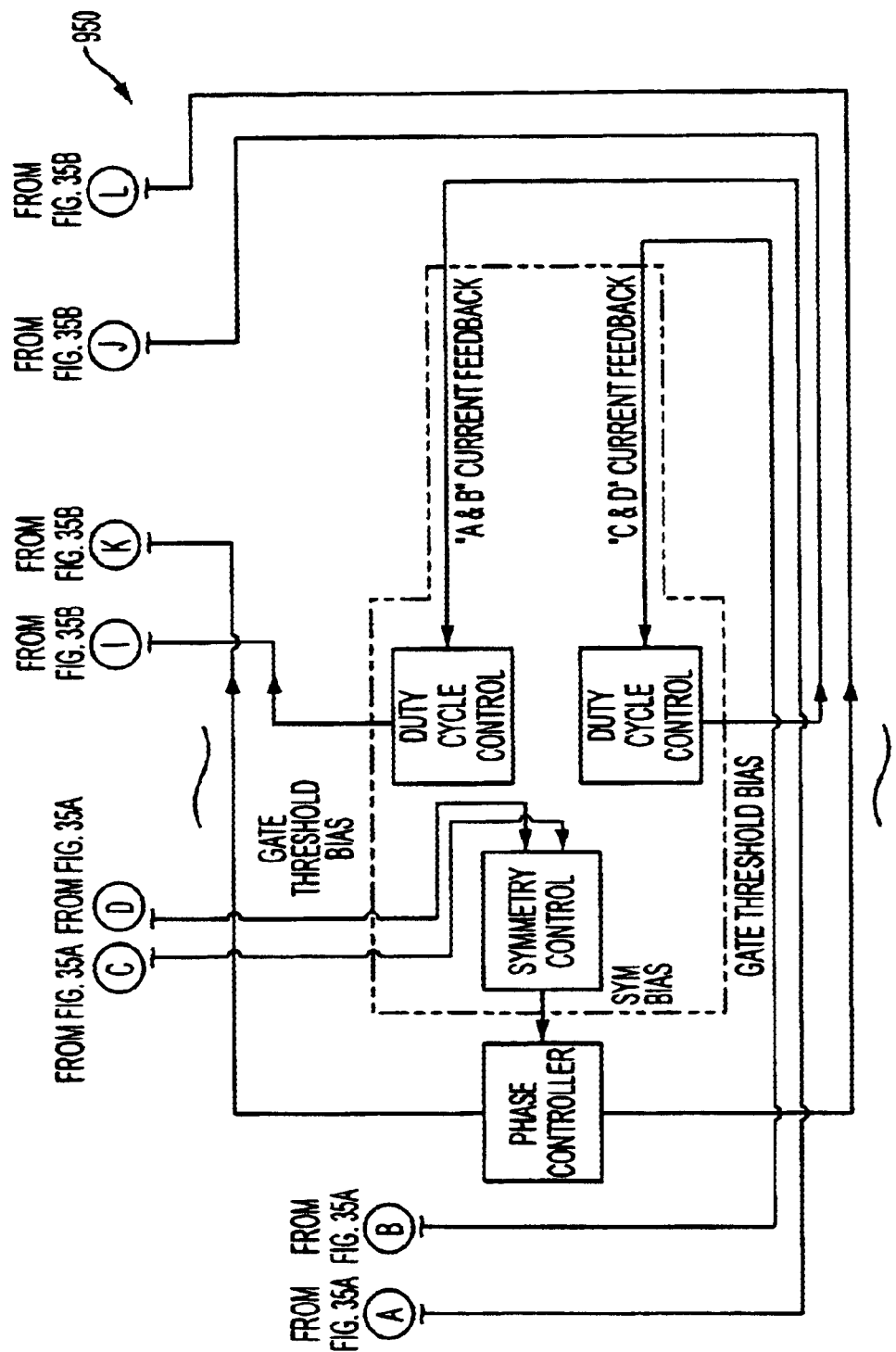

As one example of how the mixer in the embodiment of FIG. 4 would be modified to incorporate the feedback control structure and method, attention is directed to the embodiment of FIG. 34. FIG. 35 analogously illustrates the manner in which the embodiment of FIG. 7 would be modified to incorporate the feedback control including the duty cycle and symmetry control elements. It is noted that in each of these two embodiments, the duty cycle control and symmetry control are provided as already described relative to the FIG. 29 to FIG. 33 embodiments. In the embodiments illustrated in FIG. 34 and FIG. 35, the phase control portion of the symmetry correction circuitry has been shown as a circuit or functional block separate from other portions of the phase splitter circuitry so that the relationship with the embodiments of FIGS. 4 and 7 not having the enhancement will be clear. The phase control circuit may alternatively be integrated with the It is further noted, that whereas in the FIG. 4 and FIG. 7 the transformer T4 windings associated with pin 1 and pin 4 were tied together, the embodiments in the FIG. 34 and FIG. 35 embodiments unties them and both brings them out separately and biases the FET pairs separately as described. This change permits monitoring of the current drawn by each set separately and independently and therefore facilitates better feedback control. This separation is also present in the structure of the FIG. 33 embodiment.

A signal mixing method incorporating either or both of the duty cycle feedback and control and symmetry feedback and control are also provided by the invention. These methods may be utilized in any or all of the applications for the mixer described elsewhere in this description.

Other Embodiments

In each of the exemplary super-mixer and system topology embodiments, certain elements that enhance or optimize performance as provided, but which components are not required to practice the invention and could be eliminated entirely. While some sacrifice in performance might be expected, the circuits would still operate and so long as other modifications within the ordinary skill in the art were made to compensate for the removal or elimination, such circuit would still perform better than the conventional structures and methods.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

All publications and patent applications mentioned in this specification are herein incorporated by reference to the same extent as if each individual publication or patent application was specifically and individually indicated to be incorporated by reference.

What is claimed is:

1. A radio comprising:
   (a) a local oscillator input port for receiving a periodic sinusoidal local oscillator signal at a local oscillator frequency from an external local oscillator source;
   (b) a drive circuit for generating a substantially square-wave two-voltage level switching signal for driving said mixing device; said drive circuit further including:
      (i) a phase splitter circuit coupled to said local oscillator input port for receiving said periodic sinusoidal local oscillator signal and for generating first and second phase separated signals at said local oscillator frequency and having substantially 180 degree phase difference between each other;
      (ii) a voltage potential isolation circuit for generating first and second differential signal pairs at said local oscillator frequency respectively from said first and second phase split signals; and
      (iii) a square wave signal generation circuit for generating first and second floating square wave signals respectively from said first and second differential signal pairs, each said square wave signal having a high slew rate leading and trailing signal edge with rise and fall times of less than about 300 picoseconds;
   (c) a mixing device including first and second FET switching devices for multiplying a first-frequency input signal with said first and second floating square wave signals to generate a third frequency analog mixer output signal, said first and second FET switching devices coupled to said drive circuit to receive said first and second floating square wave signals at a gate of said FETs such that one of said first and second FET switches ON precisely when the other of said first and second FET switches OFF;
   (d) an input/output signal separation circuit for separating said a third frequency analog mixer output signal from said first-frequency input signal and for directing said output signal to an output port;
   (e) an analog-to-digital converter coupled to said output port to receive said output signal and generating a digital representation of said third frequency analog mixer output signal; and (f) a feedback control circuit receiving FET switching device signals and operative to control duty cycles of said first and second FET switching devices.

2. The radio in claim 1, wherein said mixing device is provided in the receiver portion of said radio and operates as a down-frequency converter.

3. The radio in claim 1, wherein said mixing device is provided in the transmitter portion of said radio and operates as an up-frequency converter.

4. A radio tuner comprising:

(a) a low-band signal processing circuit receiving and processing first components of an RF input signal over a first frequency range directly without frequency-conversion to generate a low-band output signal;

(b) a high-band signal processing circuit receiving and processing second components of said RF input signal over a second frequency range including frequency-converting said second components to generate a high-band output signal, said high-band signal processing circuit including:

(i) a first mixer circuit operating as a up-frequency converter receiving said second frequency range components and a first local oscillator signal and generating a first intermediate frequency signal;

(ii) a circuit amplifying and band-pass filtering said first intermediate frequency signal to generate a second intermediate frequency signal;

(iii) a second mixer circuit operating as a down-frequency converter receiving said second intermediate frequency signal and a second local oscillator signal and generating said high-band output signal; and (iv) each said mixer circuit including a feedback control circuit for adjusting a duty cycle of a mixer switching device to be a 50% duty cycle;

(c) a signal combining circuit receiving said low-band output signal and said high-band output signal and generating a composite output signal; and (d) an output processing circuit receiving said composite output signal and amplifying, impedance transforming, and filtering said composite output signal to generate a final analog output signal.

5. The radio tuner in claim 4, further comprising an analog-to-digital converter circuit coupled to receive said final analog output signal from said output processing circuit and generating a digital output signal representing said final analog output signal.

6. The radio tuner in claim 4, wherein said analog-to-digital converter circuit comprises an analog-to-digital converter having at least 14 bits resolution to provide from about 6 dB to about 9 dB of dynamic range per analog-to-digital converter bit.

7. The radio tuner in claim 4, further comprising an RF signal input processing circuit receiving said RF signal from an external source and generating and coupling said first RF signal components and said second RF signal components respectively to said low-band and said high-band signal processing circuits.

8. The radio tuner in claim 4, wherein said tuner is operative over a frequency range of at least about 0.1 MHz to about 32 MHz.

9. The radio tuner in claim 4, wherein said first frequency range substantially covers frequencies up to about 4 MHz, and said second frequency range substantially covers frequencies greater than about 4 MHz.

10. The radio tuner in claim 4, wherein said first frequency range substantially covers frequencies from about 1 MHz and about 4 MHz, and said second frequency range substantially covers frequencies from about 4 MHz to about 32 MHz.

11. The radio tuner in claim 4, wherein said tuner provides greater than 95-dB instantaneous spur free dynamic range over a 4 MHz bandwidth.

12. The radio tuner in claim 4, wherein said tuner provides greater than 95-dB instantaneous spur free dynamic range over an 8 MHz bandwidth.

13. The radio tuner in claim 4, wherein said tuner achieves an out-of-band IP3 of at least about +40 dBm and an out-of-band IP2 of at least about +80 dBm, and an overall dynamic range of at least about 95 dB.

14. The radio tuner in claim 4, wherein said first intermediate frequency signal is at about a 70 MHz center frequency.

15. The radio tuner in claim 4, wherein said output processing circuit amplifier exhibits a low spurious output so that any spurious outputs introduced by said amplifier do not significantly limit the spur free dynamic range (SFDR) of said tuner.

16. The radio tuner in claim 4, wherein said first mixer circuit comprises:

a first local oscillator input port for receiving said first local oscillator signal, and said first local oscillator signal comprising a first sinusoidal local oscillator signal at a first local oscillator frequency;

a first phase splitter circuit coupled to said first local oscillator input port for receiving said first local oscillator signal and for generating first and second phase separated signals at said first local oscillator frequency and having substantially 180-degree phase difference between each other;

a first voltage potential isolation circuit for generating first and second differential signal pairs at said first local oscillator frequency respectively from said first and second phase split signals;

a first square wave signal generation circuit generating first and second floating square waves respectively from said first and second differential signal pairs, each said square wave signal having a high slew rate leading and trailing signal edges with rise and fall times less than about 300 picoseconds;

a first frequency mixing device receiving said first and second square wave signals and said second frequency range components and generating said first intermediate frequency signal; and a first input/output signal separation circuit for separating said first intermediate frequency output signal from said second frequency range components input signal and for directing said first intermediate frequency output signal to a first output port.

17. The radio tuner in claim 16, wherein said first mixer circuit comprises:

a second local oscillator input port for receiving said second local oscillator signal, and said second local oscillator signal comprising a second sinusoidal local oscillator signal at a second local oscillator frequency;

a second phase splitter circuit coupled to said second local oscillator input port for receiving said second local oscillator signal and for generating third and fourth phase separated signals at said second local oscillator frequency and having substantially 180-degree phase difference between each other;

a second voltage potential isolation circuit for generating third and fourth differential signal pairs at said second local oscillator frequency respectively from said third and fourth phase split signals;

a second square wave signal generation circuit generating third and fourth floating square waves respectively from said third and fourth differential signal pairs, each said square wave signal having a high slew rate leading and trailing signal edges with rise and fall times less than about 300 picoseconds;

a second frequency mixing device receiving said third and fourth square wave signals and said second intermediate frequency signal and generating said high-band output signal; and a second input/output signal separation circuit for separating said high-band output signal from said second intermediate frequency signal input signal and for directing said high-band output signal to a second output port.

18. The radio tuner in claim 17, wherein said first and second frequency mixing devices each comprises a pair of FETs; and each said first, second, third, and fourth square wave signals have a high slew rate leading and trailing signal edge with rise and fall times less than about 300 picoseconds such that one of said FET of each pair switches ON precisely when the other of said FET of said pair switches OFF.

* * * * *